(12) United States Patent
Tran et al.

(10) Patent No.: US 11,586,898 B2
(45) Date of Patent: Feb. 21, 2023

(54) PRECISION PROGRAMMING CIRCUIT FOR ANALOG NEURAL MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Thuan Vu, San Jose, CA (US); Stephen Trinh, San Jose, CA (US); Stanley Hong, San Jose, CA (US); Anh Ly, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 909 days.

(21) Appl. No.: 16/360,733

(22) Filed: Mar. 21, 2019

(65) Prior Publication Data
US 2020/0242460 A1 Jul. 30, 2020

Related U.S. Application Data

(60) Provisional application No. 62/798,394, filed on Jan. 29, 2019.

(51) Int. Cl.
*G06N 3/063* (2006.01)
*G06N 3/08* (2006.01)
(Continued)

(52) U.S. Cl.
CPC ....... *G06N 3/0635* (2013.01); *G06F 12/0811* (2013.01); *G06N 3/08* (2013.01);
(Continued)

(58) Field of Classification Search
CPC .... G06N 3/0635; G06N 3/08; G06F 12/0811; G11C 11/4063; G11C 11/54; G11C 16/0408; G11C 16/10
See application file for complete search history.

(56) References Cited

U.S. PATENT DOCUMENTS

| | | |
|---|---|---|
| 4,950,917 A | 8/1990 | Holler et al. |
| 5,029,130 A | 7/1991 | Yeh |

(Continued)

FOREIGN PATENT DOCUMENTS

| | | |
|---|---|---|
| CN | 102820057 A | 12/2012 |
| KR | 2003 0002732 A | 1/2003 |
| WO | 2018/201060 A1 | 11/2018 |

OTHER PUBLICATIONS

Kazerounian, et al., "A 5 Volt High Density Poly-Poly Erase Flash EEPROM Cell," Electron Devices Meeting, IEDM '88, IEEE, pp. 436-439, Dec. 11, 1988.

(Continued)

*Primary Examiner* — Tri M Hoang
(74) *Attorney, Agent, or Firm* — DLA Piper LLP US

(57) ABSTRACT

Various embodiments of high voltage generation circuits, high voltage operational amplifiers, adaptive high voltage supplies, adjustable high voltage incrementor, adjustable reference supplies, and reference circuits are disclosed. These circuits optionally can be used for programming a non-volatile memory cell in an analog neural memory to store one of many possible values.

16 Claims, 59 Drawing Sheets

(51) Int. Cl.
*G11C 16/04* (2006.01)
*G11C 16/10* (2006.01)
*G06F 12/0811* (2016.01)
*G11C 11/4063* (2006.01)
*G11C 11/54* (2006.01)

(52) U.S. Cl.
CPC ......... *G11C 11/4063* (2013.01); *G11C 11/54* (2013.01); *G11C 16/0408* (2013.01); *G11C 16/10* (2013.01)

(56) References Cited

U.S. PATENT DOCUMENTS

| | | | |
|---|---|---|---|
| 5,237,210 | A | 8/1993 | Castro |
| 6,097,634 | A | 8/2000 | Sugiyama |
| 6,747,310 | B2 | 6/2004 | Fan et al. |
| 7,483,303 | B2 * | 1/2009 | Lee ........................ G11C 16/12 365/189.09 |
| 7,663,960 | B2 * | 2/2010 | Suzuki ................... G11C 16/12 365/189.11 |
| 8,400,212 | B1 * | 3/2013 | Nguyen ................ G11C 29/021 327/536 |
| 8,797,202 | B2 * | 8/2014 | Zhu .................... G01R 19/0084 330/252 |
| 11,144,824 | B2 * | 10/2021 | Tran ...................... G06N 3/0454 |
| 2007/0075768 | A1 | 4/2007 | Blon |
| 2007/0159888 | A1 | 7/2007 | Tu |
| 2008/0043510 | A1 | 2/2008 | Tomita |
| 2008/0056035 | A1 | 3/2008 | Nazarian |
| 2008/0259013 | A1 | 10/2008 | Kobayashi |
| 2009/0083202 | A1 | 3/2009 | Tanaka |
| 2011/0043279 | A1 | 2/2011 | Adachi |
| 2011/0069539 | A1 | 3/2011 | Eleftheriou |
| 2011/0273926 | A1 | 11/2011 | Wu et al. |
| 2012/0241839 | A1 | 9/2012 | White |
| 2013/0175593 | A1 | 7/2013 | Yao |
| 2015/0369768 | A1 | 12/2015 | Sul |
| 2016/0099073 | A1 | 4/2016 | Cemea |
| 2017/0117035 | A1 * | 4/2017 | Mokhlesi ............ G11C 11/5628 |
| 2017/0337466 | A1 | 11/2017 | Bayat et al. |
| 2020/0242461 | A1 * | 7/2020 | Tran .................... G11C 16/0425 |

OTHER PUBLICATIONS

Costa, et al., "NESP: An Analog Neural Signal Processor," IEEE International Symposium on Circuits and Systems, pp. 2189-2192, Jan. 1, 1995.

Holler, et al., "An Electrically Trainable Artificial Neural Network (ETANN) With 10240 'Floating Gate' Synapses," Neural Networks, IJCNN, IEEE Tab Neural Network Committee, Jan. 1, 1989, pp. 191-196, vol. 2.

U.S. Appl. No. 15/826,345, filed Nov. 29, 2017 entitled "High Precision and Highly Efficient Tuning Mechanisms . . . Networks," Tran, et al.; Applicant: Silicon Storage Technology, Inc.

Chinese Office Action dated Dec. 6, 2021 correspond to Chinese Patent Application No. 201980090494.8. (English translations).

European Communication dated May 31, 2022 corresponding to the related European Patent Application No. 19 772 938.7.

Taiwanese Office Action dated Oct. 26, 2022 corresponding to the counterpart foreign application Taiwanese Patent Application No. 108147188.

European Communication pursuant to Artilcle 94(3) EPC dated Dec. 6, 2022 corresponding to the related European Patent Application No. 19 772 938.7.

* cited by examiner

FIGURE 43

Adaptive High Voltage Supply
4700

PRECISION PROGRAMMING CIRCUIT FOR ANALOG NEURAL MEMORY IN DEEP LEARNING ARTIFICIAL NEURAL NETWORK

PRIORITY CLAIM

This application claims priority to U.S. Provisional Patent Application No. 62/798,394, filed on Jan. 29, 2019, and titled, "Precision Programming Circuit For Analog Neural Memory In Deep Learning Artificial Neural Network," which is incorporated by reference herein.

FIELD OF THE INVENTION

Numerous precision programming circuits are disclosed for programming a non-volatile memory cell in an analog neural memory to store one of many possible values.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses required.

Applicant previously disclosed an artificial (analog) neural network that utilizes one or more non-volatile memory arrays as the synapses in U.S. patent application Ser. No. 15/594,439, published as US Patent Publication No. 2017/0337466, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge in VMM systems is the ability to accurately program memory cells of a VMM, as the floating gate of a selected cell will need to be programmed to hold a very specific and precise amount of charge, such that each floating gate can hold one of different N values.

What is needed is an improved system for precisely programming a memory cell within a VMM.

SUMMARY OF THE INVENTION

Numerous precision programming circuits are disclosed for programming a non-volatile memory cell in a VMM in an analog neural memory to store one of many possible values.

BRIEF DESCRIPTION OF THE DRAWINGS

FIG. 43 depicts another high voltage generation block.

DETAILED DESCRIPTION OF THE INVENTION

The artificial neural networks of the present invention utilize a combination of CMOS technology and non-volatile memory arrays.

Non-Volatile Memory Cells

Figure 1:
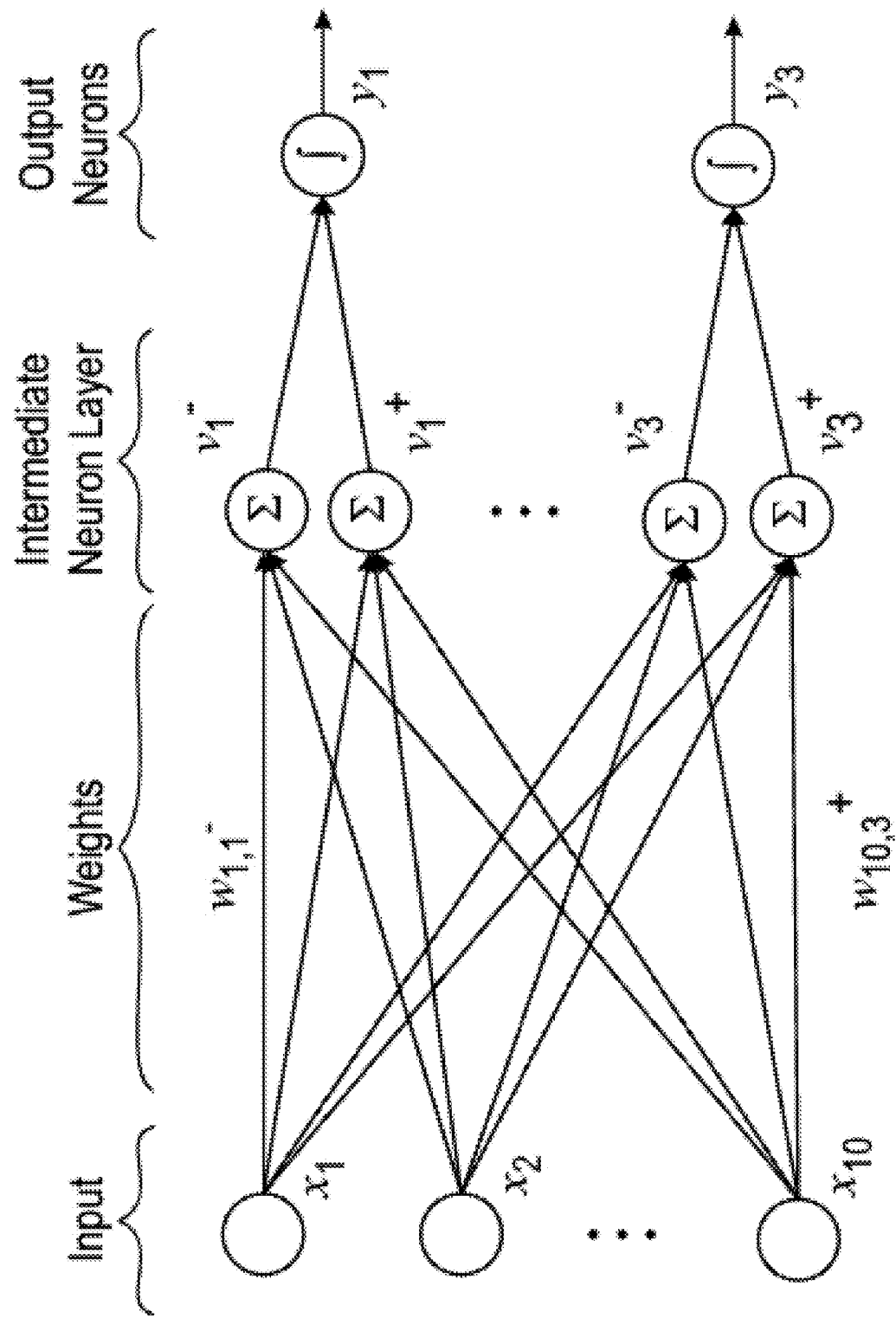
FIG. 1 is a diagram that illustrates a prior art artificial neural network.
Figure 2:
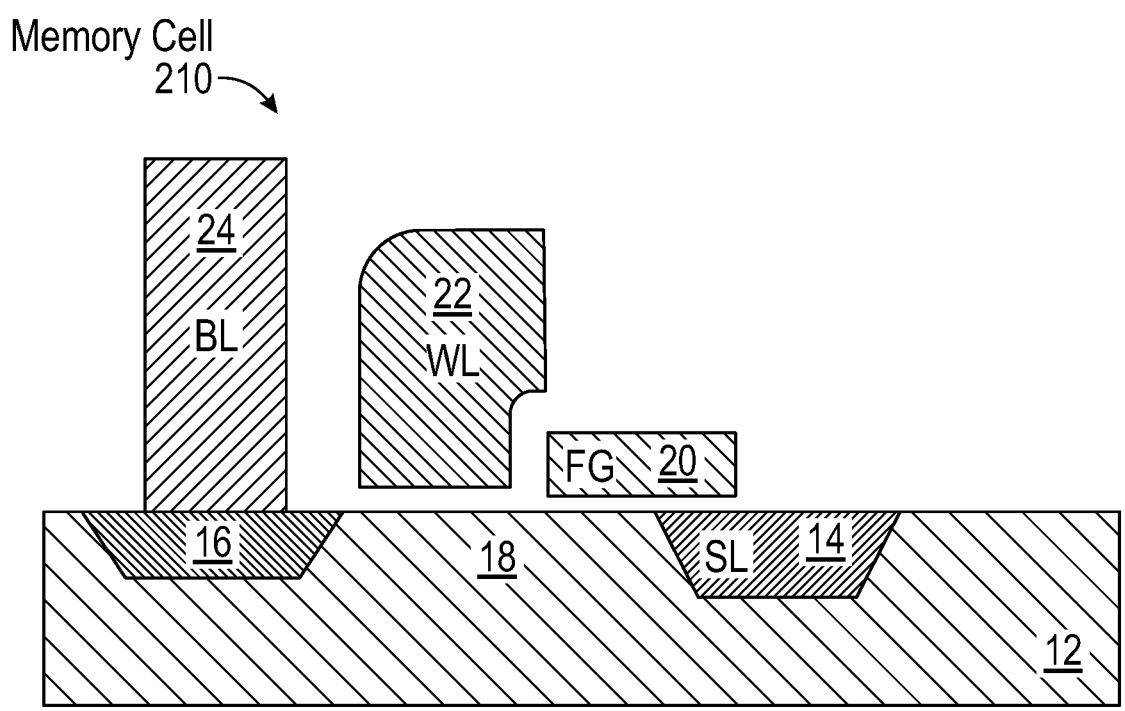
FIG. 2 depicts a prior art split gate flash memory cell

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

| | WL | BL | SL |
|---|---|---|---|
| Read | 2-3 V | 0.6-2 V | 0 V |
| Erase | ~11-13 V | 0 V | 0 V |
| Program | 1-2 V | 1-3 μA | 9-10 V |

Figure 3:
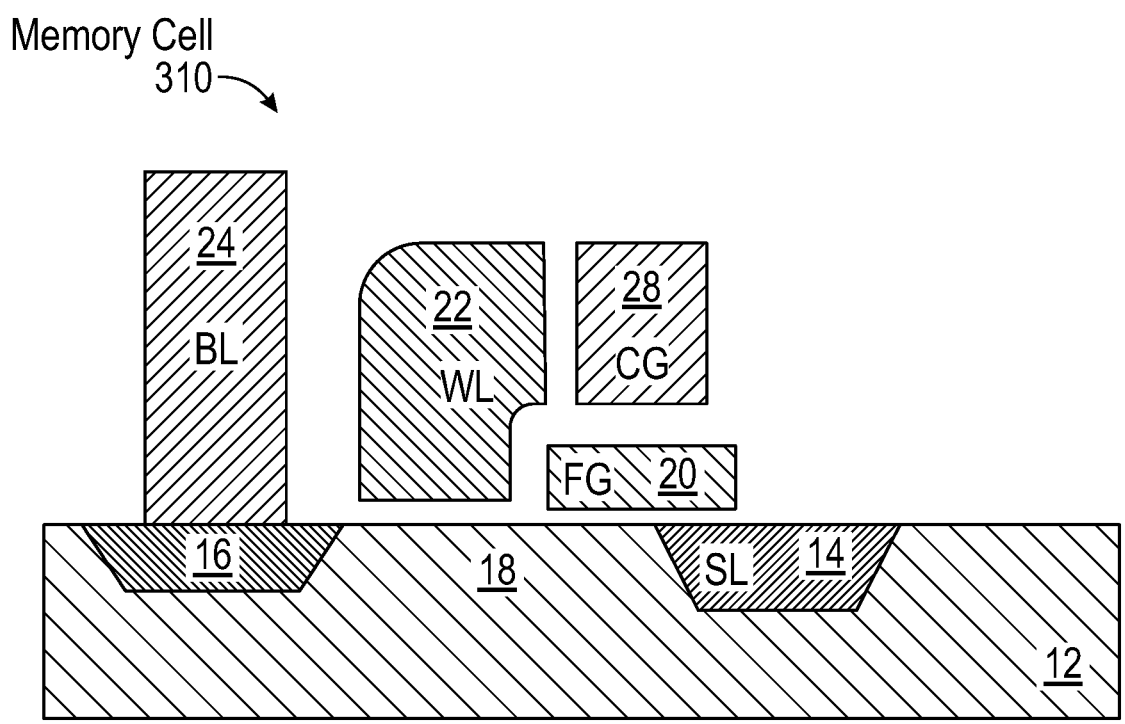
FIG. 3 depicts another prior art split gate flash memory cell

FIG. 3 shows memory cell 310, which is similar to memory cell 210 of FIG. 2 with the addition of control gate (CG) 28. Control gate 28 is biased at a high voltage, e.g., 10V, in programming, low or negative in erase, e.g., 0v/−8V, low or mid range in read, e.g., 0v/2.5V. Other terminals are biased similarly to that of FIG. 2.

Figure 4:
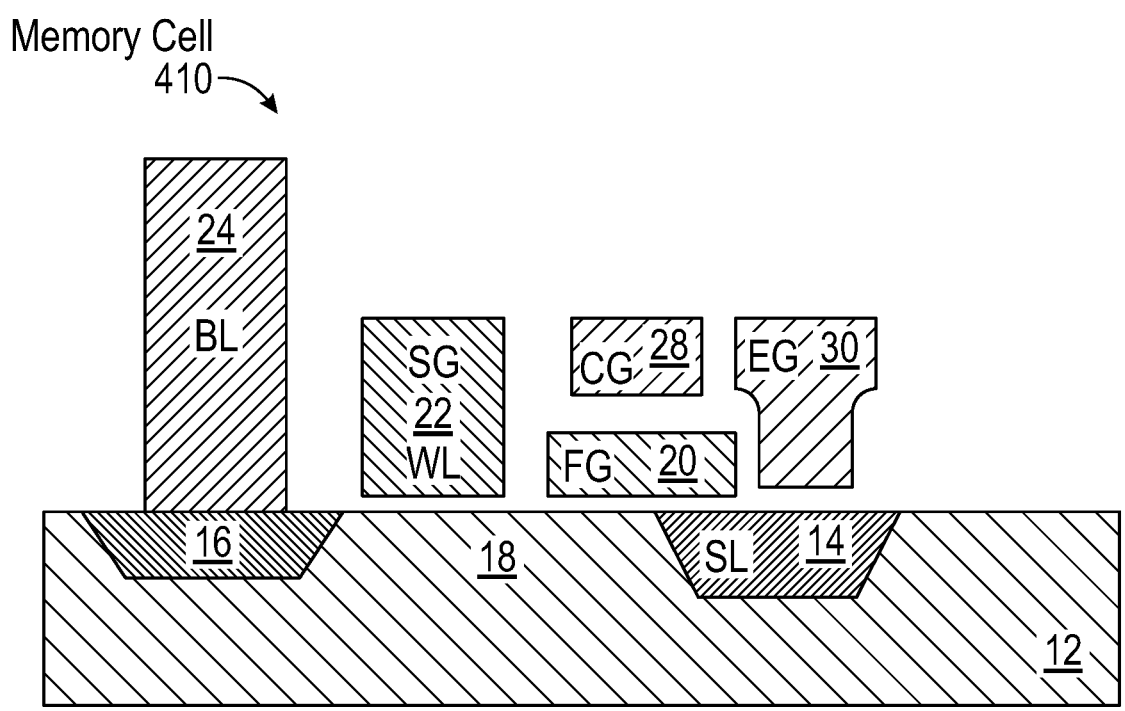
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 410 of FIG. 4

| | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 5:
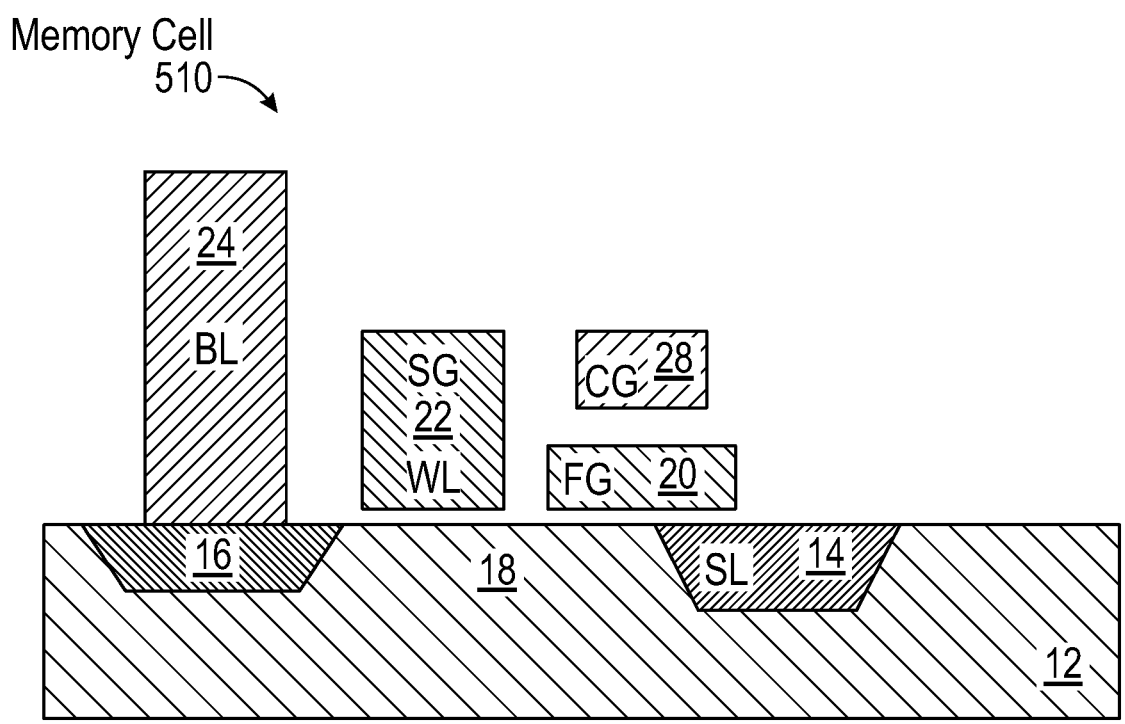
FIG. 5 depicts another prior art split gate flash memory cell

FIG. 5 shows memory cell 510, which is similar to memory cell 410 of FIG. 4 except that memory cell 510 does not contain an erase gate EG. An erase is performed by biasing the substrate 12 to a high voltage and biasing the control gate CG 28 to a low or negative voltage. Alternatively, an erase is performed by biasing word line 22 to a positive voltage and biasing control gate 28 to a negative voltage. Programming and reading is similar to that of FIG. 4.

Figure 6:
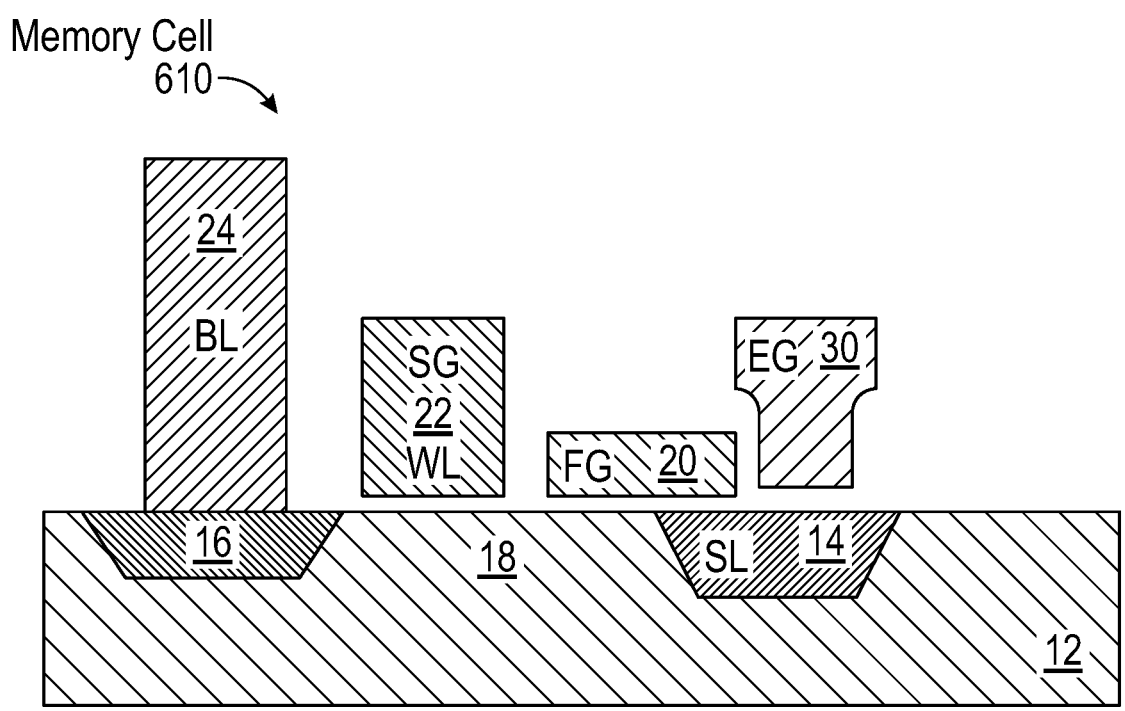
FIG. 6 depicts another prior art split gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate. The erase operation (whereby erasing occurs through use of the erase gate) and read operation are similar to that of the FIG. 4 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

| | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 7:
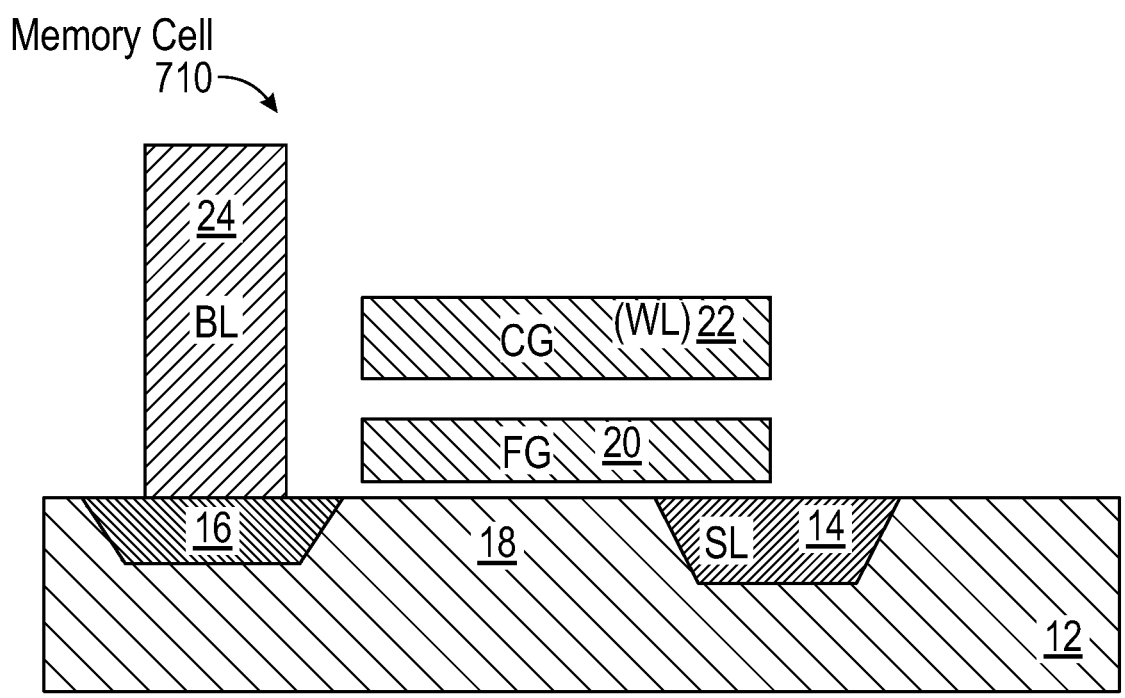
FIG. 7 depicts a prior art stacked gate flash memory cell.

FIG. 7 depicts stacked gate memory cell 710, which is another type of flash memory cell. Memory cell 710 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

| | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such SRAM, DRAM, and volatile synapse cell, without limitation.

Neural Networks Employing Non-Volatile Memory Cell Arrays

Figure 8:
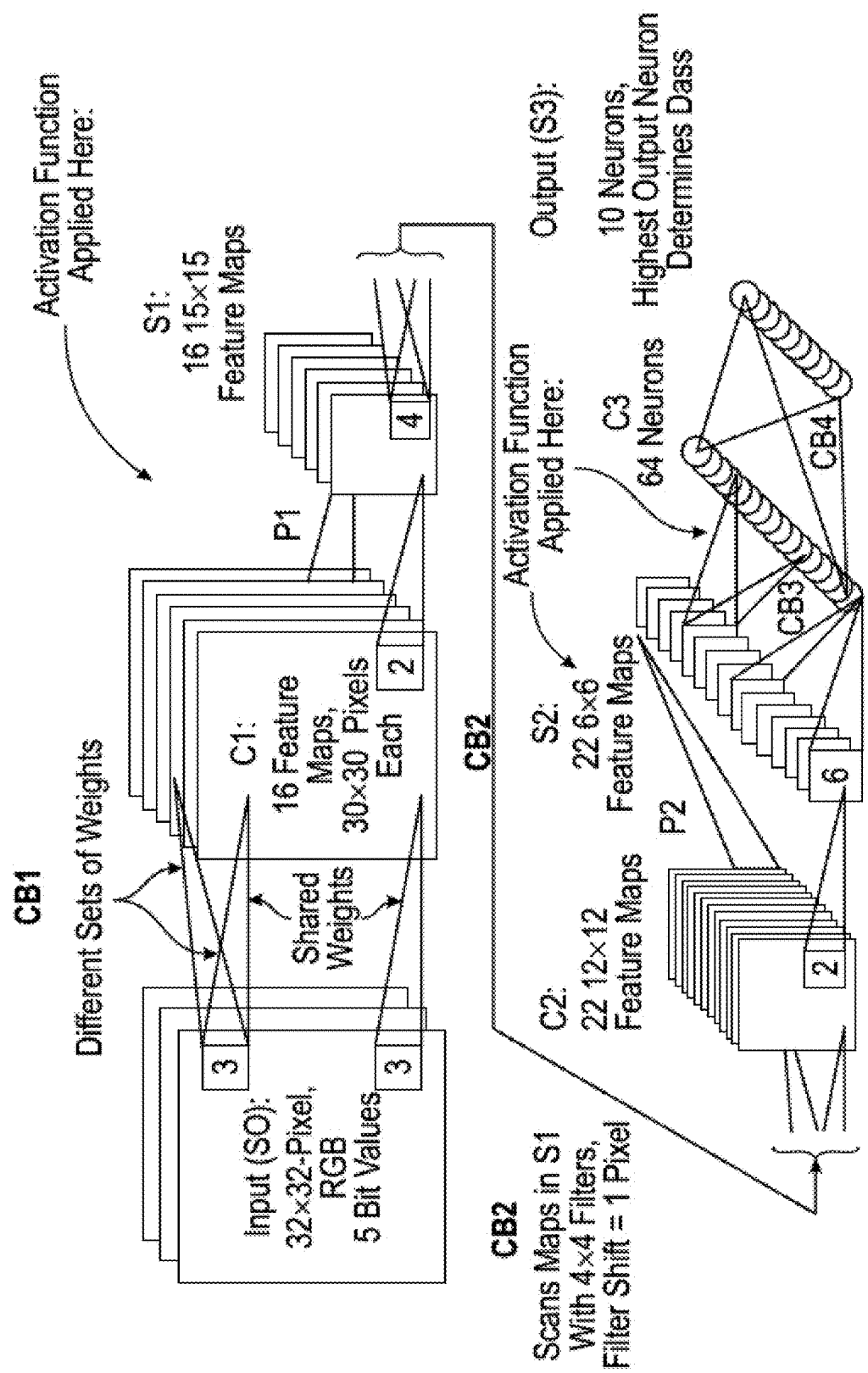
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
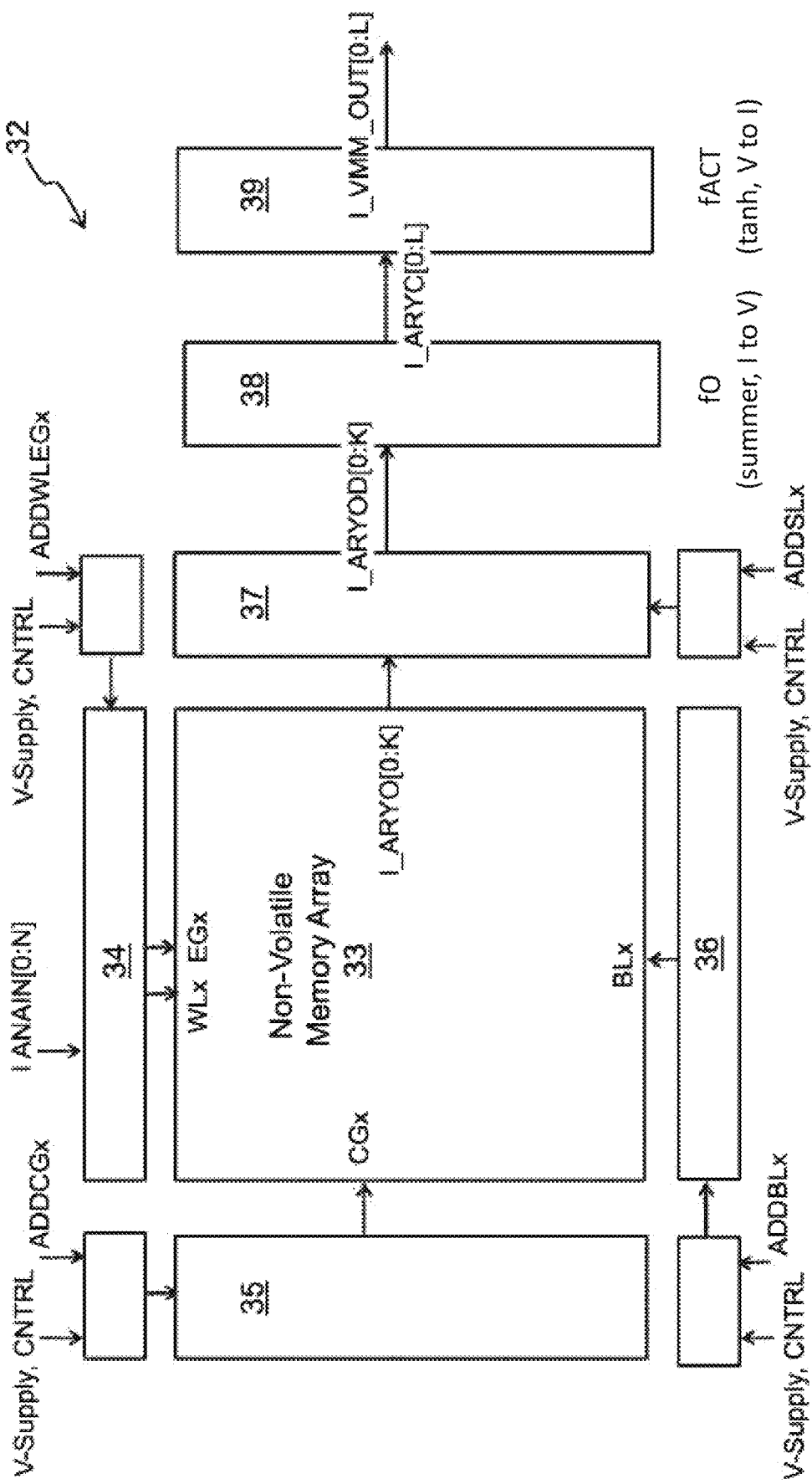
FIG. 9 is a block diagram illustrating a vector-by-matrix multiplication system.

FIG. 9 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tanh, ReLU functions, or any other non-linear functions. The rectified output values of activation function circuit 39 become an element of a feature map of the next layer (e.g. C1 in FIG. 8), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summer 38 and activation function circuit 39 constitute a plurality of neurons.

The input to VMM array 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
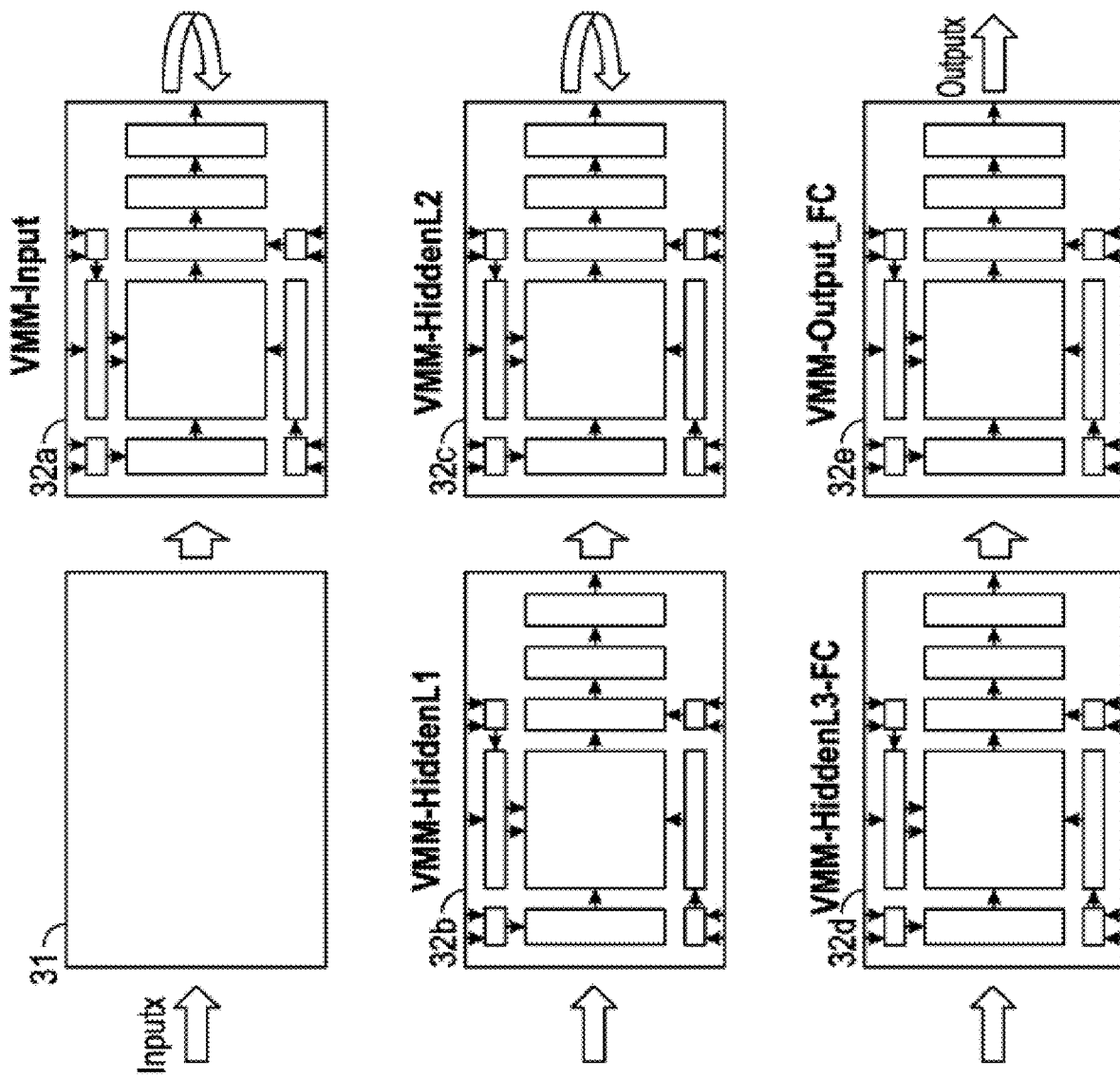
FIG. 10 is a block diagram illustrates an exemplary artificial neural network utilizing one or more a vector-by-matrix multiplication systems.

FIG. 10 is a block diagram depicting the usage of numerous layers of VMM arrays 32, here labeled as VMM arrays 32a, 32b, 32c, 32d, and 32e. As shown in FIG. 10, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a. The input conversion could also be done by a digital-to-digital pules (D/P) converter to convert an external digital input to a mapped digital pulse or pulses to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. Each VMM array 32a, 32b, 32c, 32d, and 32e can also be time multiplexed for various portion of its array or neurons. The example shown in FIG. 10 contains five layers (32a,32b, 32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 11:
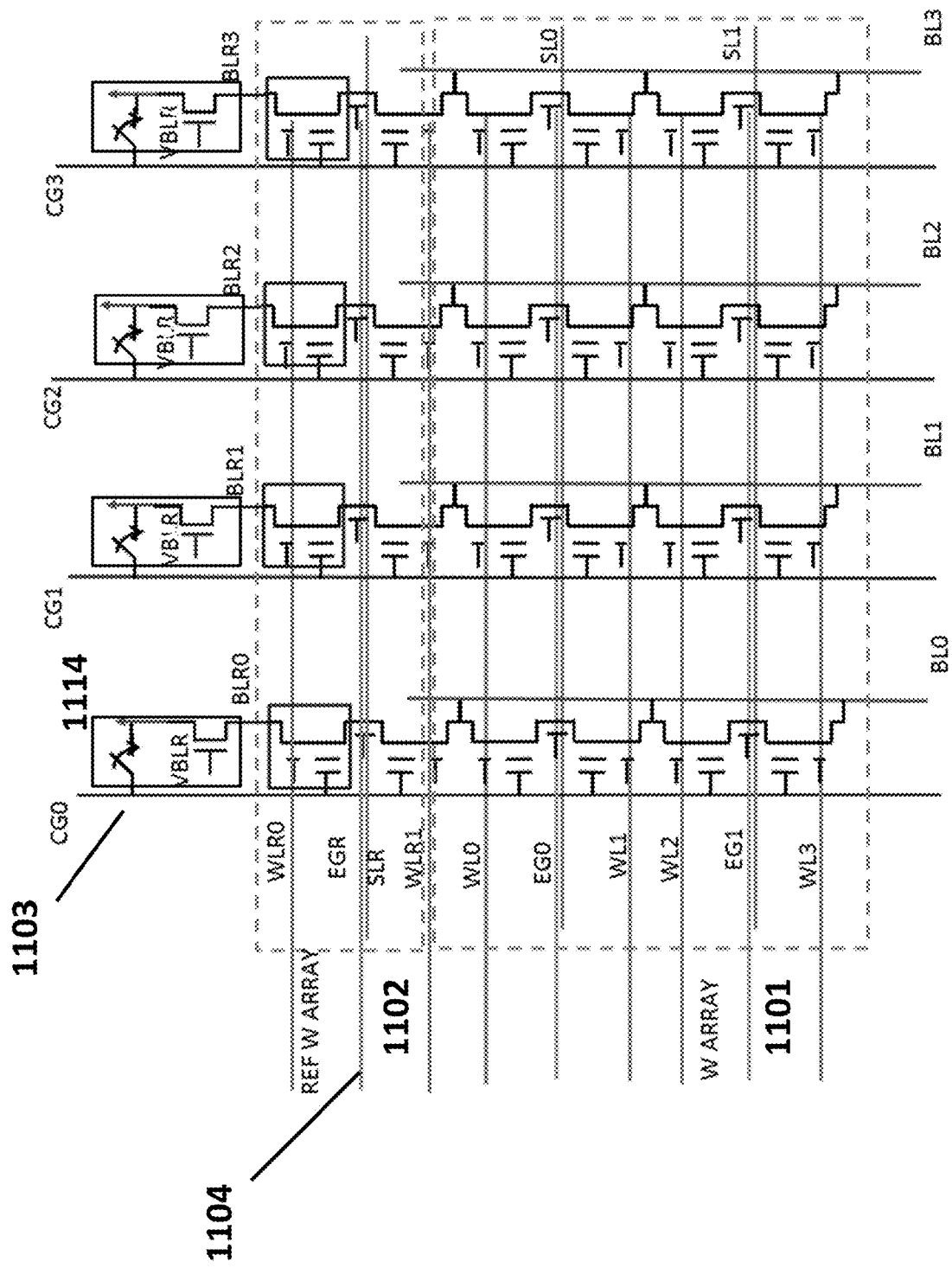
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/kVt} = w * Io * e^{(Vg)/kVt},$$

where $w = e^{(-Vth)/kVt}$

For an I-to-V log converter using a memory cell (such as a reference memory cell or a peripheral memory cell) or a transistor to convert input current into an input voltage:

$$Vg = k * Vt * \log[Ids/wp*Io]$$

Here, wp is w of a reference or peripheral memory cell.

For a memory array used as a vector matrix multiplier VMM array, the output current is:

$$Iout = wa * Io * e^{(Vg)/kVt}, \text{namely}$$

$$Iout = (wa/wp) * Iin = W * Iin$$

$$W = e^{(Vthp-Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = \text{beta} * (Vgs-Vth) * Vds; \text{beta} = u * Cox * W/L$$

$$W \propto (Vgs-Vth)$$

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Other embodiments for VMM array 32 of FIG. 9 are described in U.S. patent application Ser. No. 15/826,345, which is incorporated by reference herein. As described in that application, a sourceline or a bitline can be used as the neuron output (current summation output). Alternatively, the flash memory cells of VMM arrays described herein can be configured to operate in the saturation region:

$$Ids = \alpha \tfrac{1}{2} * beta * (Vgs-Vth)^2; beta = u*Cox*W/L$$

$$W = \alpha(Vgs-Vth)^2$$

A wordline, control gate, or erase gate can be used as the input for the memory cell operated in the saturation region. The bitline or sourceline can be used as the output for the output neuron.

Alternatively, the flash memory cells of VMM arrays described herein can be used in all regions or a combination thereof (sub threshold, linear, or saturation).

Figure 12:
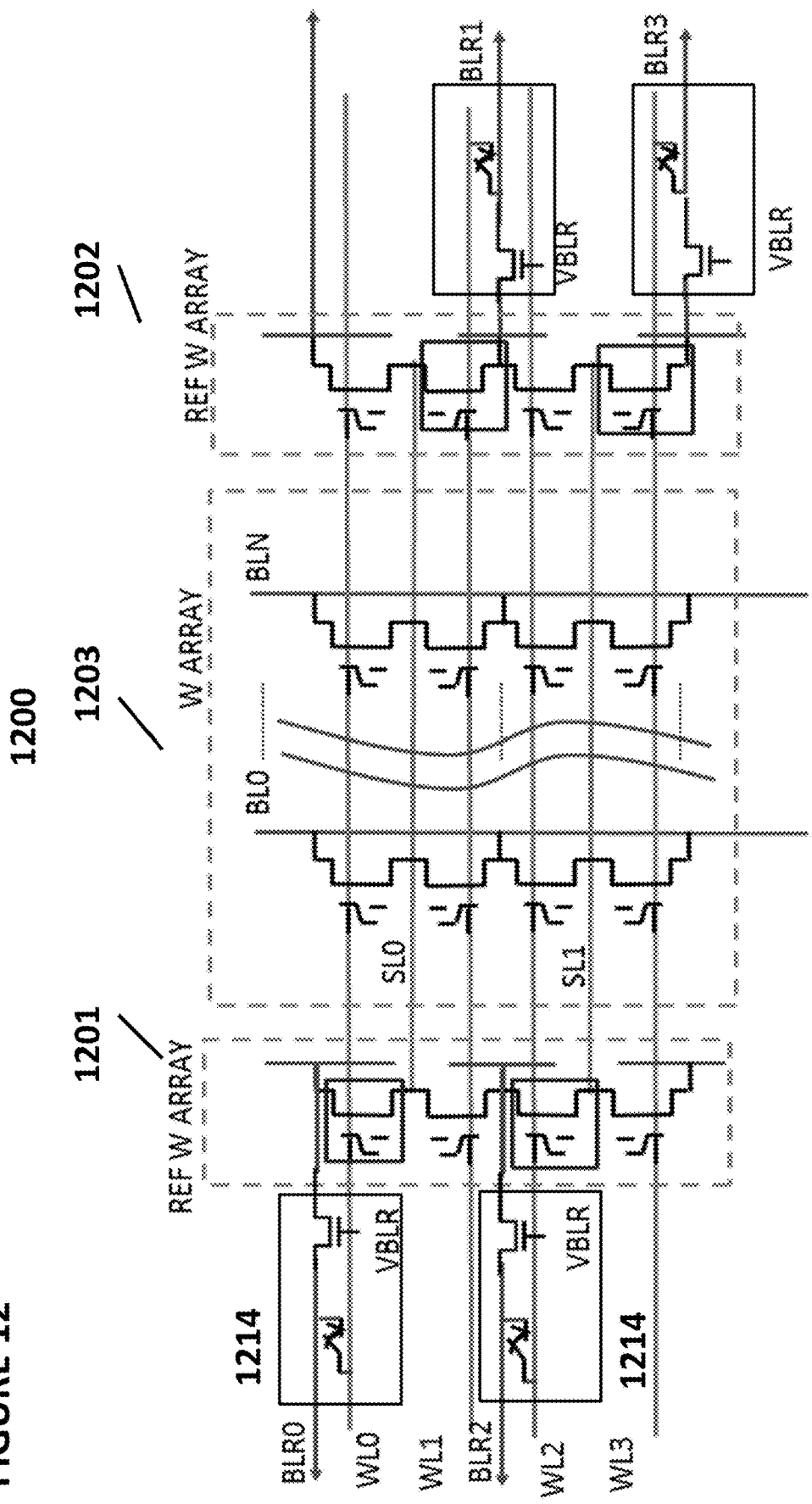
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 5

Operation of VMM Array 1200 of Figure 12:

|  | WL | WL-unsel | BL | BL-unsel | SL | SL-unsel |
|---|---|---|---|---|---|---|
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
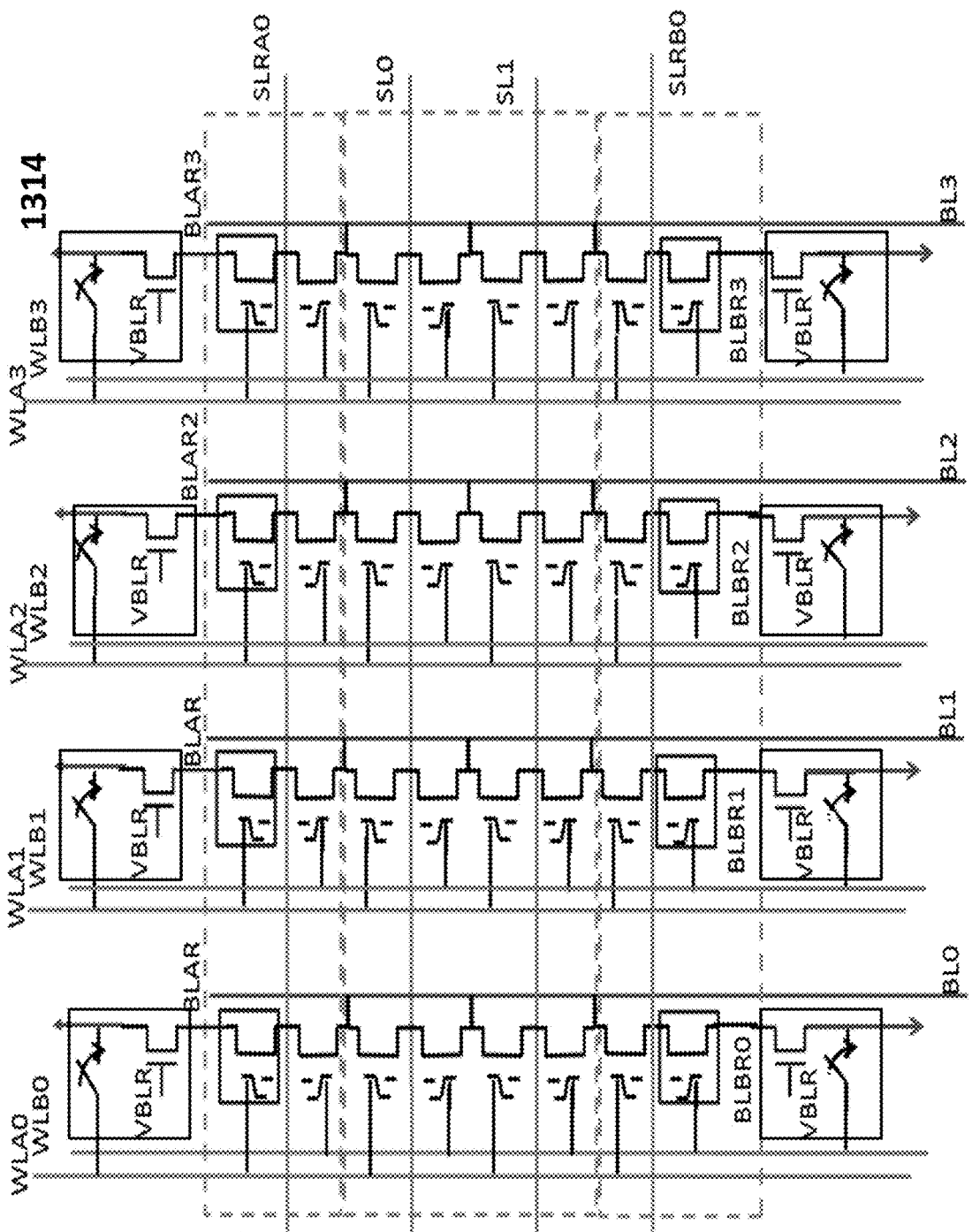
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 6

Operation of VMM Array 1300 of Figure 13

|  | WL | WL-unsel | BL | BL-unsel | SL | SL-unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figures 14, 15:
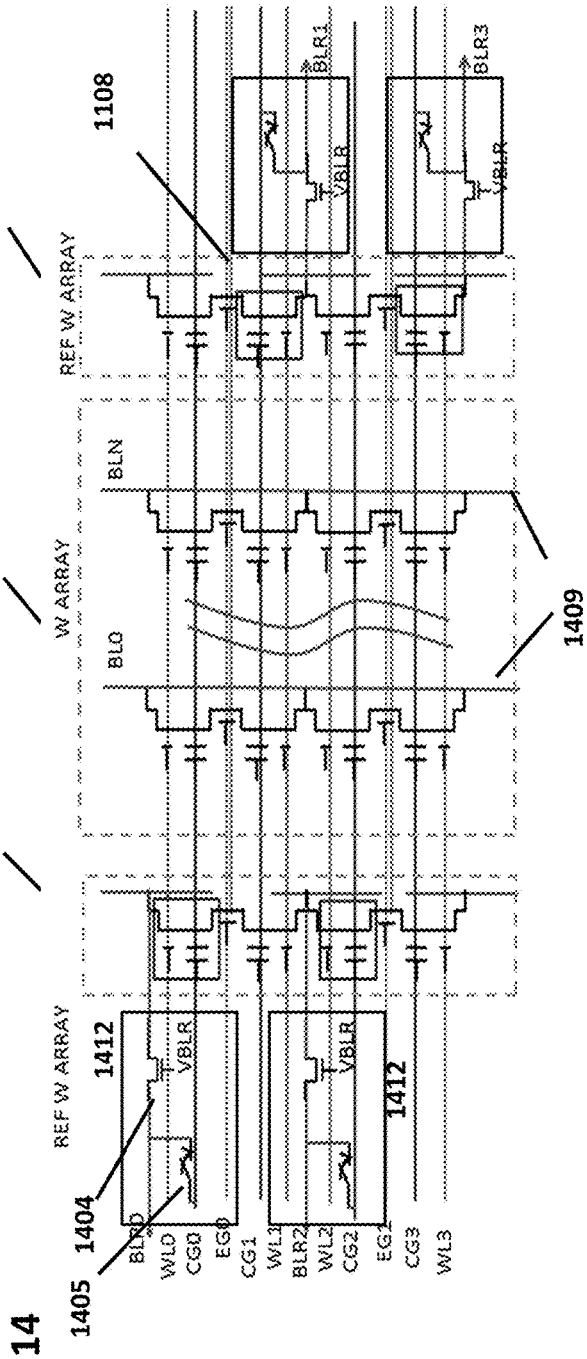
FIG. 14 depicts another embodiment of a vector-by-matrix multiplication system.
FIG. 15 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor

1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 7

Operation of VMM Array 1400 of Figure 14

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 8

Operation of VMM Array 1500 of Figure 15

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 24:
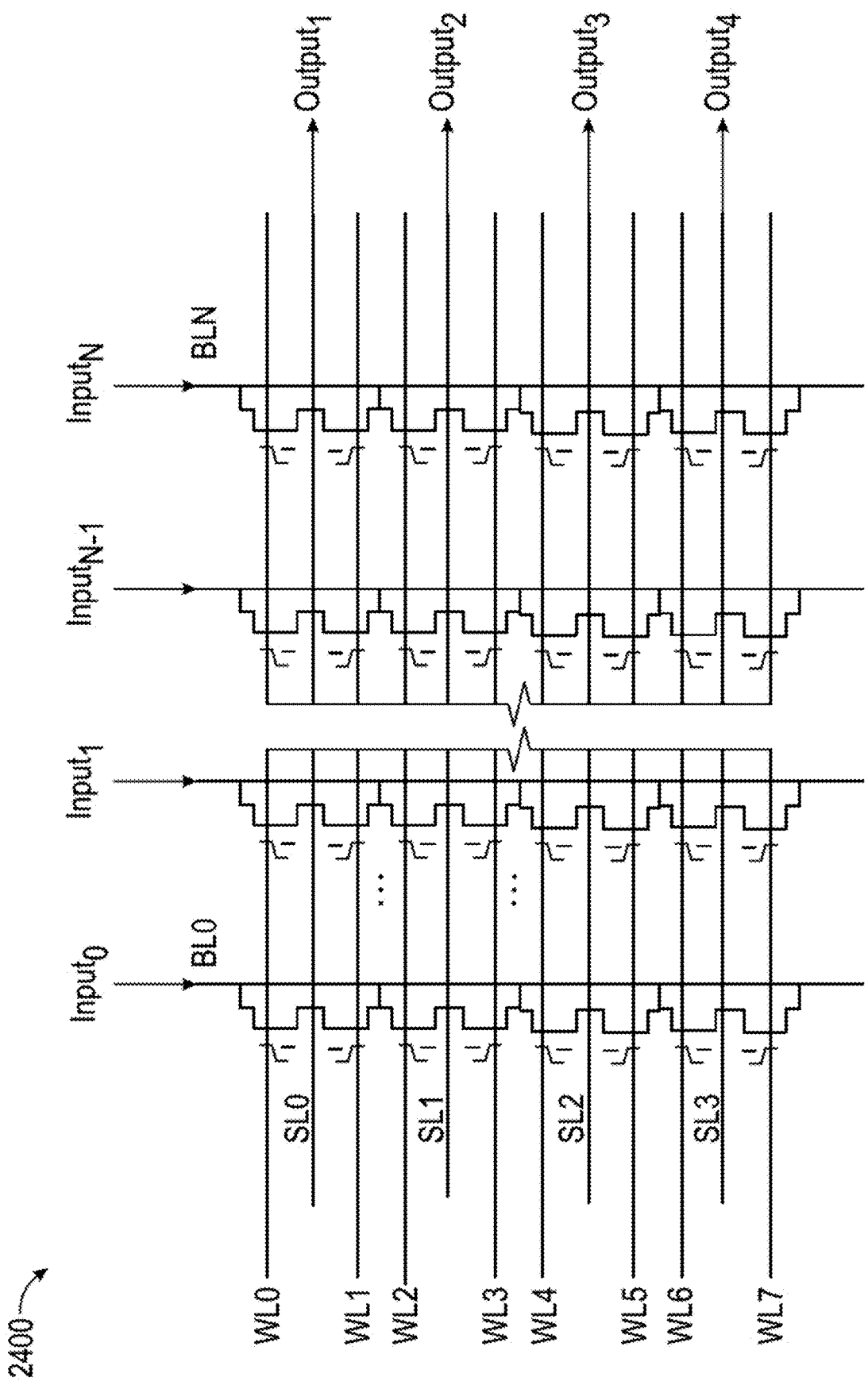
FIG. 24 depicts another embodiment of a vector-by-matrix multiplication system.

FIG. 24 depicts neuron VMM array 2400, which is particularly suited for memory cells 210 as shown in FIG. 2, and is utilized as the synapses and parts of neurons between an input layer and the next layer. In VMM array 2400, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 25:
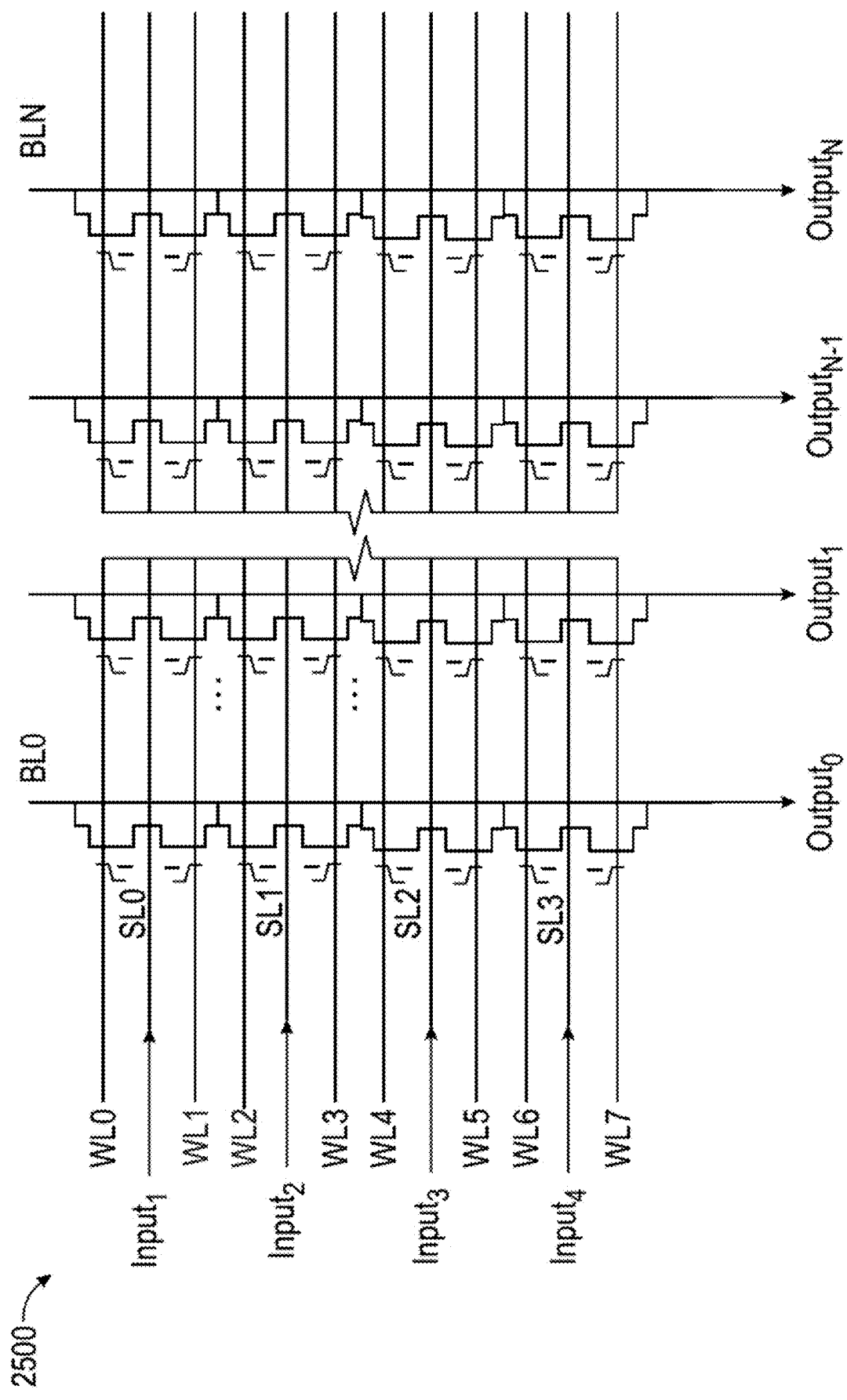
FIG. 25 depicts another embodiment of a vector-by-matrix multiplication system.

FIG. 25 depicts neuron VMM array 2500, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 26:
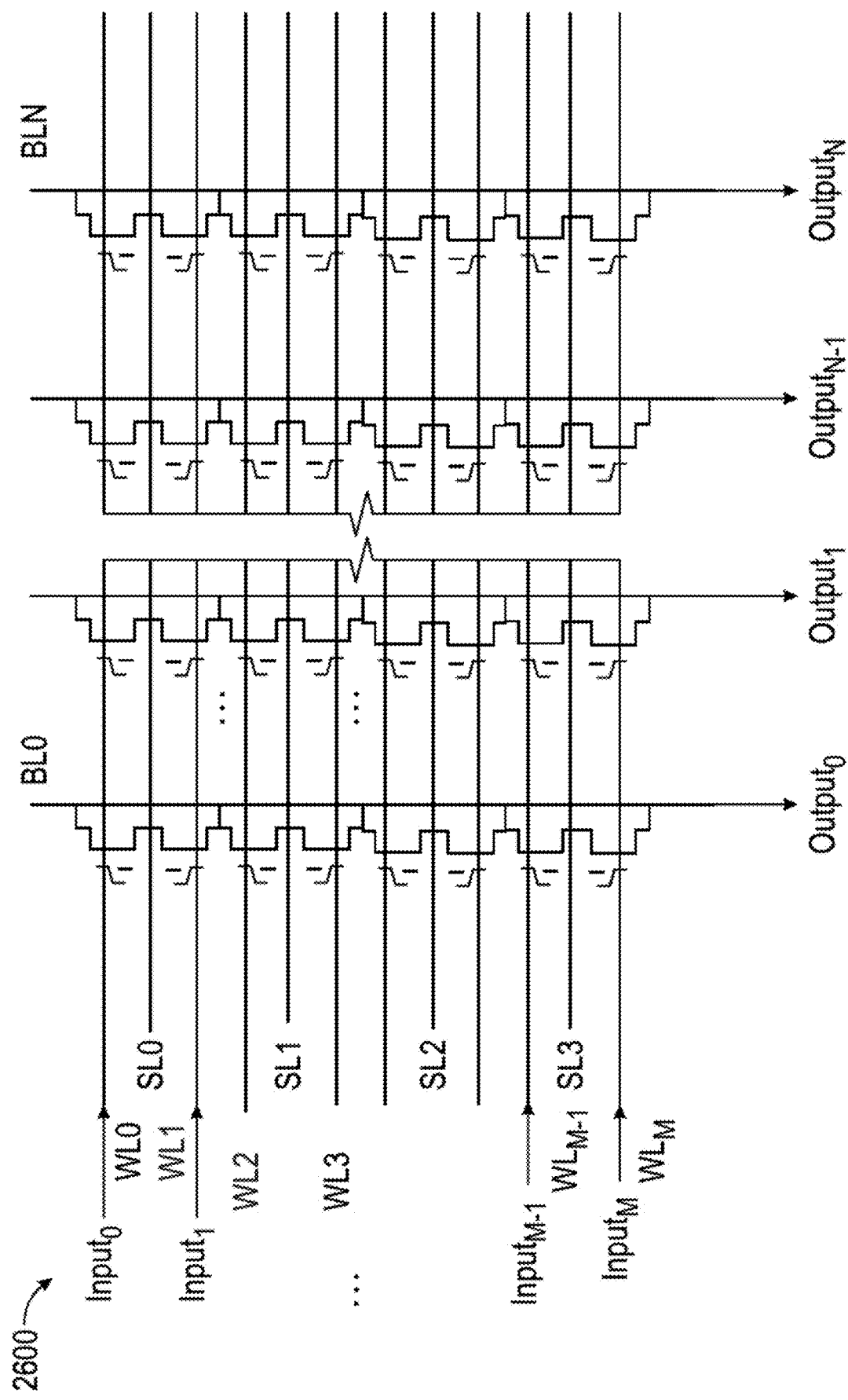
FIG. 26 depicts another embodiment of a vector-by-matrix multiplication system.

FIG. 26 depicts neuron VMM array 2600, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0$, $BL_N$.

Figure 27:
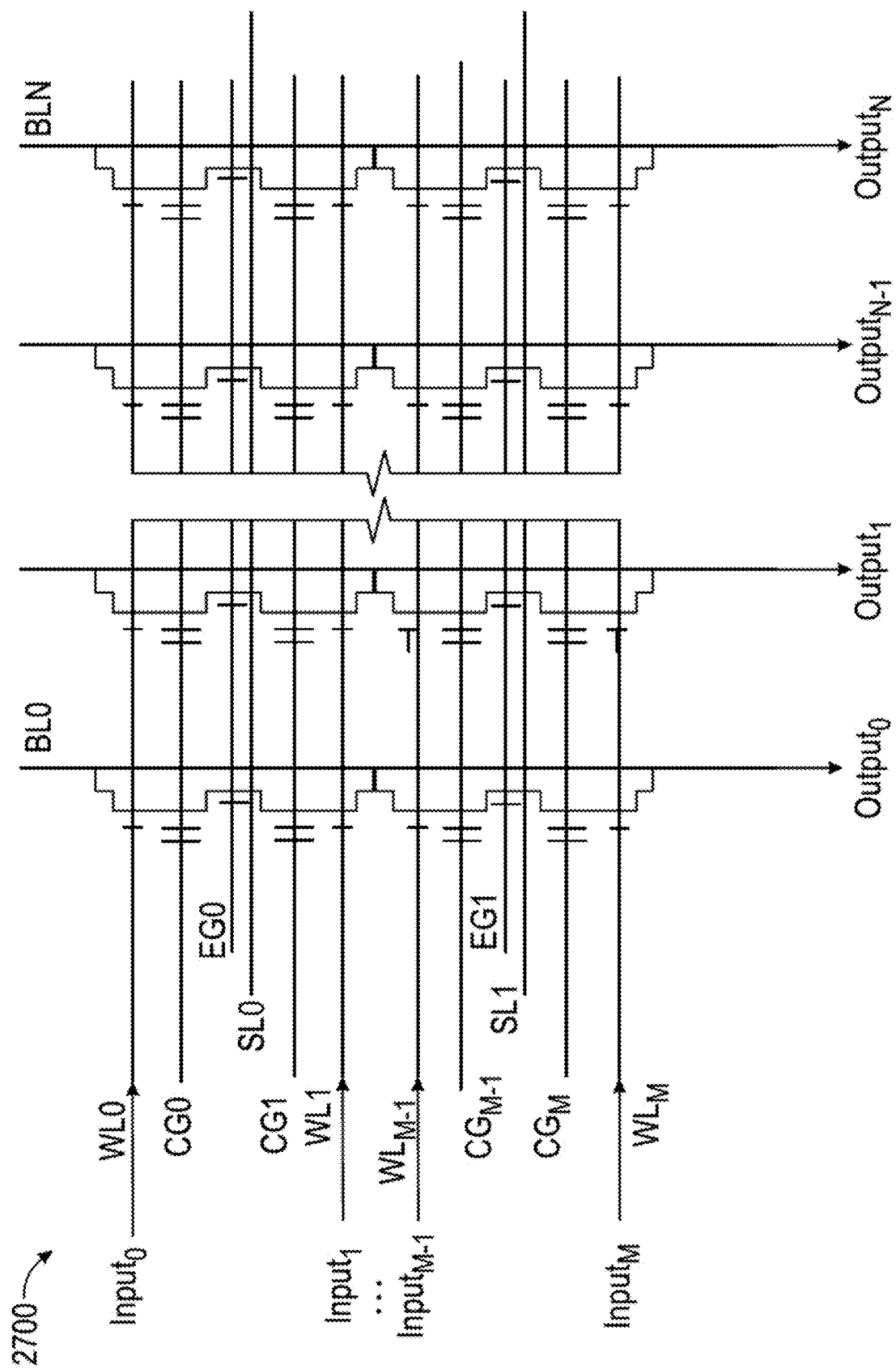
FIG. 27 depicts another embodiment of a vector-by-matrix multiplication system.

FIG. 27 depicts neuron VMM array 2700, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0$, $BL_N$.

Figure 28:
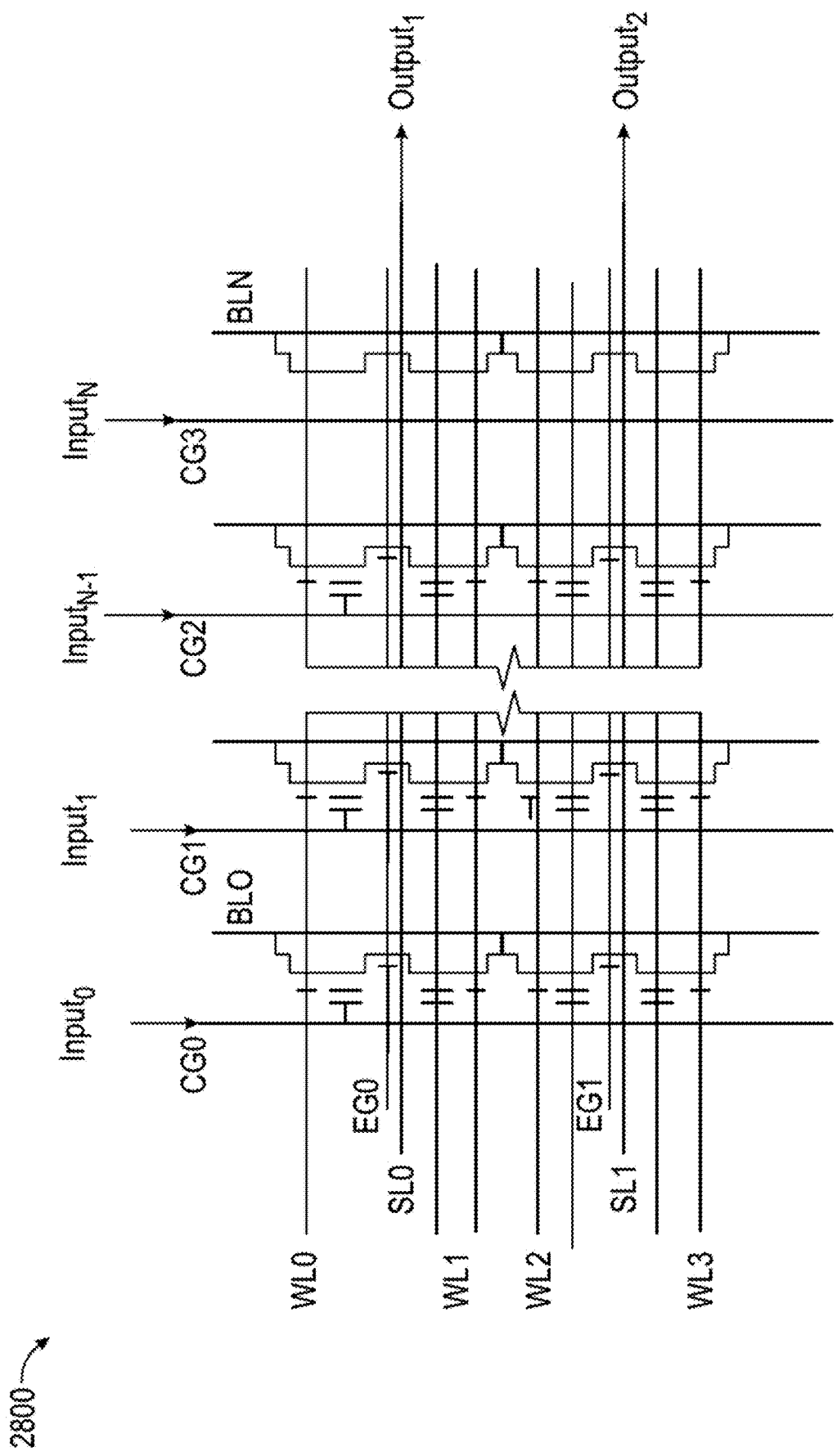
FIG. 28 depicts another embodiment of a vector-by-matrix multiplication system.

FIG. 28 depicts neuron VMM array 2800, which is particularly suited for memory cells 410 as shown in FIG. 4, and is utilized as the synapses and parts of neurons between an input layer and the next layer. In this example, the inputs $INPUT_0, \ldots, INPUT_n$ are received on control gate lines $CG_0, \ldots, CG_N$, respectively, and the outputs $OUTPUT_1$ and $OUTPUT_2$ are generated on source lines $SL_0$ and $SL_1$.

Figure 29:
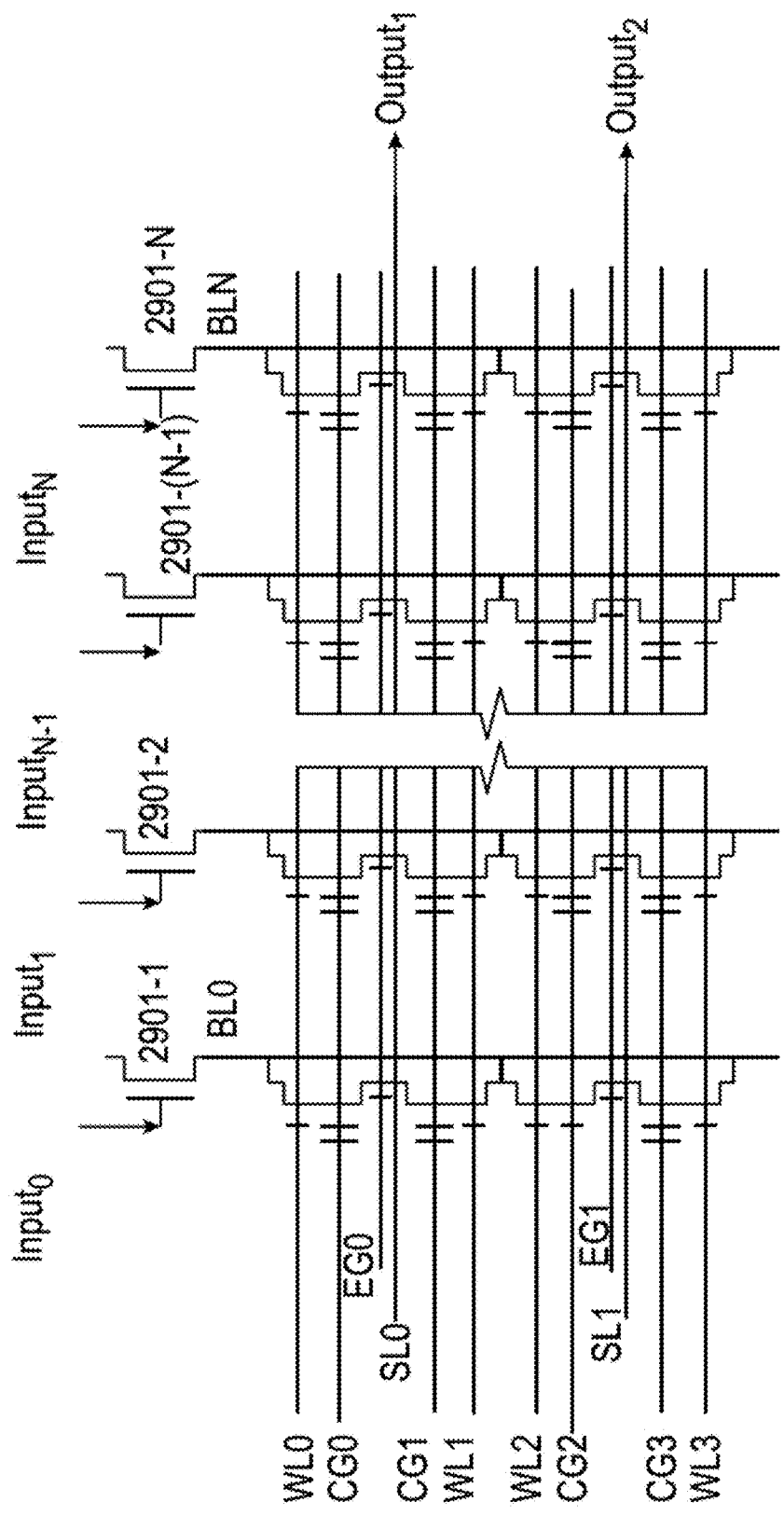
FIG. 29 depicts another embodiment of a vector-by-matrix multiplication system.

FIG. 29 depicts neuron VMM array 2900, which is particularly suited for memory cells 410 as shown in FIG. 4, and is utilized as the synapses and parts of neurons between an input layer and the next layer. In this example, the inputs $INPUT_0, \ldots, INPUT_N$ are received on the gates of bit line control gates 2901-1, 2901-2, . . . , 2901-(N-1), and 2901-N, respectively, which are coupled to bit lines $BL_0, \ldots, BL_N$, respectively. Exemplary outputs $OUTPUT_1$ and $OUTPUT_2$ are generated on source lines $SL_0$ and $SL_1$.

Figure 30:
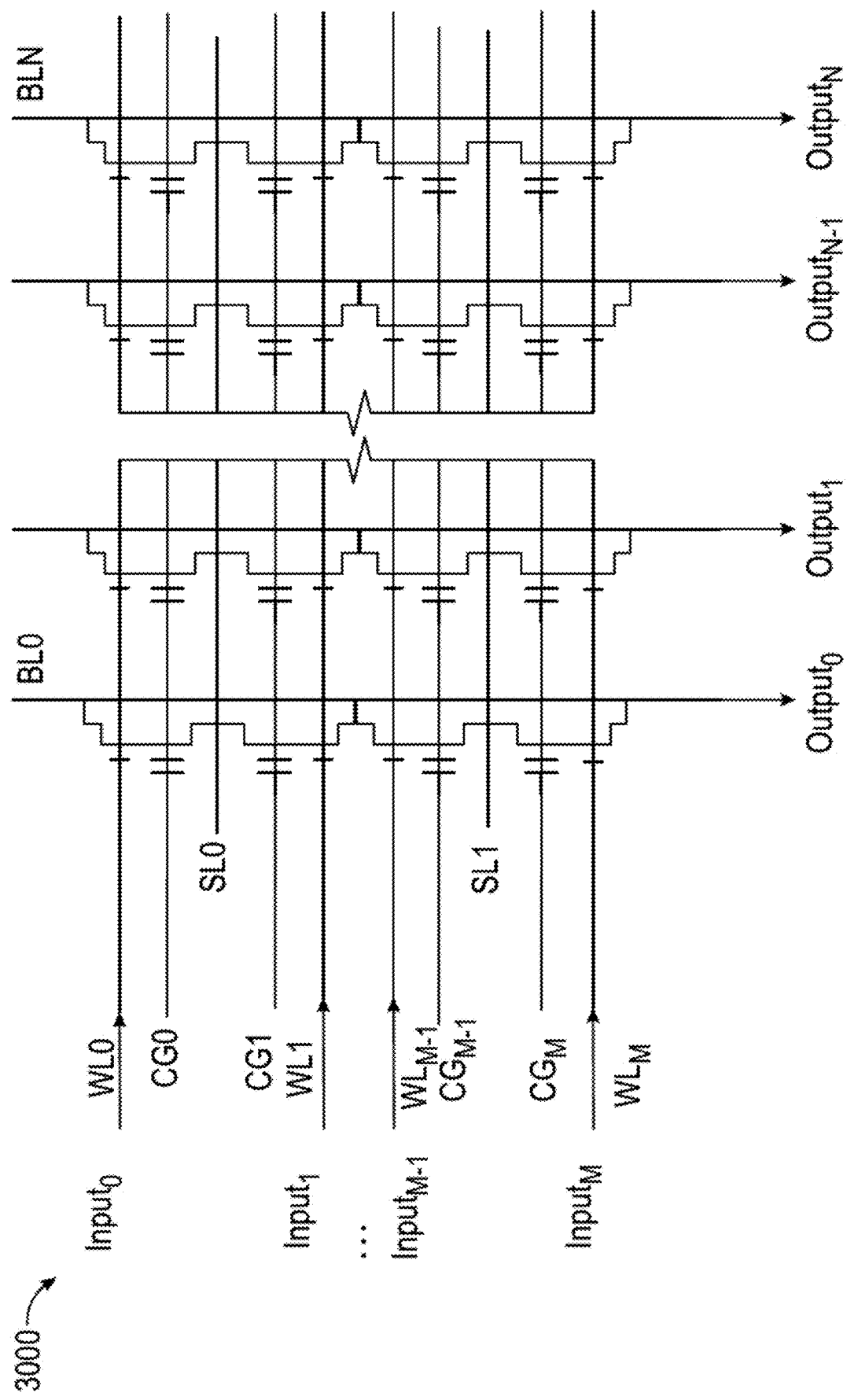
FIG. 30 depicts another embodiment of a vector-by-matrix multiplication system.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, $INPUT_N$ are received on word lines $WL_0, \ldots, WL_M$, and the outputs $OUTPUT_0, \ldots, OUTPUT_N$ are generated on bit lines $BL_0, \ldots, BL_N$, respectively.

Figure 31:
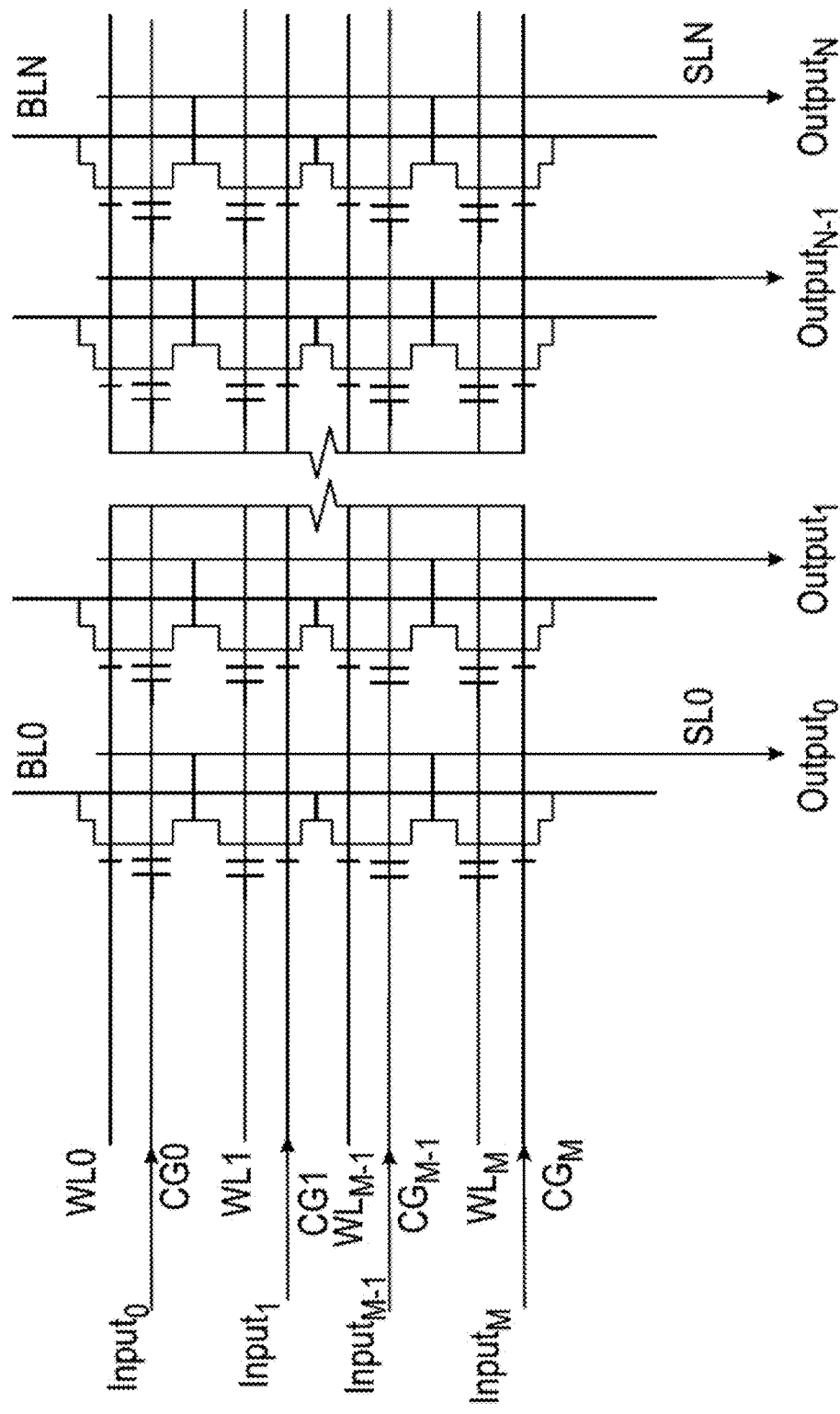
FIG. 31 depicts another embodiment of a vector-by-matrix multiplication system.

FIG. 31 depicts neuron VMM array 3100, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, $INPUT_M$ are received on control gate lines $CG_0, \ldots, CG_M$. Outputs $OUTPUT_0, \ldots, OUTPUT_N$ are generated on source lines $SL_0, \ldots, SL_N$, respectively, where each source line $SL_i$ is coupled to the source line terminals of all memory cells in column i.

Figure 32:
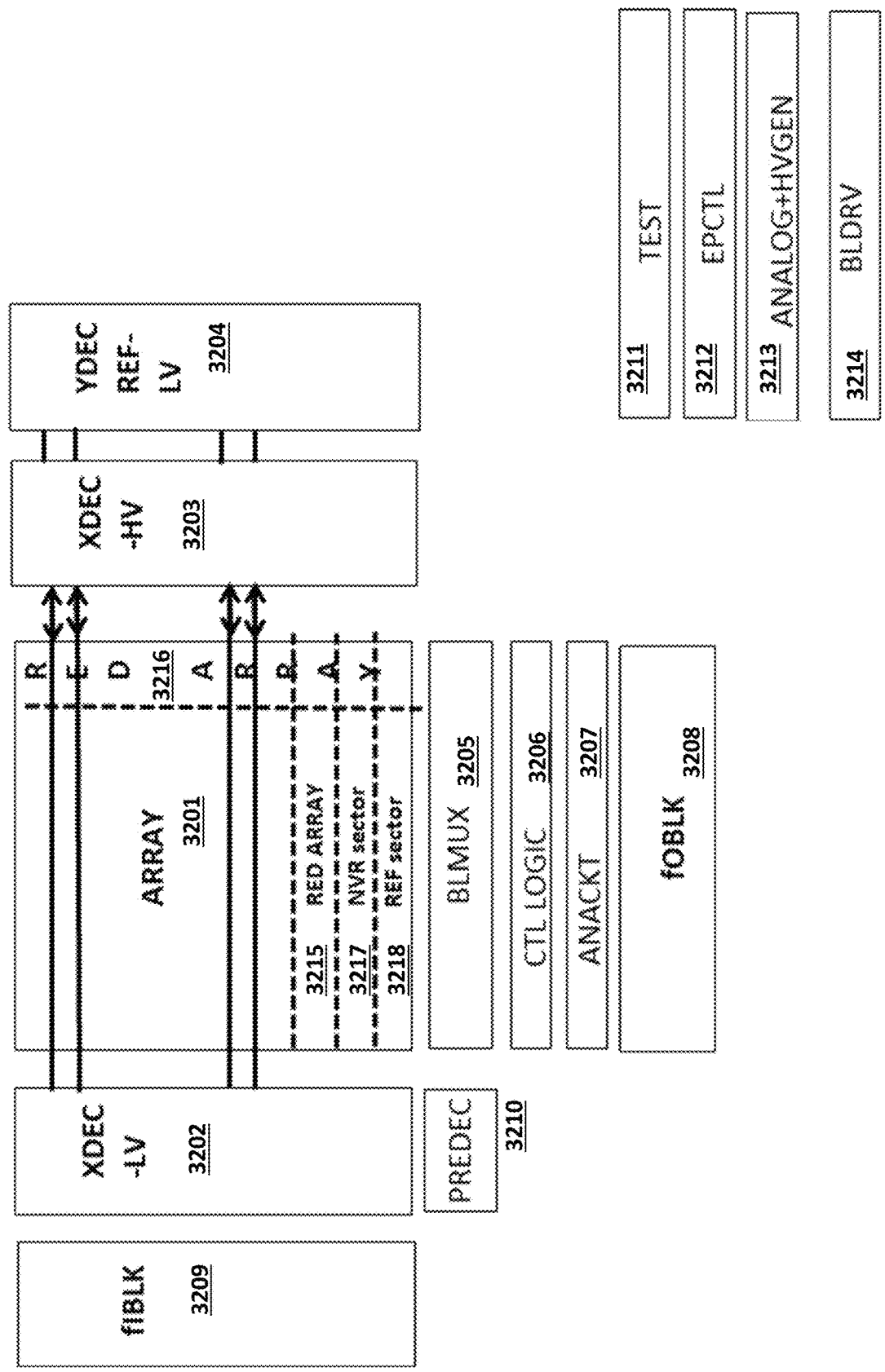
FIG. 32 depicts a VMM system.

FIG. 32 depicts VMM system 3200. VMM system 3200 comprises VMM array 3201 (which can be based on any of the VMM design discussed previously, such as VMM 900, 1000, 1100, 1200, and 1320, or other VMM designs), low voltage row decoder 3202, high voltage row decoder 3203, reference cell low voltage column decoder 3204 (shown in the column direction, meaning that it provides input to output conversion in the row direction), bit line multiplexor 3205, control logic 3206, analog circuitry 3207, neuron output block 3208, input VMM circuit block 3209, predecoders 3210, test circuit 3211, erase-program control logic EPCTL 3212, analog and high voltage generation circuitry 3213, bit line PE driver 3214, redundancy arrays 3215 and 3216, NVR sectors 3217, and reference sectors 3218. The input circuit block 3209 serves as interface from an external input to the input terminals of the memory array. The neuron output block 3208 serves as an interface from the memory array output to the external interface.

Low voltage row decoder 3202 provides a bias voltage for read and program operations and provides a decoding signal for high voltage row decoder 3203. High voltage row decoder 3203 provides a high voltage bias signal for program and erase operations. Optional reference cell low voltage column decoder 3204 provides a decoding function for the reference cells. Bit line PE driver 3214 provides a controlling function for bit lines during program, verify, and erase operations. Analog and high voltage generation circuitry 3213 is a shared bias block that provides the multiple voltages needed for the various program, erase, program verify, and read operations. Optional redundancy arrays 3215 and 3216 provide array redundancy for replacing a defective array portion. Optional NVR (non-volatile register also known as info sector) sectors 3217 are sectors that are array sectors used to store user info, device ID, password, security key, trimbits, configuration bits, manufacturing info, without limitation.

Figure 33:
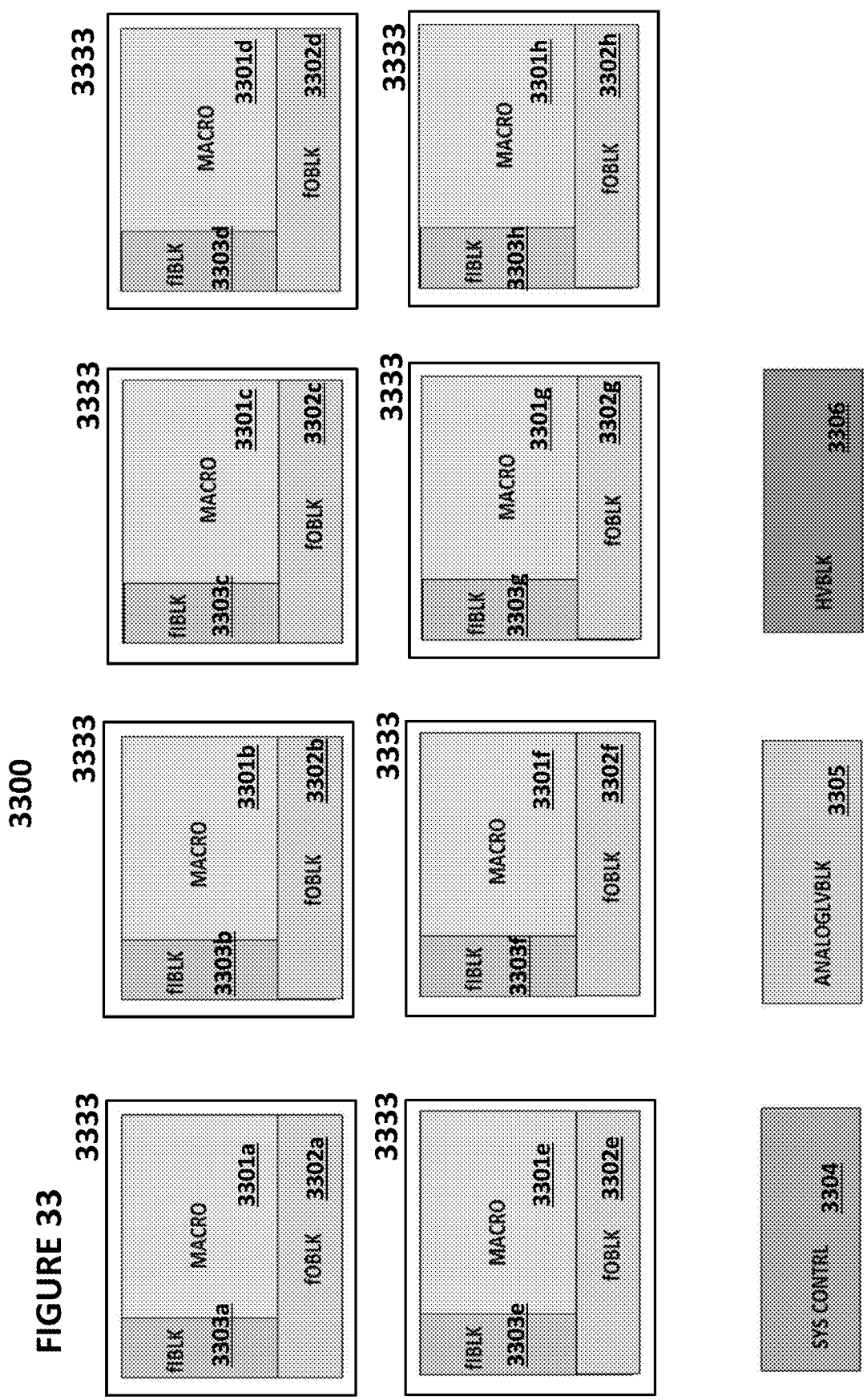
FIG. 33 depicts an analog neuro memory system.

FIG. 33 depicts analog neuro memory system 3300. Analog neuro memory system 3300 comprises macro blocks 3301a, 3301b, 3301c, 3301d, 3301e, 3301f, 3301g, and 3301h; neuron output (such as summer circuit and a sample and hold S/H circuit) blocks 3302a, 3302b, 3302c, 3302d, 3302e, 3302f, 3302g, and 3302h; and input circuit blocks 3303a, 3303b, 3303c, 3303d, 3303e, 3303f, 3303g, and 3304h. Each of macro blocks 3301a, 3301b, 3301c, 3301d, 3301e, and 3301f is a VMM sub-system containing a VMM array. A neuro memory sub-system 3333 includes a macro block 3301, an input block 3303, and a neuron output block 3302. The neuro memory sub-system 3333 may have its own digital control block.

Analog neuro memory system 3300 further comprises system control block 3304, analog low voltage block 3305, and high voltage block 3306. System control block 3304 may include microcontroller cores such as ARM/MIPS/RISC_V cores to handle general control function and arithmetic operations. System control block 3304 also may include SIMD (single instruction multiple data) units to operate on multiple data with a single instruction. It may include DSP cores. It may include hardware or software for performing functions such as pooling, averaging, min, max, softmax, add, subtract, multiply, divide, log, anti-log, ReLu, sigmoid, tanh, data compression, without limitation. It may include hardware or software to perform functions such as activation approximator/quantizer/normalizer. It may include the ability to perform functions such as input data approximator/quantizer/normalizer. It may include hardware or software to perform functions of an activation approximator/quantizer/normalizer. The control block of the neuro memory sub-system 3333 may include similar elements of the system control block 3304 such as microcontroller cores, SIMD cores, DSP cores, and other function units.

In one embodiment, neuron output blocks 3302a, 3302b, 3302c, 3302d, 3302e, 3302f, 3302g, and 3302h each includes a buffer (e.g., op amp) low impedance output type circuit that can drive a long, configurable interconnect. In one embodiment, input circuit blocks 3303a, 3303b, 3303c, 3303d, 3303e, 3303f, 3303g, and 3303h each provide summing, high impedance current outputs. In another embodiment, neuron output blocks 3302a, 3302b, 3302c, 3302d, 3302e, 3302f, 3302g, and 3302h each includes an activation circuit, in which case an additional low impedance buffer is needed to drive the outputs.

In another embodiment, the neuron output blocks 3302a, 3302b, 3302c, 3302d, 3302e, 3302f, 3302g, and 3302h each comprises an analog-to-digital conversion block that outputs digital bits instead of analog signals. In this embodiment, input circuit blocks 3303a, 3303b, 3303c, 3303d, 3303e, 3303f, 3303g, and 3303h each comprises a digital-to-analog conversion block that receives digital bits from the respective neuron output blocks and converts the digital bits into analog signals.

Thus, neuron output blocks 3302a, 3302b, 3302c, 3302d, 3302e, 3302f, 3302g, and 3302h receives output current from macro blocks 3301a, 3301b, 3301c, 3301d, 3301e, and 3301f and optionally converts that output current into an analog voltage, digital bits, or one or more digital pulses where the width of each pulse or the number of pulses varies in response to the value of the output current. Similarly, input circuit blocks 3303a, 3303b, 3303c, 3303d, 3303e, 3303f, 3303g, and 3303h optionally receives analog current, analog voltage, digital bits, or digital pulses where the width of each pulse or the number of pulses varies in response to the value of the output current and provides analog current to macro blocks 3301a, 3301b, 3301c, 3301d, 3301e, and 3301f. Input circuit blocks 3303a, 3303b, 3303c, 3303d, 3303e, 3303f, 3303g, and 3303h optionally comprises an voltage-to-current converter, an analog or digital counter for counting the number of digital pulses in an input signal or width of a digital pulse in an input signal, or a digital-to-analog converter.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 16:
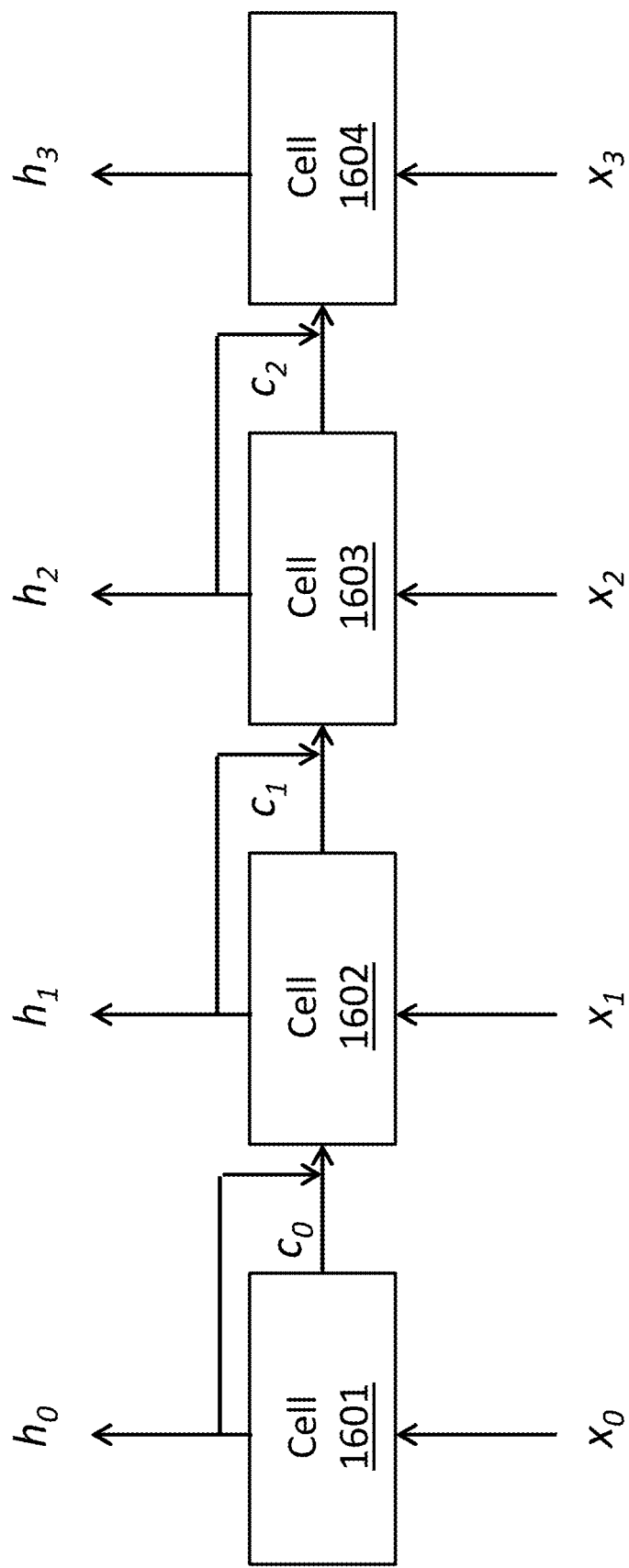
FIG. 16 depicts a prior art long short term memory system.

FIG. 16 depicts an exemplary LSTM 1600. LSTM 1600 in this example comprises cells 1601, 1602, 1603, and 1604. Cell 1601 receives input vector $x_0$ and generates output vector $h_0$ and cell state vector $c_0$. Cell 1602 receives input vector $x_1$, the output vector (hidden state) $h_0$ from cell 1601, and cell state co from cell 1601 and generates output vector $h_1$ and cell state vector $c_1$. Cell 1603 receives input vector $x_2$, the output vector (hidden state) $h_1$ from cell 1602, and cell state $c_1$ from cell 1602 and generates output vector $h_2$ and cell state vector $c_2$. Cell 1604 receives input vector $x_3$, the output vector (hidden state) $h_2$ from cell 1603, and cell state $c_2$ from cell 1603 and generates output vector $h_3$. Additional cells can be used, and an LSTM with four cells is merely an example.

Figure 17:
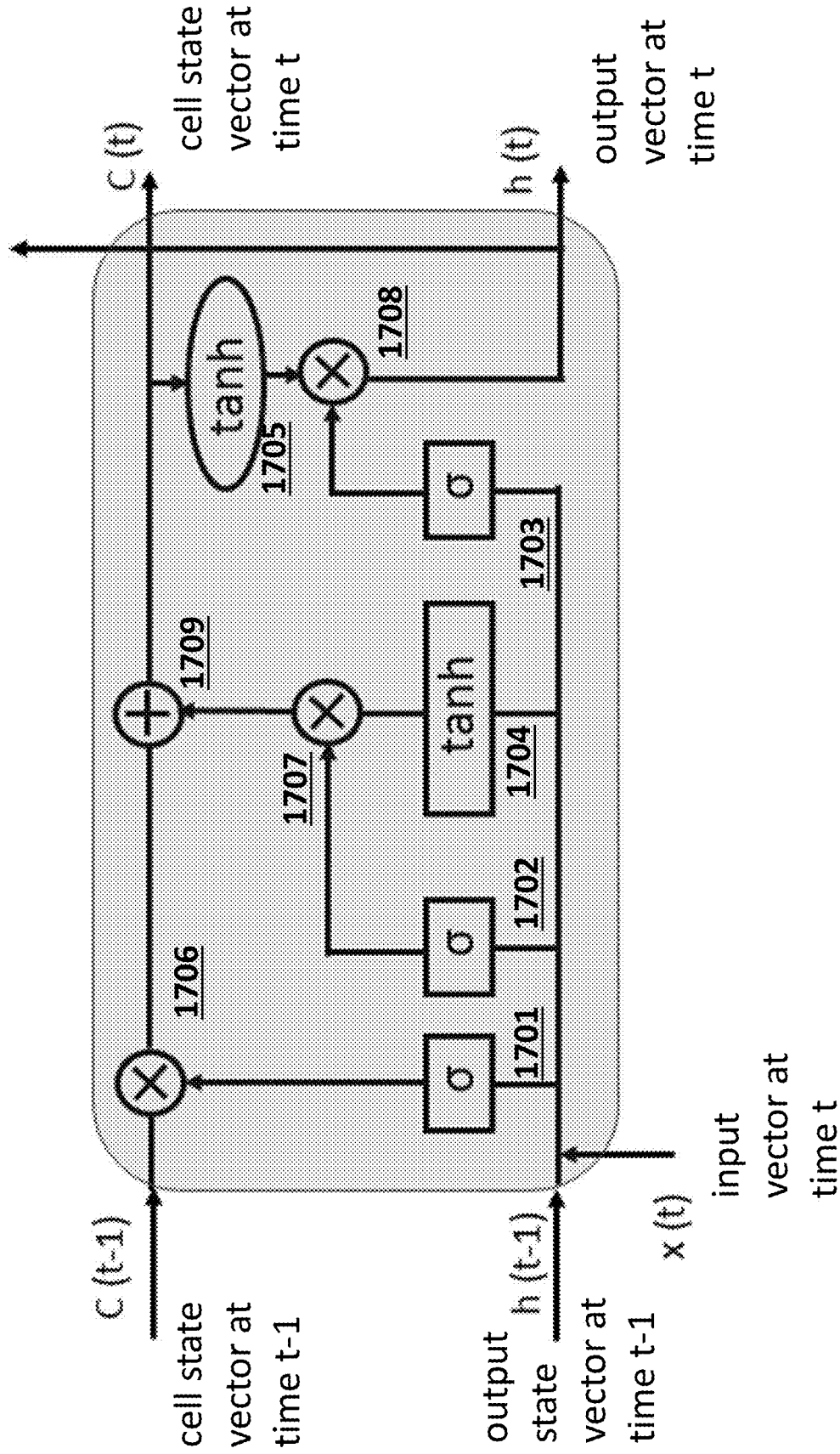
FIG. 17 depicts an exemplary cell for use in a long short term memory system.

FIG. 17 depicts an exemplary implementation of an LSTM cell 1700, which can be used for cells 1601, 1602, 1603, and 1604 in FIG. 16. LSTM cell 1700 receives input vector x(t), cell state vector c(t−1) from a preceding cell, and output vector h(t−1) from a preceding cell, and generates cell state vector c(t) and output vector h(t).

LSTM cell 1700 comprises sigmoid function devices 1701, 1702, and 1703, each of which applies a number between 0 and 1 to control how much of each component n the input vector is allowed through to the output vector. LSTM cell 1700 also comprises tanh devices 1704 and 1705 to apply a hyperbolic tangent function to an input vector, multiplier devices 1706, 1707, and 1708 to multiply two vectors together, and addition device 1709 to add two vectors together. Output vector h(t) can be provided to the next LSTM cell in the system, or it can be accessed for other purposes.

Figure 18:
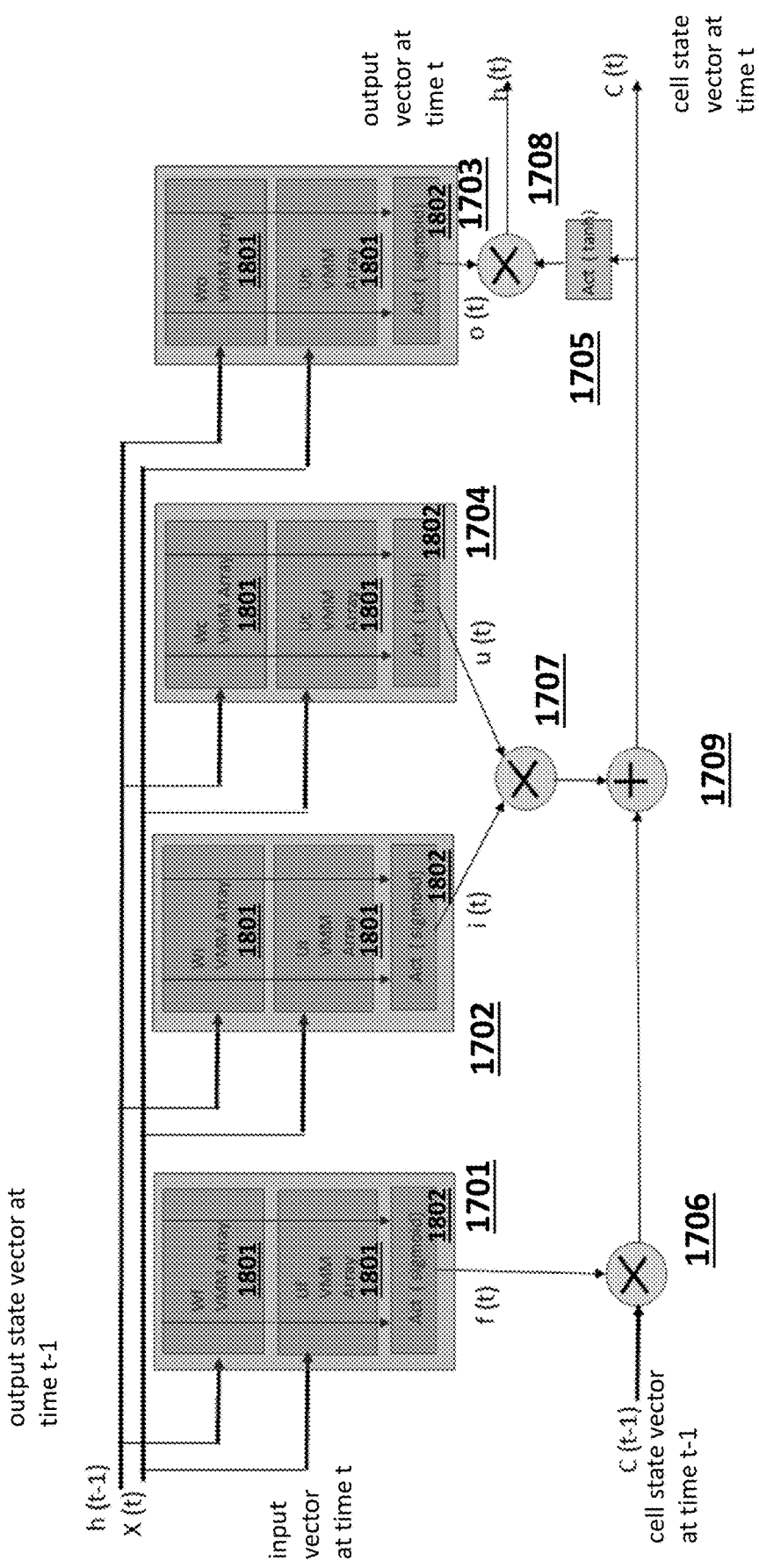
FIG. 18 depicts an embodiment of the exemplary cell of FIG. 17.

FIG. 18 depicts an LSTM cell 1800, which is an example of an implementation of LSTM cell 1700. For the reader's convenience, the same numbering from LSTM cell 1700 is used in LSTM cell 1800. Sigmoid function devices 1701, 1702, and 1703 and tanh device 1704 each comprise multiple VMM arrays 1801 and activation circuit blocks 1802. Thus, it can be seen that VMM arrays are particular useful in LSTM cells used in certain neural network systems. The multiplier devices 1706, 1707, and 1708 and the addition device 1709 are implemented in a digital manner or in an analog manner. The activation function blocks 1802 can be implemented in a digital manner or in an analog manner.

Figure 19:
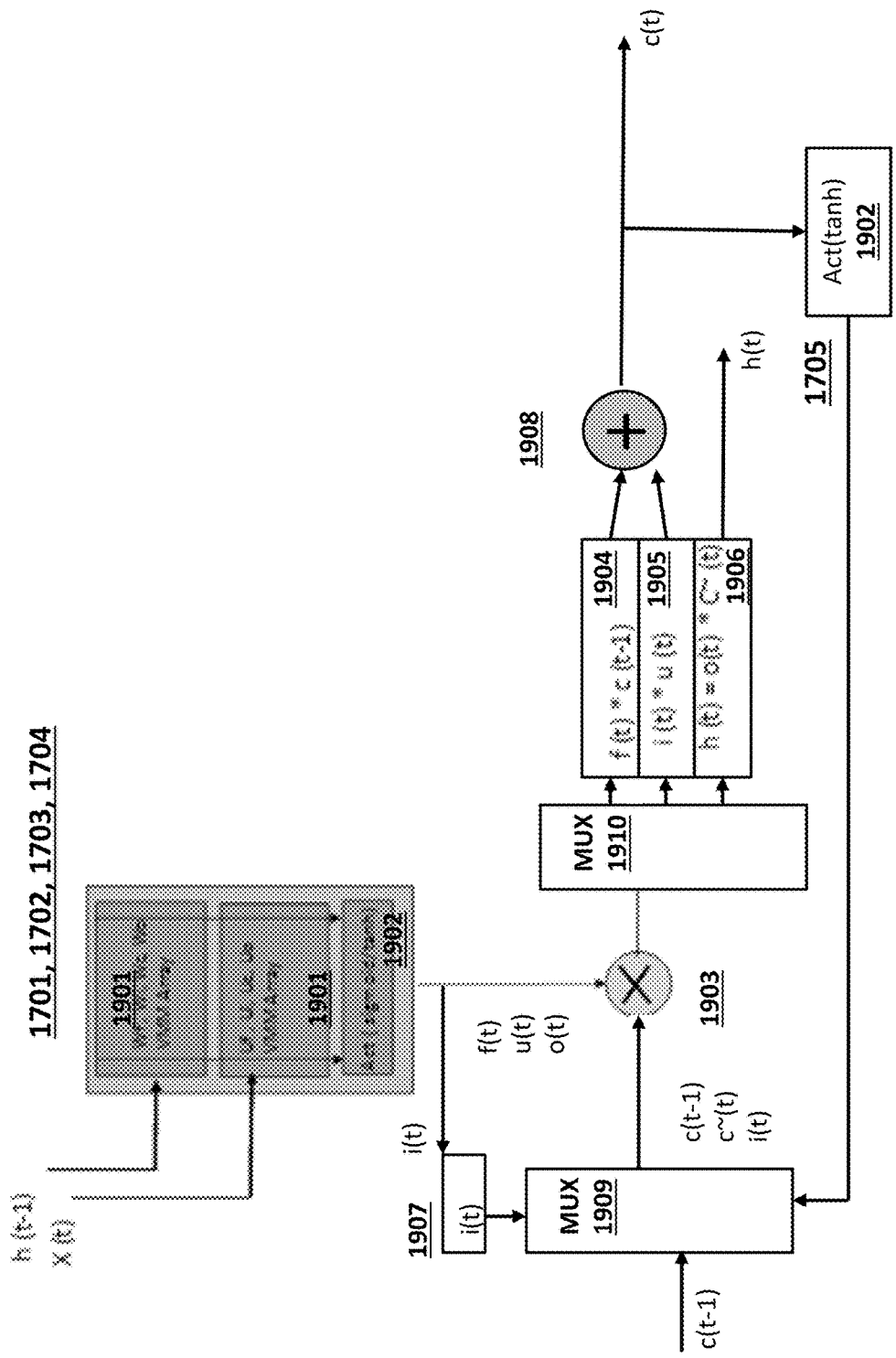
FIG. 19 depicts another embodiment of the exemplary cell of FIG. 17.

An alternative to LSTM cell 1800 (and another example of an implementation of LSTM cell 1700) is shown in FIG. 19. In FIG. 19, sigmoid function devices 1701, 1702, and 1703 and tanh device 1704 share the same physical hardware (VMM arrays 1901 and activation function block 1902) in a time-multiplexed fashion. LSTM cell 1900 also comprises multiplier device 1903 to multiply two vectors together, addition device 1908 to add two vectors together, tahh device 1705 (which comprises activation circuit block 1902), register 1907 to store the value i(t) when i(t) is output from sigmoid function block 1902, register 1904 to store the value f(t)*c(t−1) when that value is output from multiplier device 1903 through multiplexor 1910, register 1905 to store the value i(t)*u(t) when that value is output from multiplier device 1903 through multiplexor 1910, and register 1906 to store the value o(t)*c~(t) when that value is output from multiplier device 1903 through multiplexor 1910, and multiplexor 1909.

Whereas LSTM cell 1800 contains multiple sets of VMM arrays 1801 and respective activation function blocks 1802, LSTM cell 1900 contains only one set of VMM arrays 1901 and activation function block 1902, which are used to represent multiple layers in the embodiment of LSTM cell 1900. LSTM cell 1900 will require less space than LSTM 1800, as LSTM cell 1900 will require ¼ as much space for VMMs and activation function blocks compared to LSTM cell 1800.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 20:
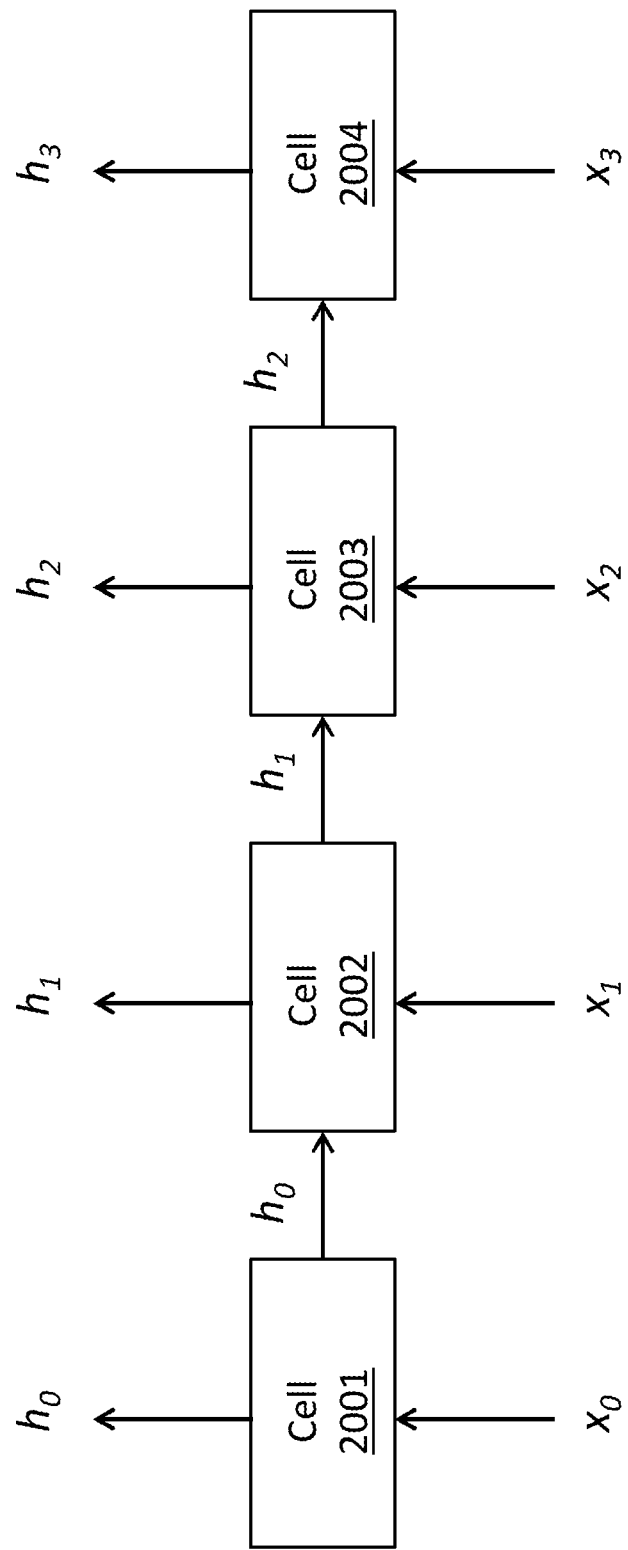
FIG. 20 depicts a prior art gated recurrent unit system.

FIG. 20 depicts an exemplary GRU 2000, GRU 2000 in this example comprises cells 2001, 2002, 2003, and 2004. Cell 2001 receives input vector $x_0$ and generates output vector $h_0$. Cell 2002 receives input vector $x_1$, the output vector ho from cell 2001 and generates output vector $h_1$. Cell 2003 receives input vector $x_2$ and the output vector (hidden state) $h_1$ from cell 2002 and generates output vector $h_2$. Cell 2004 receives input vector $x_3$ and the output vector (hidden state) $h_2$ from cell 2003 and generates output vector $h_3$. Additional cells can be used, and an GRU with four cells is merely an example.

Figure 21:
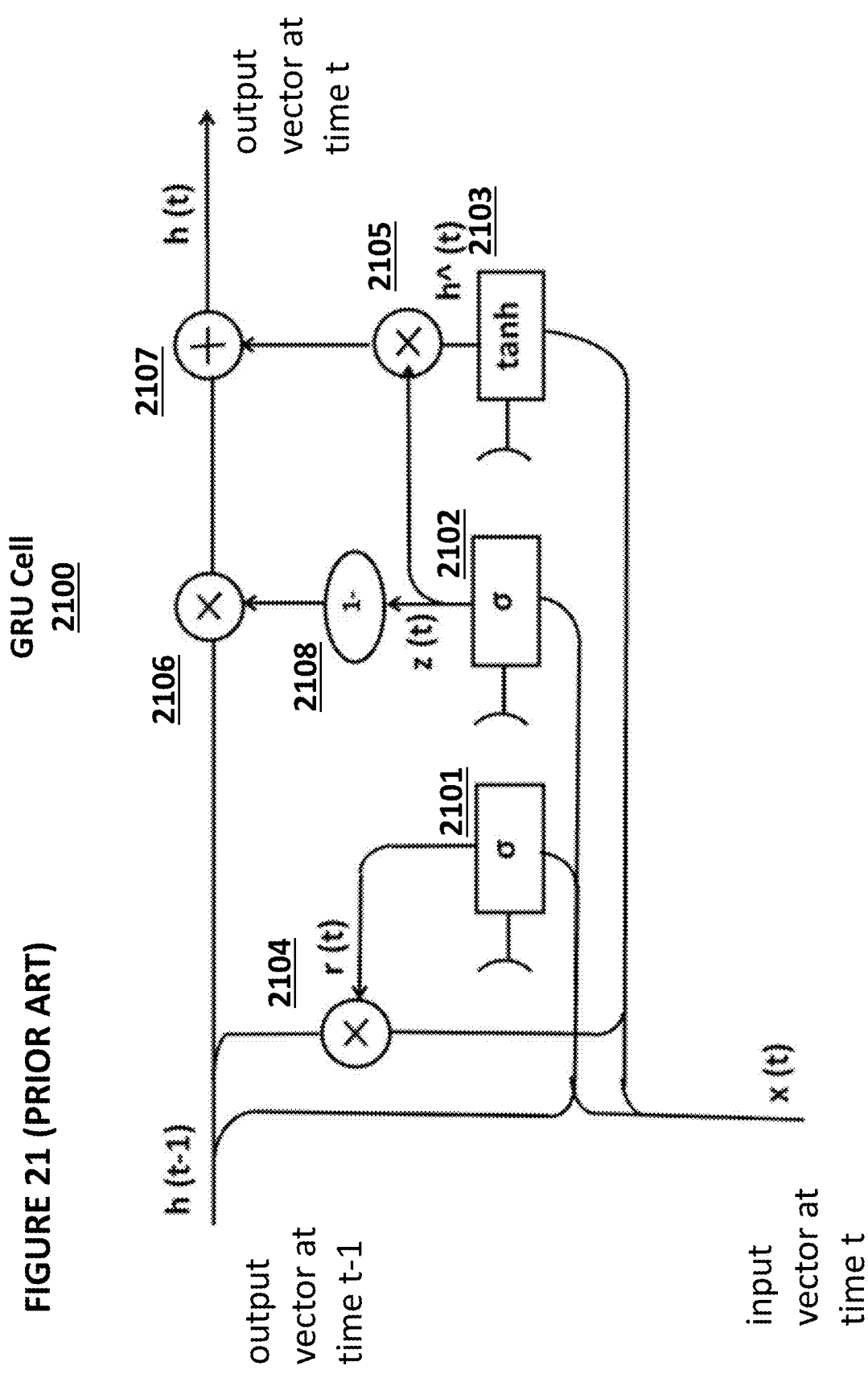
FIG. 21 depicts an exemplary cell for use in a gated recurrent unit system.

FIG. 21 depicts an exemplary implementation of a GRU cell 2100, which can be used for cells 2001, 2002, 2003, and 2004 of FIG. 20. GRU cell 2100 receives input vector x(t) and output vector h(t−1) from a preceding GRU cell and generates output vector h(t). GRU cell 2100 comprises sigmoid function devices 2101 and 2102, each of which applies a number between 0 and 1 to components from output vector h(t−1) and input vector x(t). GRU cell 2100 also comprises a ta h device 2103 to apply a hyperbolic tangent function to an input vector, a plurality of multiplier devices 2104, 2105, and 2106 to multiply two vectors together, an addition device 2107 to add two vectors together, and a complementary device 2108 to subtract an input from 1 to generate an output.

Figure 22:
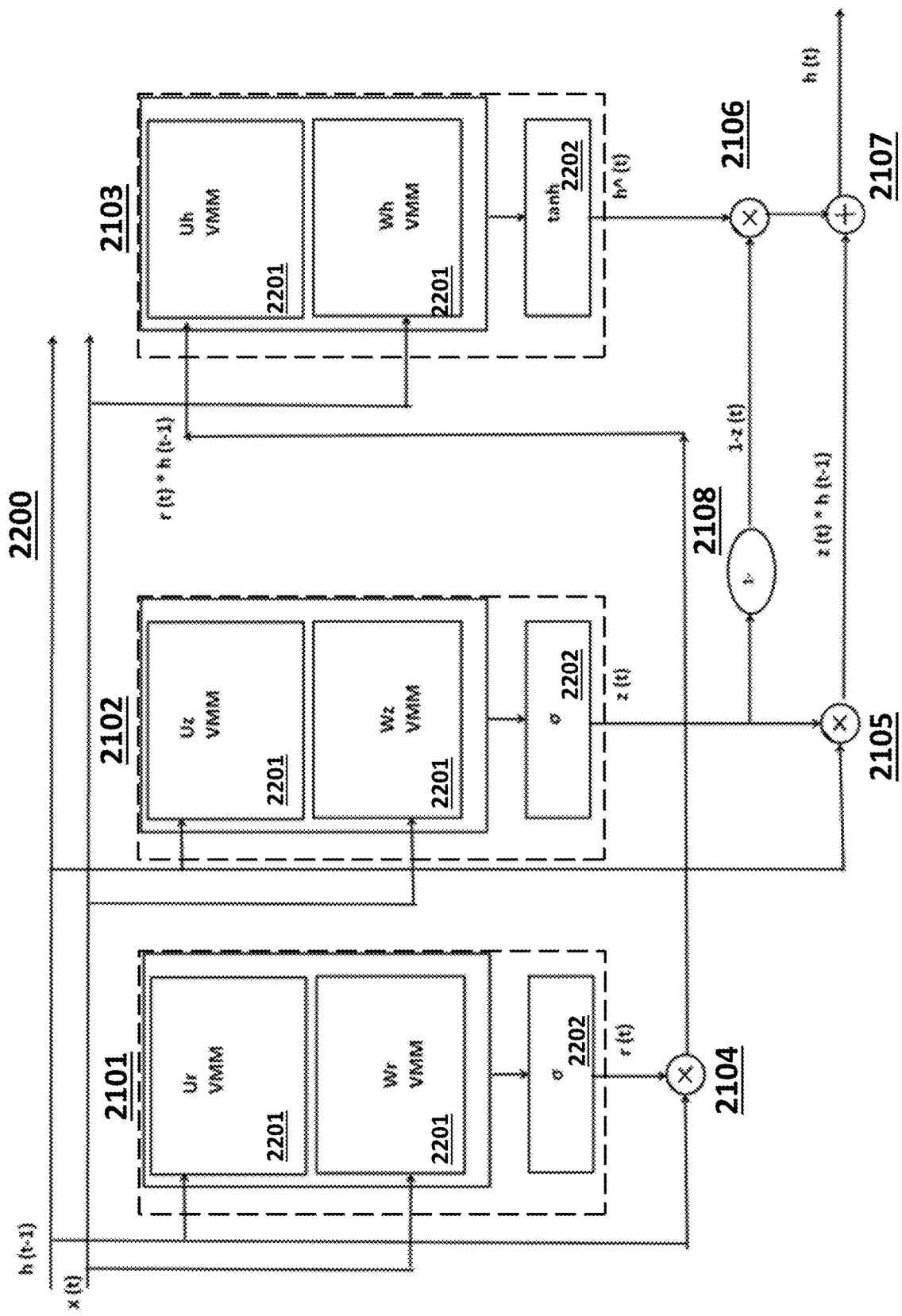
FIG. 22 depicts an embodiment of the exemplary cell of FIG. 21.

FIG. 22 depicts a GRU cell 2200, which is an example of an implementation of GRU cell 2100. For the reader's convenience, the same numbering from GRU cell 2100 is used in GRU cell 2200. As can be seen in FIG. 22, sigmoid function devices 2101 and 2102, and tanh device 2103 each comprise multiple VMM arrays 2201 and activation function blocks 2202. Thus, it can be seen that VMM arrays are of particular use in GRU cells used in certain neural network systems. The multiplier devices 2104, 2105, 2106, the addition device 2107, and the complementary device 2108 are implemented in a digital manner or in an analog manner. The activation function blocks 2202 can be implemented in a digital manner or in an analog manner.

Figure 23:
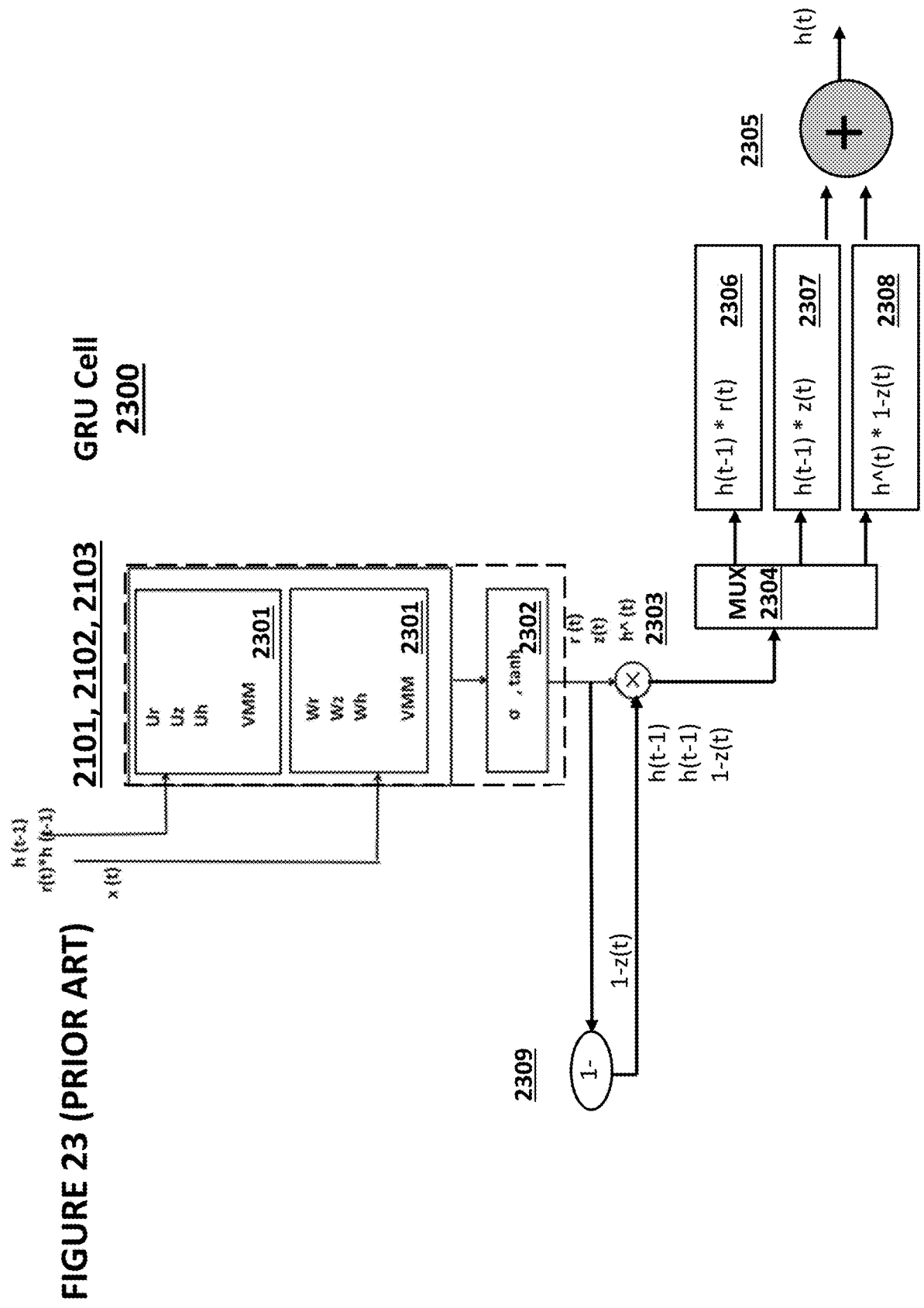
FIG. 23 depicts another embodiment of the exemplary cell of FIG. 21.

An alternative to GRU cell 2200 (and another example of an implementation of GRU cell 2300) is shown in FIG. 23. In FIG. 23, GRU cell 2300 utilizes VMM arrays 2301 and activation function block 2302, which when configured as a sigmoid function applies a number between 0 and 1 to control how much of each component in the input vector is allowed through to the output vector. In FIG. 23, sigmoid function devices 2101 and 2102 and tank device 2103 share the same physical hardware (VMM arrays 2301 and activation function block 2302) in a time-multiplexed fashion. GRU cell 2300 also comprises multiplier device 2303 to multiply two vectors together, addition device 2305 to add two vectors together, complementary device 2309 to subtract an input from 1 to generate an output, multiplexor 2304, register 2306 to hold the value h(t−1)*r(t) when that value is output from multiplier device 2303 through multiplexor 2304, register 2307 to hold the value h(t−1)*z(t) when that value is output from multiplier device 2303 through multiplexor 2304, and register 2308 to hold the value h^(t)*(1−z(t)) When that value is output from multiplier device 2303 through multiplexor 2304.

Whereas GRU cell 2200 contains multiple sets of VMM arrays 2201 and activation function blocks 2202, GRU cell 2300 contains only one set of VMM arrays 2301 and activation function block 2302 which are used to represent multiple layers in the embodiment of GRU cell 2300. GRU cell 2300 will require less space than GRIT cell 2200, as GRU cell 2300 will require ⅓ as much space for VMMs and activation function blocks compared to GRU cell 2200.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

High Voltage Generation Circuits and Other Circuits

Figure 34:
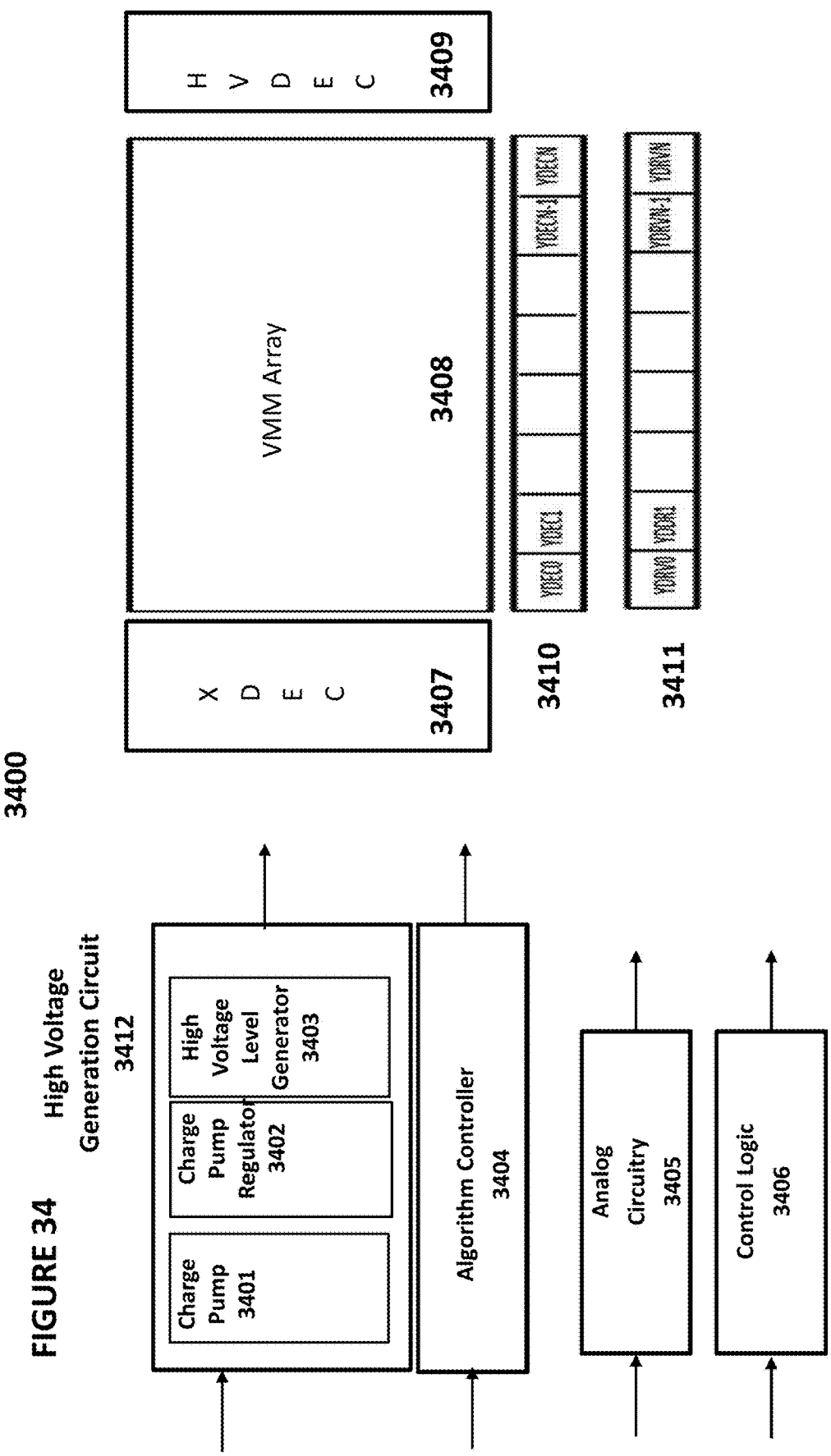
FIG. 34 depicts a high voltage generation block for used with a vector multiplier matrix system.

FIG. 34 depicts a block diagram of VMM system 3400. VMM system 3400 comprises VMM array 3408, row decoders 3407, high voltage decoders 3409, column decoders 3410, and bit line drivers 3411. VMM system 3400 further comprises high voltage generation block 3412, which comprises charge pump 3401, charge pump regulator 3402, and high voltage level generator 3403. VMM system 3400 further comprises algorithm controller 3404, analog circuitry 3405, and control logic 3406.

Figure 35:
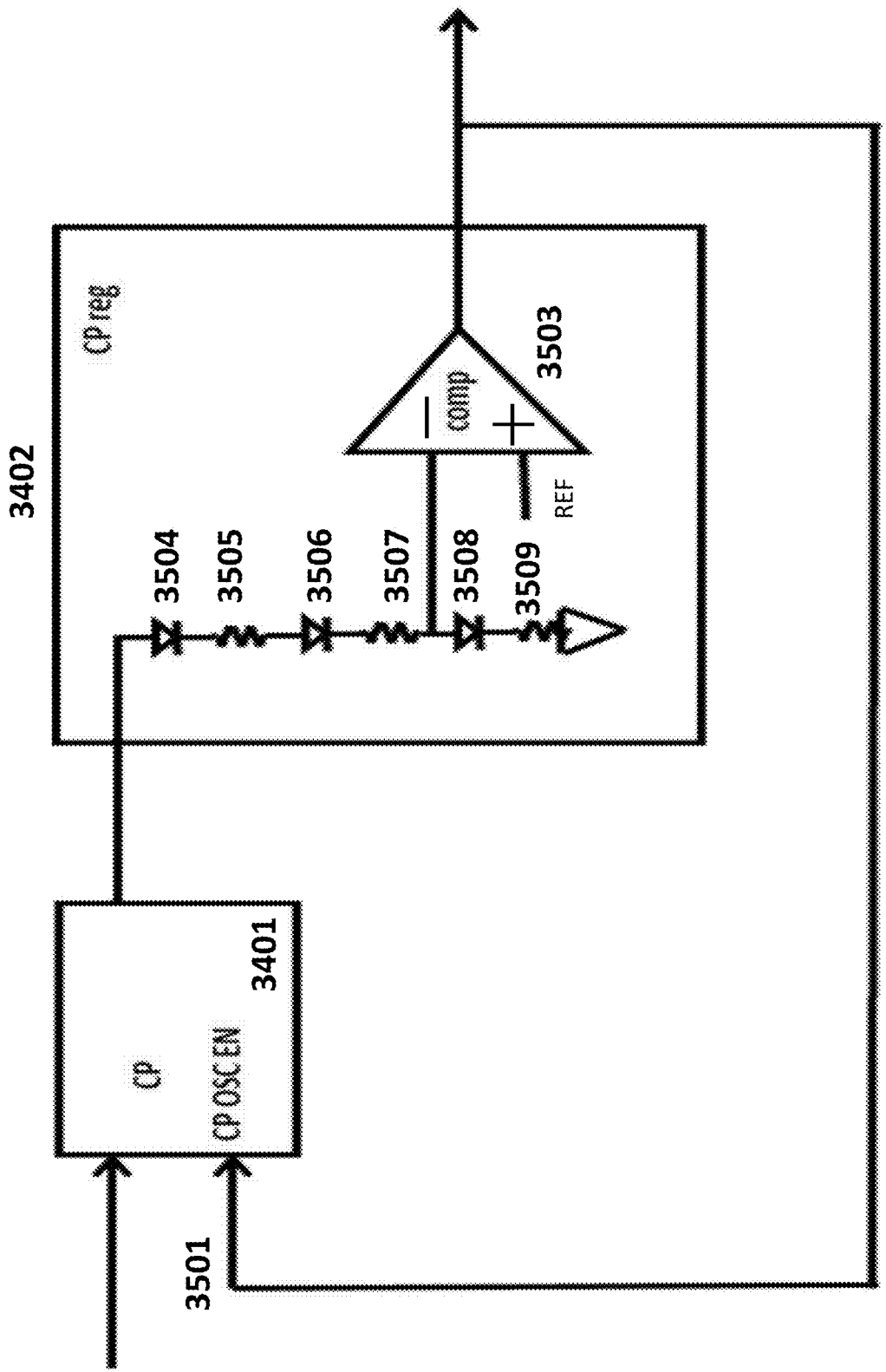
FIG. 35 depicts a charge pump and charge pump regulation circuit.
Figure 36:
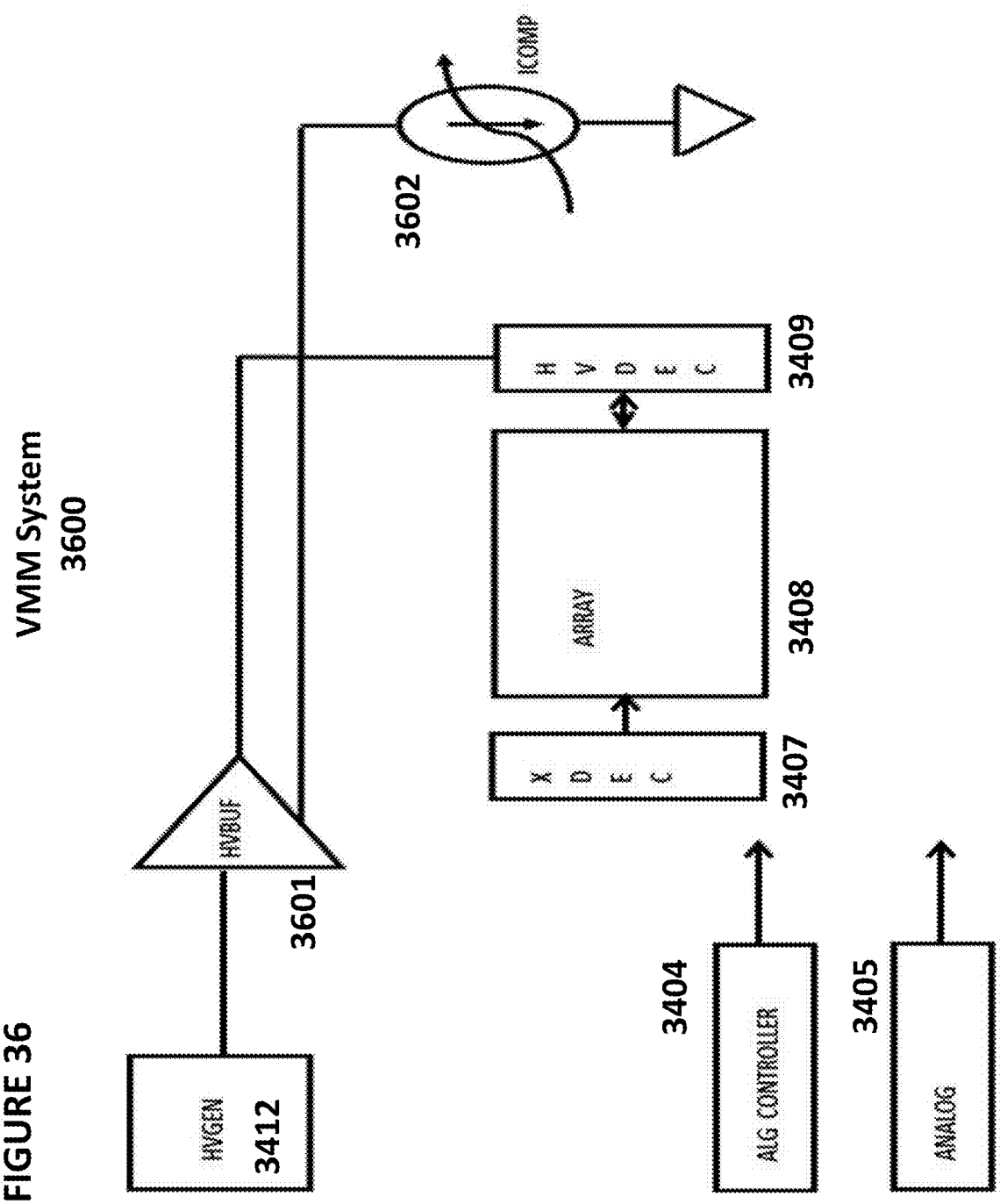
FIG. 36 depicts a high voltage generation block with a current compensation circuit.

FIG. 35 provides further detail regarding charge pump 3401 and charge pump regulator 3402. Charge pump 3401 is controlled by enable signal 3501. When enable signal 3501 is not asserted, charge pump 3401 continues increasing the voltage of its output. When enable signal 3501 is asserted, charge pump 3401 maintains the voltage level of its output. Charge pump regulator 3402 comprises a voltage divider structure which includes a series connection of diodes 3504, 3506, and 3508 and resistors 3505, 3507, and 3509, each coupled to the cathode of a respective one of diodes 3504, 3506, and 3508. A divided voltage node within that structure is input to comparator 3503, which receives another input comprising a voltage reference. When the voltage output from charge pump 3401 is sufficient to activate diodes 3504, 3506, and 3508 so that current will flow, and the voltage from the divided voltage node exceeds the voltage reference, the enable signal will be asserted. Thus, charge pump regulator 3402 controls charge pump 3401 until the desired voltage level is achieved, which is based on the characteristics of diodes 3504, 3506, and 3508 and resistors 3505, 3507, and 3509. Three diodes and three resistors are shown as example for the voltage divider structure, typically more than three are needed. Alternatively capacitors instead of diodes and resistors can be implemented to create desired voltage ratio to provide input to the comparator 3503. Alternatively appropriate ratioed capacitors can be connected in parallel with diodes and resistors to speed up the response of the voltage divider structure, FIG. 36 depicts VMM system 3600, which is an embodiment of VMM system 3400. VMM system 3600 comprises high voltage buffer 3601 and adjustable current sink 3602. High voltage generation block 3412 generates a voltage that is provided to high voltage buffer 3601, which in turn provides that voltage to high voltage decoder 3409 and adjustable current sink (program compensation current Icomp) 3602. The current Icomp drawn by adjustable current sink 3602 from high voltage buffer 3601 can be adjusted to, for example, induce a compensated voltage drop within high voltage buffer 3601 to compensate for the number of memory cells to be programmed (e.g., dVout1/2/ . . . /32 drop for 1/2/. . . /32 IOs to be programmed) and to reduce the temperature of high voltage buffer 3601. For example, Icomp=(# memory cells to be programmed)*Iprog*M, where Iprog=cell programming current, and M=multiplier factor due to memory cell hot carrier effect during a programming operation. The compensation Icomp is applied to maintain a constant high voltage output over varying output load.

Figure 37:
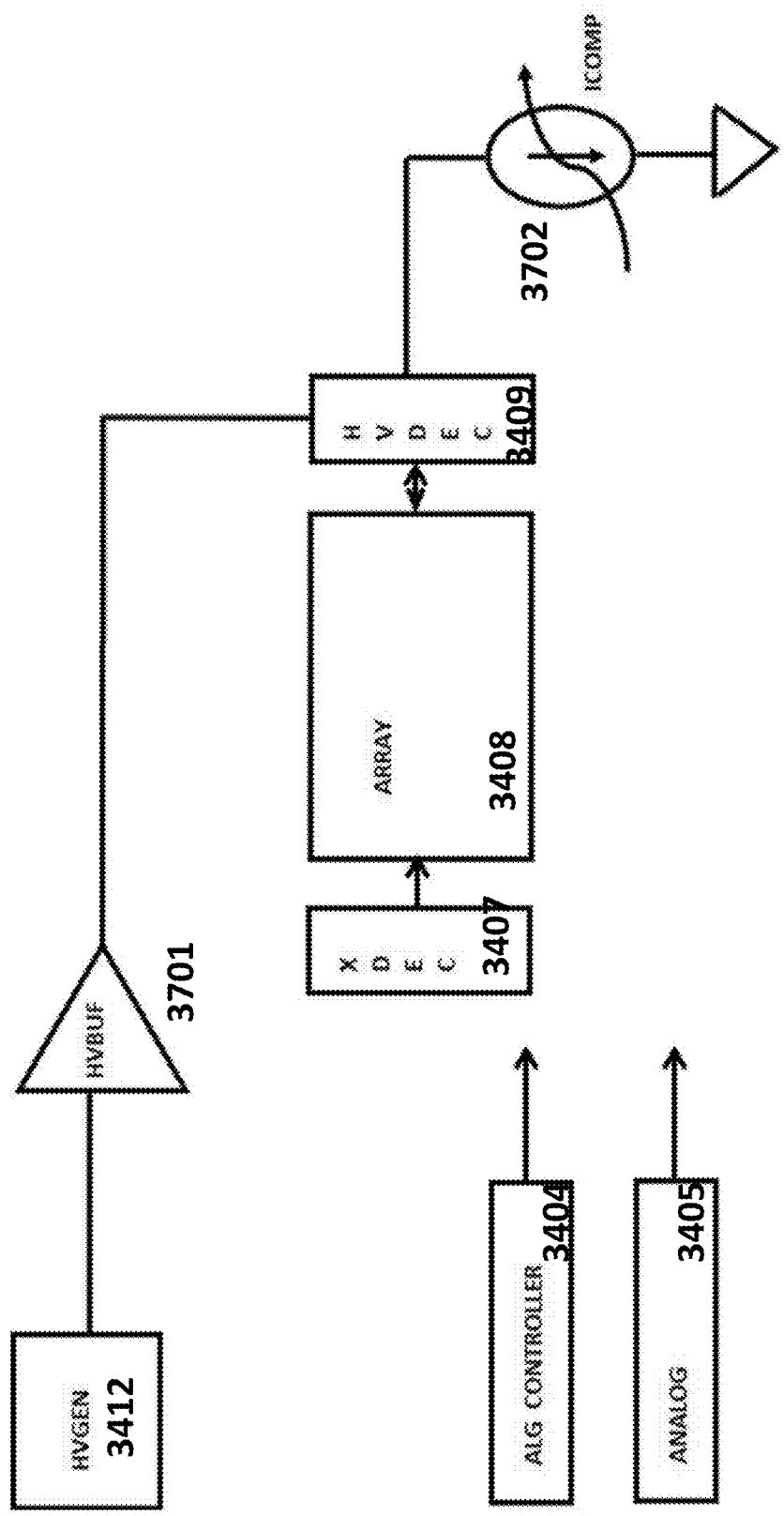
FIG. 37 depicts another high voltage generation block with a current compensation circuit.

FIG. 37 depicts an embodiment of VMM system 3700 used with high voltage buffer 3701 and adjustable current sink 3702. High voltage generator 3412 generates a voltage that is provided to high voltage buffer 3701, which in turn provides that voltage to high voltage decoder 3409. The current drawn by adjustable current sink (compensation current) Icomp 3702 from high voltage decoder 3409 can be adjusted to, for example, reduce the current drop (as a function of number of memory cells to be programmed) within high voltage decoder 3409 and/or to reduce the temperature of high voltage decoder 3409. For example Icomp=(# memory cells to be programmed)*Iprog*M. Iprog=cell programming current, M=multiplier factor due to memory cell hot carrier effect during a programming operation. The compensation Icomp is applied to maintain a constant high voltage output over varying output load.

Figure 38:
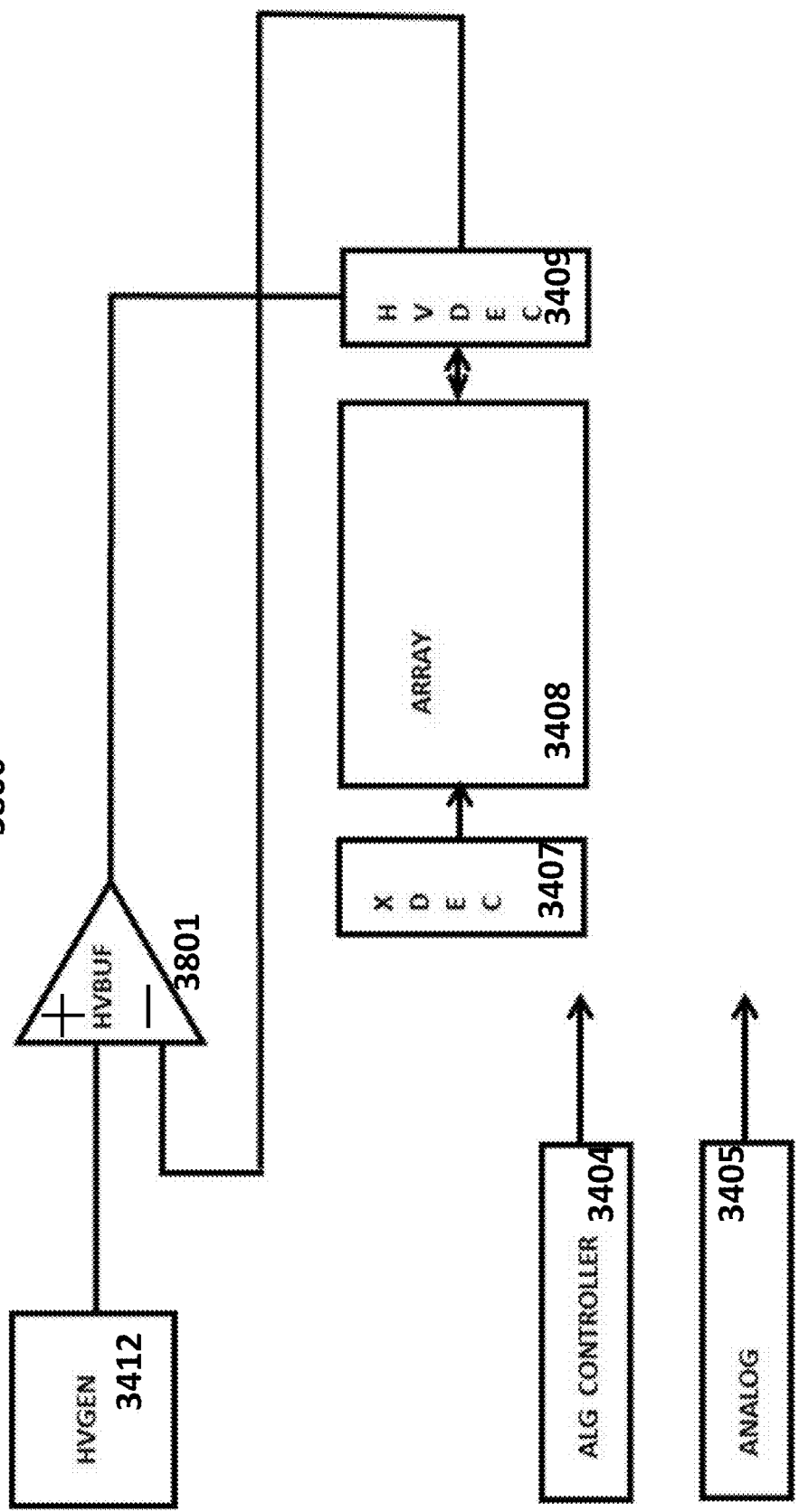
FIG. 38 depicts another high voltage generation block.

FIG. 38 depicts VMM system 3800 used with high voltage buffer 3801, which here is an operational amplifier. High voltage generator 3412 generates a voltage that is provided to high voltage buffer 3801, which in turn provides that voltage to high voltage decoder 3409. An output from high voltage decoder 3409 (e.g., the output is a feedback indicator of HV voltage in the decoder) is provided as an input to high voltage buffer 3801, which then operates as a closed loop operational amplifier. The closed loop compensation is applied to maintain a constant high voltage output over varying output load.

Figure 39:
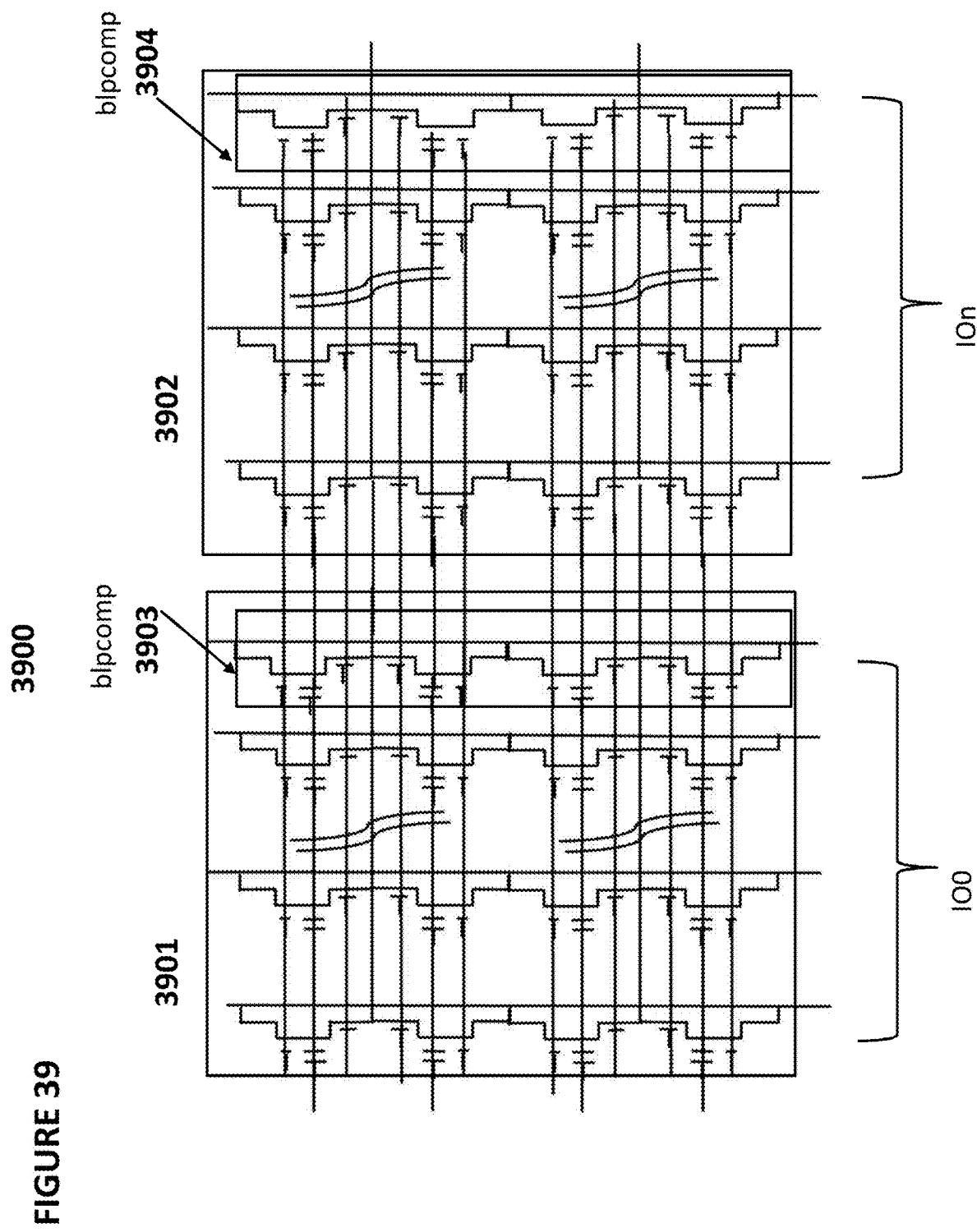
FIG. 39 depicts dummy bit lines for providing current compensation.

FIG. 39 depicts program current compensation block 3900 to be used in conjunction with VMM systems 2400, 2600, 2700, or 2800, for example, as an addition to the VMM array in each VMM system. Here, a dummy program bit line (programmable dummy array) is provided with each group of 32 bit lines. For example, group 3901 includes dummy bit line 3903, and group 3902 includes dummy bit line 3904. These dummy bitlines 3903 and 3904 can be turned on (to provide bitline programming current) in instances where one or more other bits in groups 3901 and 3902, respectively, are not being programmed. This will keep the current drawn during a programming operation more constant than would be the case without the use of dummy bit lines 3903 and 3904. The program dummy array compensation scheme is applied to maintain a constant high voltage output over varying output load.

Figure 40:
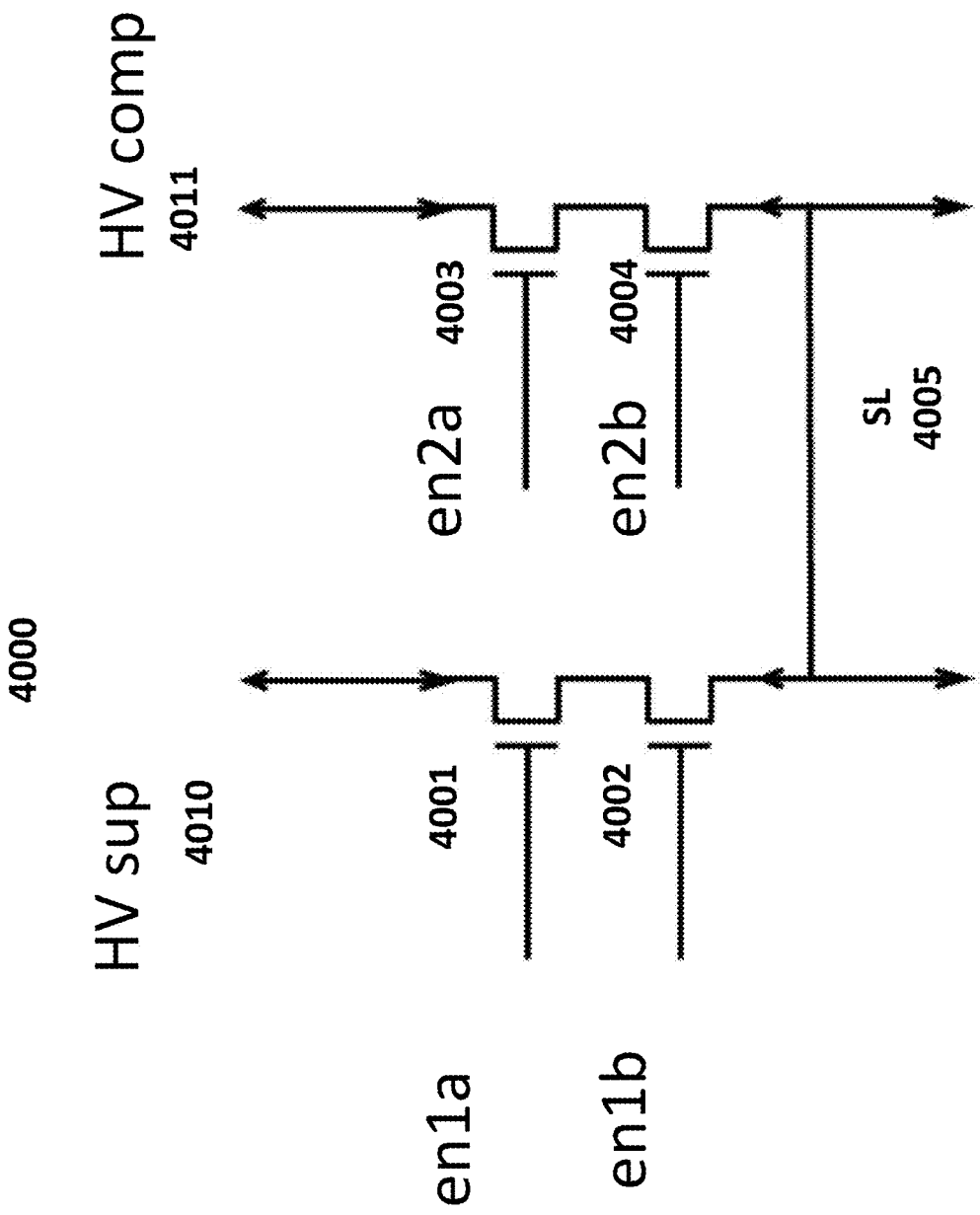
FIG. 40 depicts a high voltage decoder.

FIG. 40 depicts an example of a high voltage decoder block 4000 that can be used to implement high voltage decoder 3409. Here, source line 4005 is coupled to one or two rows in VMM array 3408. NMOS transistors 4001, 4002, 4003, and 4004 are coupled to source line 4005 as shown. HV supply 4010 is provided from a HV buffer, such as HV buffer 3601, 3701 or 3801 and HV comp signal 4011 is such as shown in FIG. 38.

Figure 41:
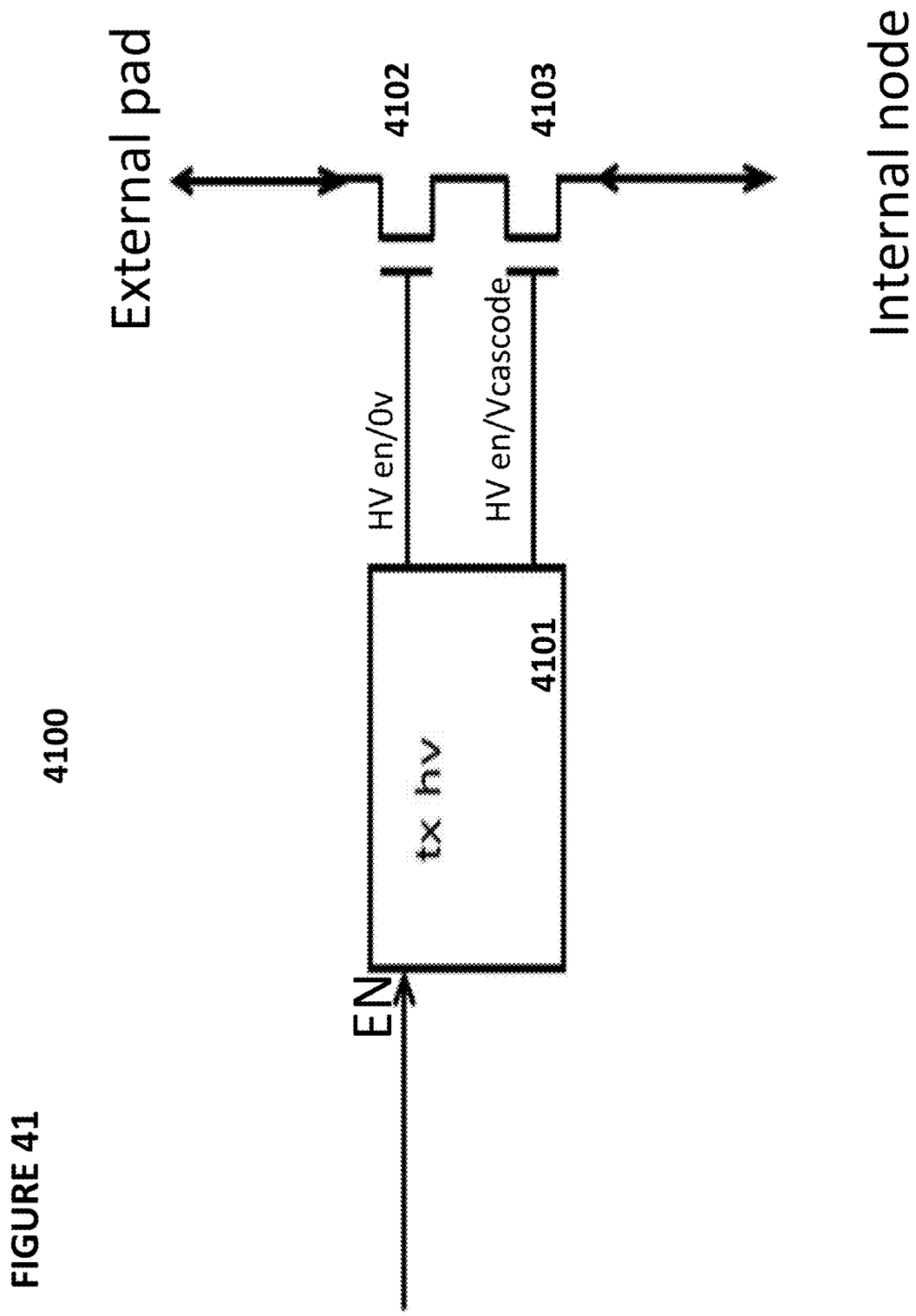
FIG. 41 depicts a high voltage test circuit.

FIG. 41 depicts test circuit 4100. Test circuit 4100 comprises high voltage transmitter 4101, which receives an enable signal EN. High voltage transmitter provides a high voltage enable signal to NMOS transistor 4102 and to NMOS cascode transistor 4103. One terminal of NMOS transistor 4102 connects to an external test pad, and one terminal of NMOS transistor 4103 is coupled to an internal node within VMM system 3400. This circuit can be used, for example, during a voltage calibration process.

Figure 42:
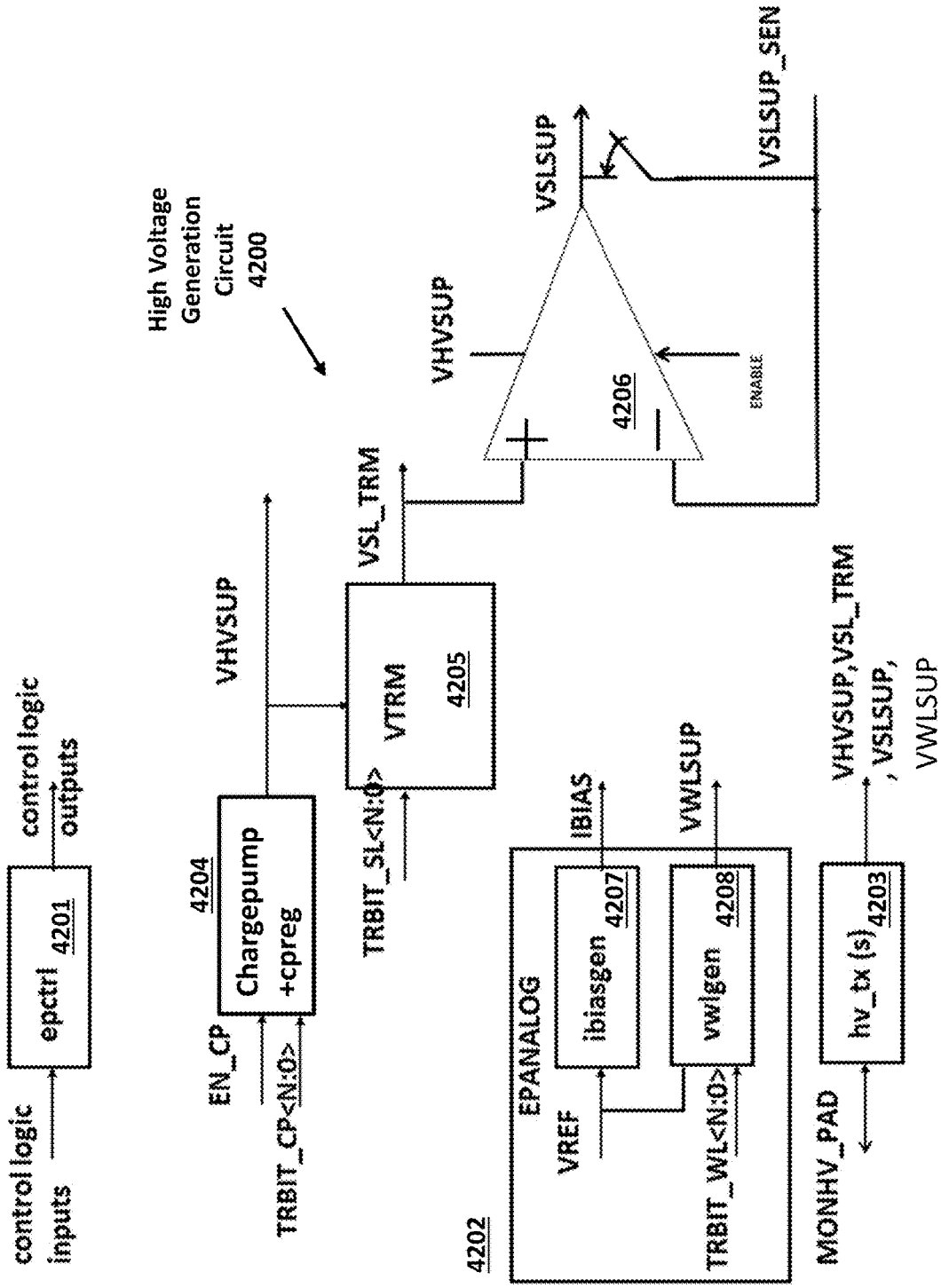
FIG. 42 depicts a high voltage generation block.

FIG. 42 depicts an embodiment of high voltage generation block 3412, which here comprises high voltage generation circuit 4200, control logic block 4201, analog circuit block 4202, and test block 4203. High voltage generation circuit 4200 comprises charge pump and regulator 4204, high voltage incrementor 4205, and high voltage operational amplifier 4206. The voltage of the output of high voltage incrementor 4205 can be controlled based on the trim signals sent to transistors in the high voltage incrementor 4205, as will be explained further below. Control logic block 4201 receives control logic inputs and generates control logic outputs. Analog circuit block 4202 comprises current bias generator 4207 for receiving a reference voltage, Vref, and generating a current that can be used to apply a bias signal, iBias, as used elsewhere. Analog circuit block 4202 also comprises voltage generator 4208 for receiving a set of trim bits, TRBIT_WL, and generating a voltage to apply to word lines during various operations. Test block 4203 receives signals on a test pad, MONHV_PAD, and outputs various signals to monitor during testing.

Figure 43:
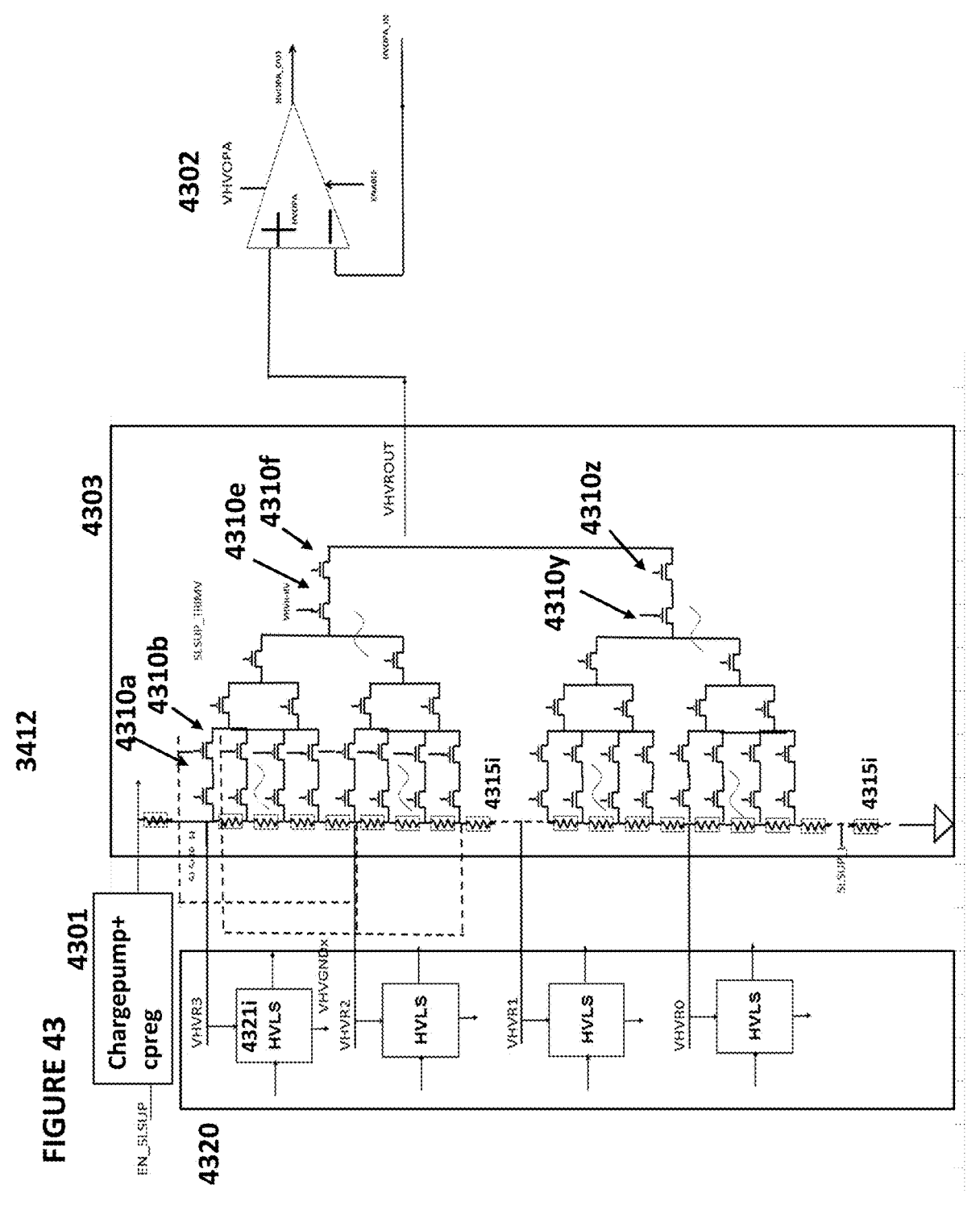

FIG. 43 depicts another embodiment of high voltage generation block 3412. Here, high voltage generation block comprises charge pump and regulator 4301, high voltage (HV) incrementor 4303, and high voltage operational amplifier 4302. The voltage of the output of high voltage incrementor 4303 can be controlled based on the signals sent to the gates of the transistors in the high voltage incrementor 4303. The HV incrementor 4303 comprises of resistor strings 4315*i* connected in series from ground to the output of the charge pump 4301. A network of switches 4310*a*, 4310*b*, . . . , 4310*z* are used to mux out the voltage level along the string in an incremental fashion. The gates of the transistors are enabled/disabled by high voltage level shifters (HVLS) 4320, which in turn are enabled/disabled by digital control inputs. The HVLS 4320 is used to convert the digital voltage level, e.g., 1V, into high voltage level, e.g., 12V. For example the resistor string 4315$i$ is to provide voltage levels from 3V to 10V with voltage increment of 10 mV (voltage across one resistor). The output VHVROUT of the resistor string hence will have value from 3V to 10V with 10 mV increment. The HV operational amplifier 4302 is used to buffer this VHVROUT increment voltage. Due to the HV voltage needed at the highest voltage, e.g., 10V, the PMOS switches at, or close to, this value will see leakage associated with close to breakdown (BV) condition. This impacts the accuracy of the small increment voltage, e.g. 10 mV. Hence improvements are needed to overcome this BV leakage. First the supply for the HVLS circuit is tapped according to the location of the PMOS switches. For example for the PMOS switches at 4-6V string location, the high supply for HVLS is 6V (instead of the more typical 12V supply). Further, the low supply can be 4V (instead of the more typical value of ground. This would reduce the voltage stress across the PMOS switches at this resistor string location. For the PMOS switches connected to the VHVROUT, two in series with adaptive HV biases are needed to disable the respective mux path to avoid BV stress, for example PMOS 4310$e$/ 4310$f$ and 4310$y$/4310$z$ are shown. The PMOS 4310$f$ and 4310$z$ are used for mux path disabling. For example the gates of the PMOS 4310$f$ and 4310$z$ are at high voltage, e.g., 10V to disable 10V mux path. In the off condition, the gate of PMOS 4310$e$ is preferably at ~6V for cascoding to reduce BV leakage and the gate of PMOS 4310$f$ is at 10V. In the on condition, the gate of PMOS 4310$f$ can be at ~6V and the gate of PMOS 4310$f$ can be at <6V to pass 8V-10V (as example) mux path from the respective string to the VHVROUT. In the off condition, the gate of PMOS 4310$y$ is at ~6V for cascoding to reduce BV leakage and the gate of PMOS 4310$z$ is at 10V. In the on condition, the gate of PMOS 4310$y$ can be at 0V and the gate of PMOS 4310$z$ can be at 0V to pass 3V-5V (as example) mux path from the string to the VHVROUT.

Figure 44:
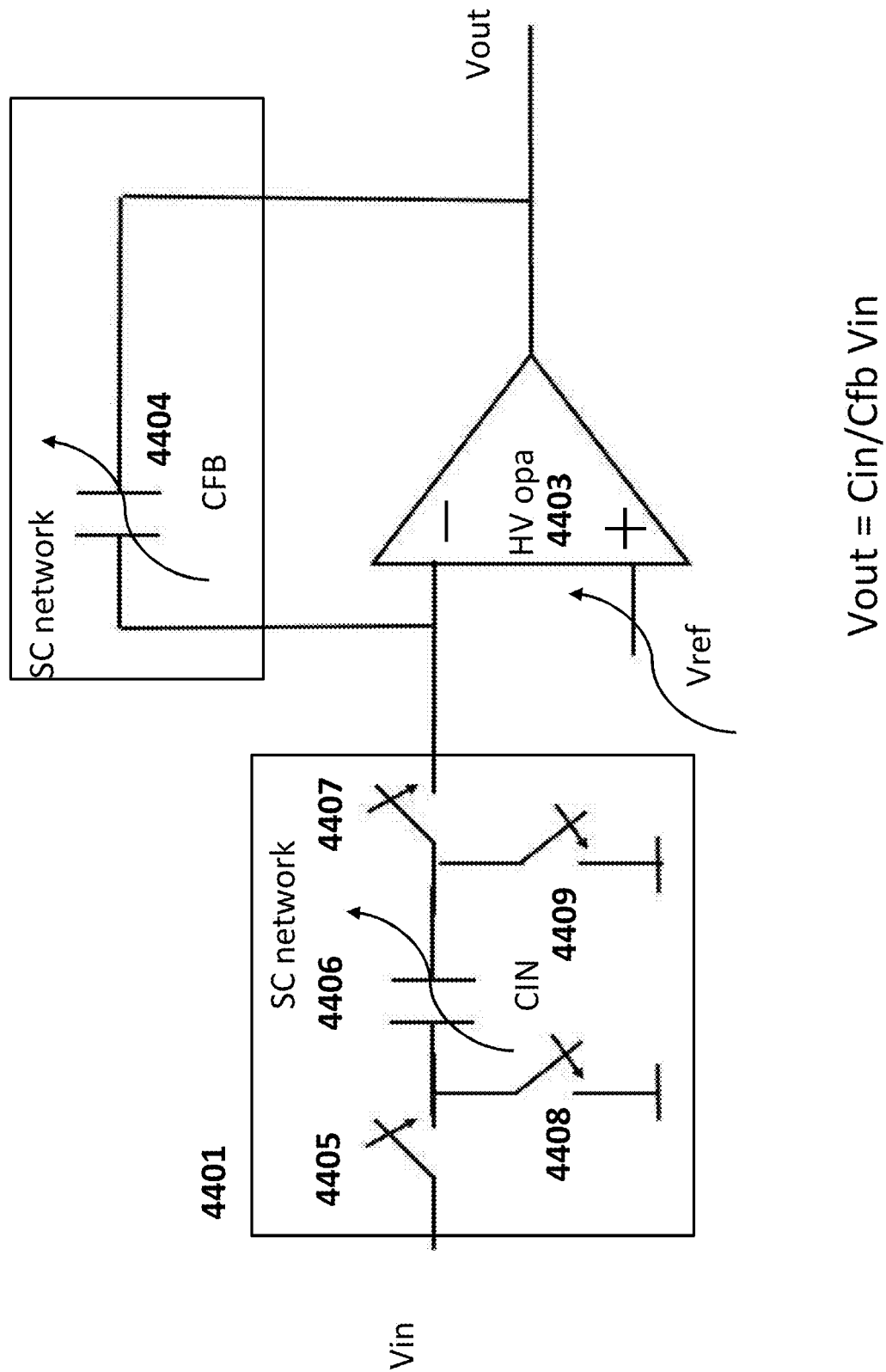
FIG. 44 depicts another high voltage generation block.

FIG. 44 depicts another embodiment of high voltage generation block 3412. High voltage generation block 3412 comprises high voltage operational amplifier 4403, SC (switch cap) network 4402, and SC network 4401. SC network 4402 comprises adjustable capacitor 4404. SC network 4401 comprises switches 4405, 4407, 4408, and 4409 and adjustable capacitor 4406. High Voltage Level Shifter (HVLS) circuits operating at an HV level, e.g., 10-13V, would be needed to adjust the capacitor 4404 for the SC network 4402. IO voltage (e.g., 1.8V, 2.5V) or core voltage (e.g., 1.2V) switching circuits are needed for the SC network 4401.

Figure 45:
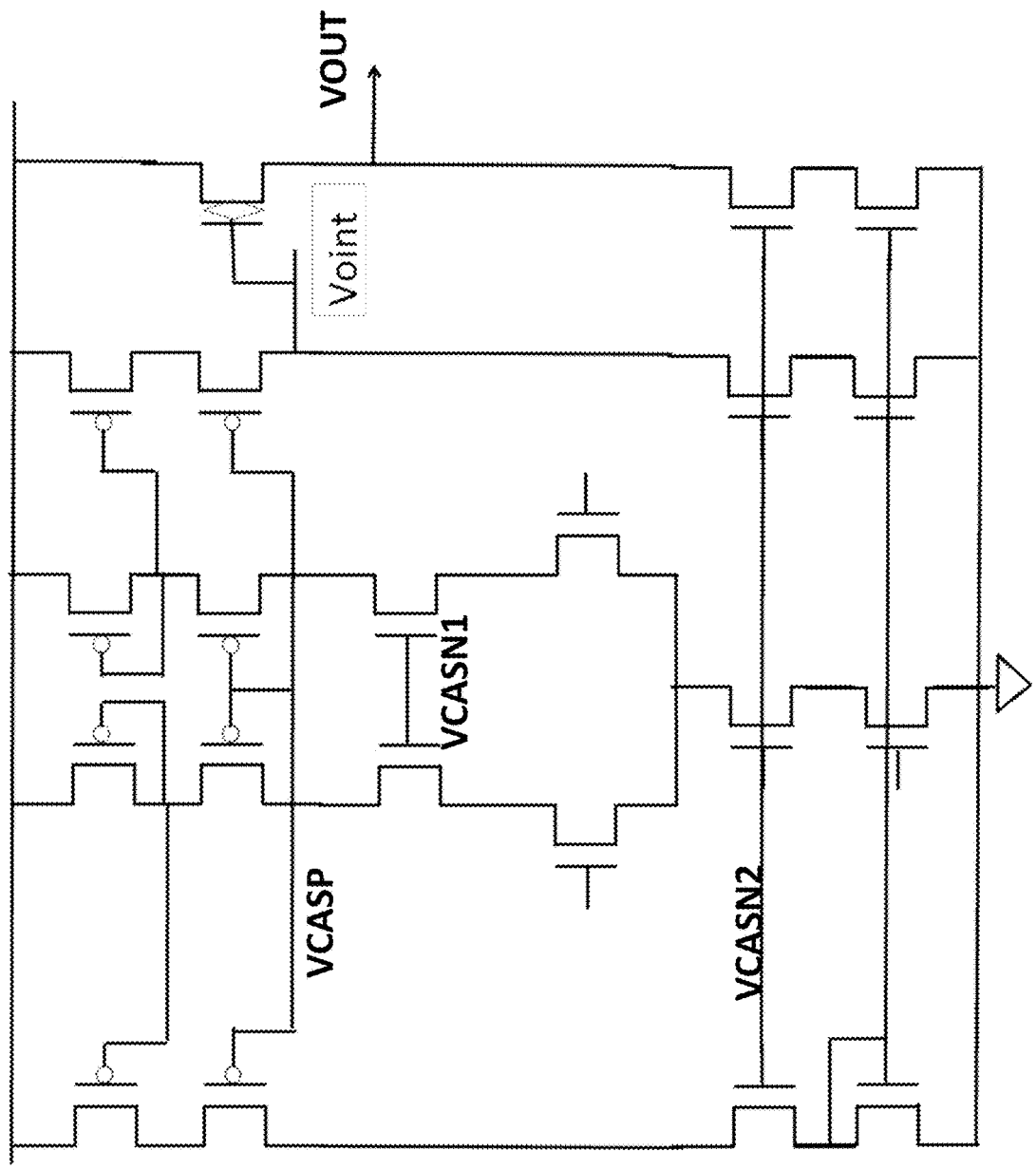
FIG. 45 depicts a high voltage operational amplifier.

FIG. 45 depicts high voltage operational amplifier 4500, which can be used for high voltage operational amplifier 4403 in FIG. 44. High voltage operational amplifier 4500 comprises the components shown in the arrangement shown. The HV cascode bias nodes VCASP, VCASN1, and VCASN2 are implemented in an adaptive fashion such that the voltage values depend on the output voltage VOUT to minimize the maximum stress voltage drop across the transistors. For example, when the node voltage VOUT is high, the VCASN2 is high and VCASN1 is low.

Figure 46:
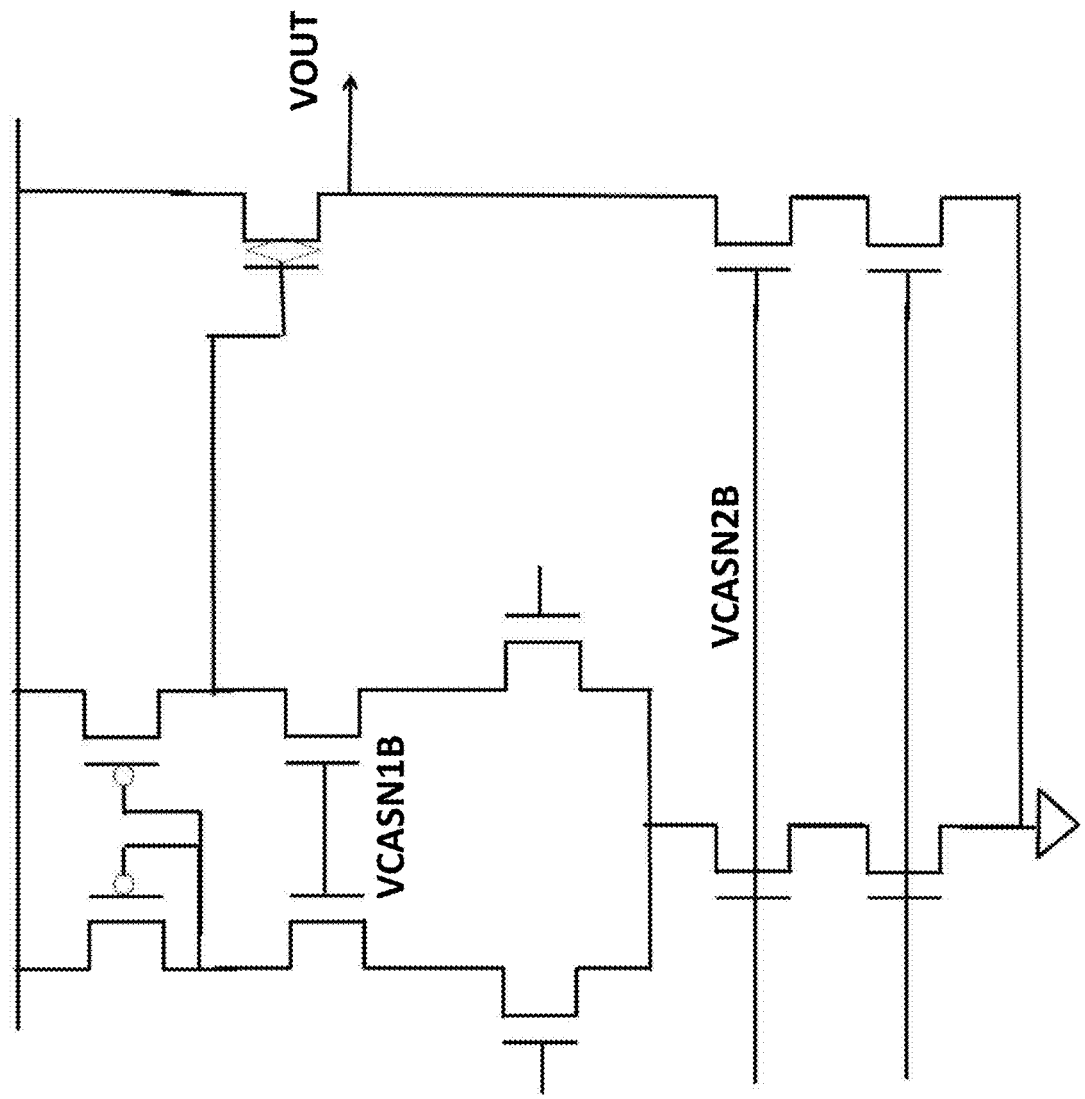
FIG. 46 depicts another high voltage operational amplifier.

FIG. 46 depicts high voltage operational amplifier 4600, which can be used for high voltage operational amplifier 4403 in FIG. 44. High voltage operational amplifier 4600 comprises the components shown in the arrangement shown. The HV cascode bias nodes VCASN2A, and VCASN2B are implemented such that the voltage values depend on the output voltage VOUT to minimize the maximum voltage drop across the transistors. For example, when the node voltage VOUT is high, the VCASN1B and VCAS2B are high.

Figure 47:
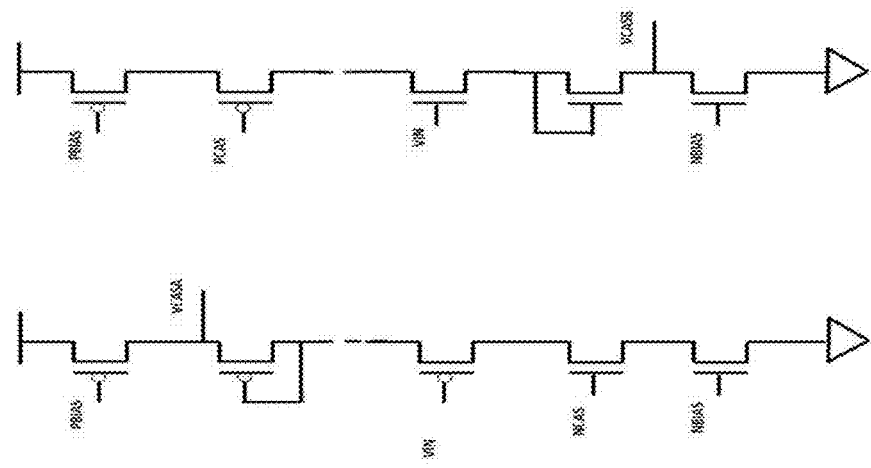
FIG. 47 depicts an adaptive high voltage supply.

FIG. 47 depicts adaptive high voltage supply 4700, which can be used to provide the adaptive high voltage cascode biases for high voltage operational amplifier 4403 in FIG. 44. Adaptive high voltage supply 4700 comprises the components shown in the arrangement shown.

Figure 48:
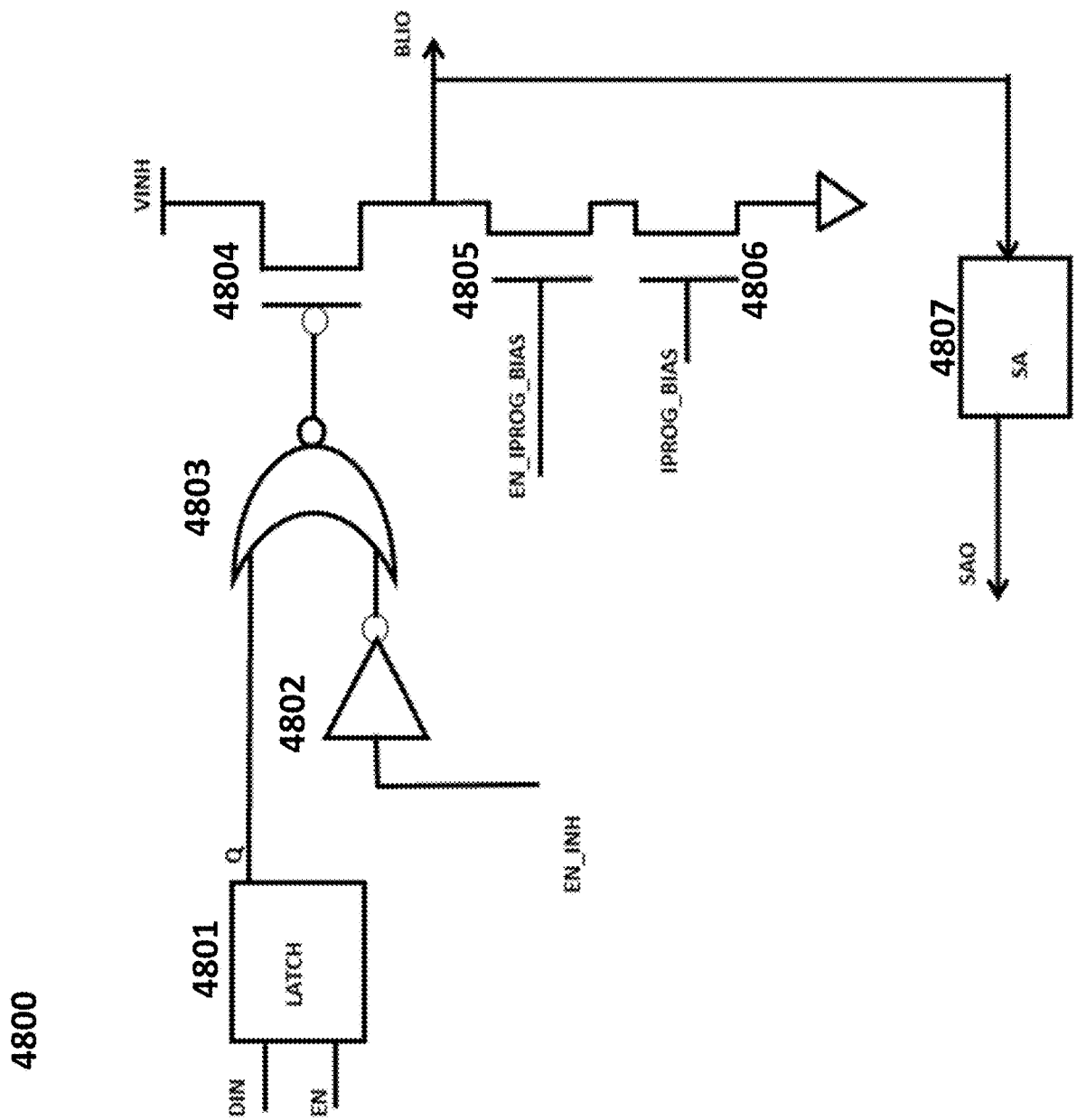
FIG. 48 depicts a column driver.

FIG. 48 depicts column driver 4800, which can be used for each of the bit line drivers 3411. Column driver 4800 comprises latch 4801, inverter 4802, NOR gate 4803, PMOS transistor 4804, NMOS transistors 4805 and 4806 and sense amplifier 4807, in the configuration shown. As shown VCASA level is tracking VIN at a higher level, namely=~VIN+2*VT_PMOS. VCASB level is tracking VIN at a lower level namely=~VIN−V*VT_NMOS. Other value is possible with different MOS transistors and different I*R voltage drop (such as inserting resistance R into the current path).

Figure 49:
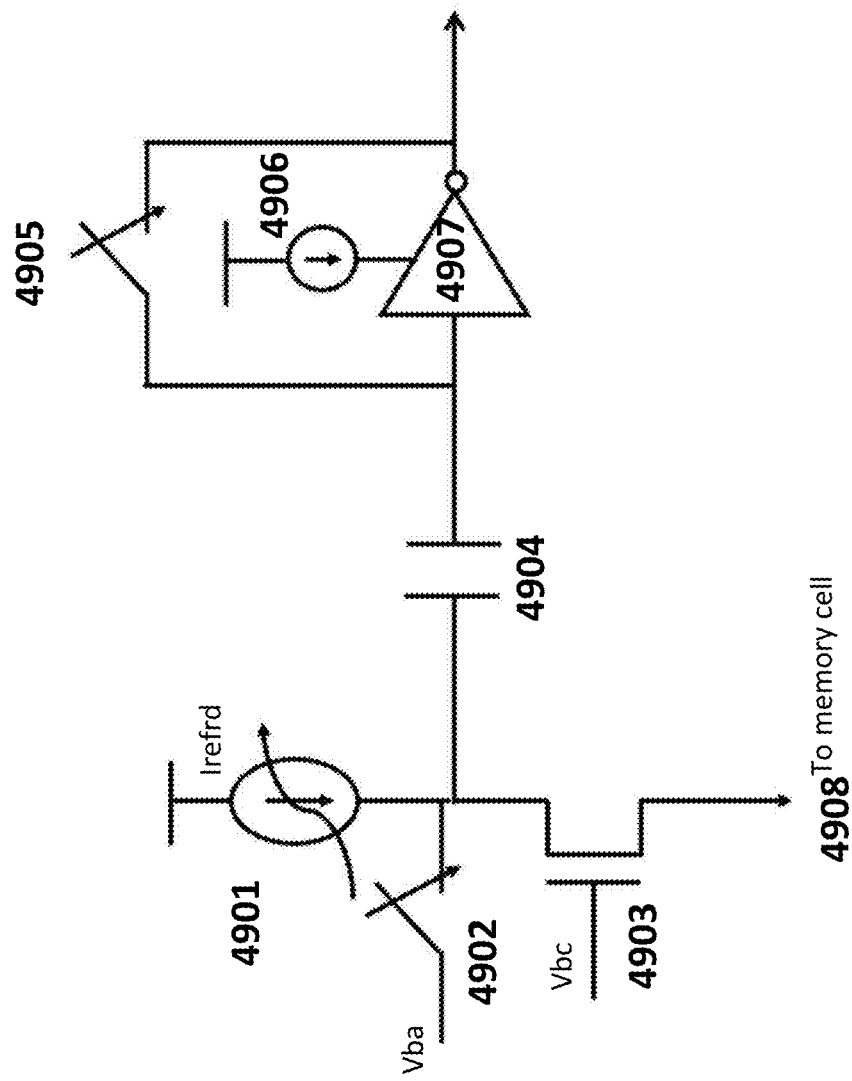
FIG. 49 depicts a column sense amplifier.

FIG. 49 depicts sense amplifier 4900, which can be used for sense amplifier 4807 in FIG. 48. Sense amplifier 4900 comprises adjustable current reference source 4901, switch 4902, NMOS transistor 4903, capacitor 4904, switch 4905, current source 4906, and inverter 4907, in the configuration shown. Sense amplifier 4907 is coupled to memory cell 4908 in VMM array 3408.

Figure 50:
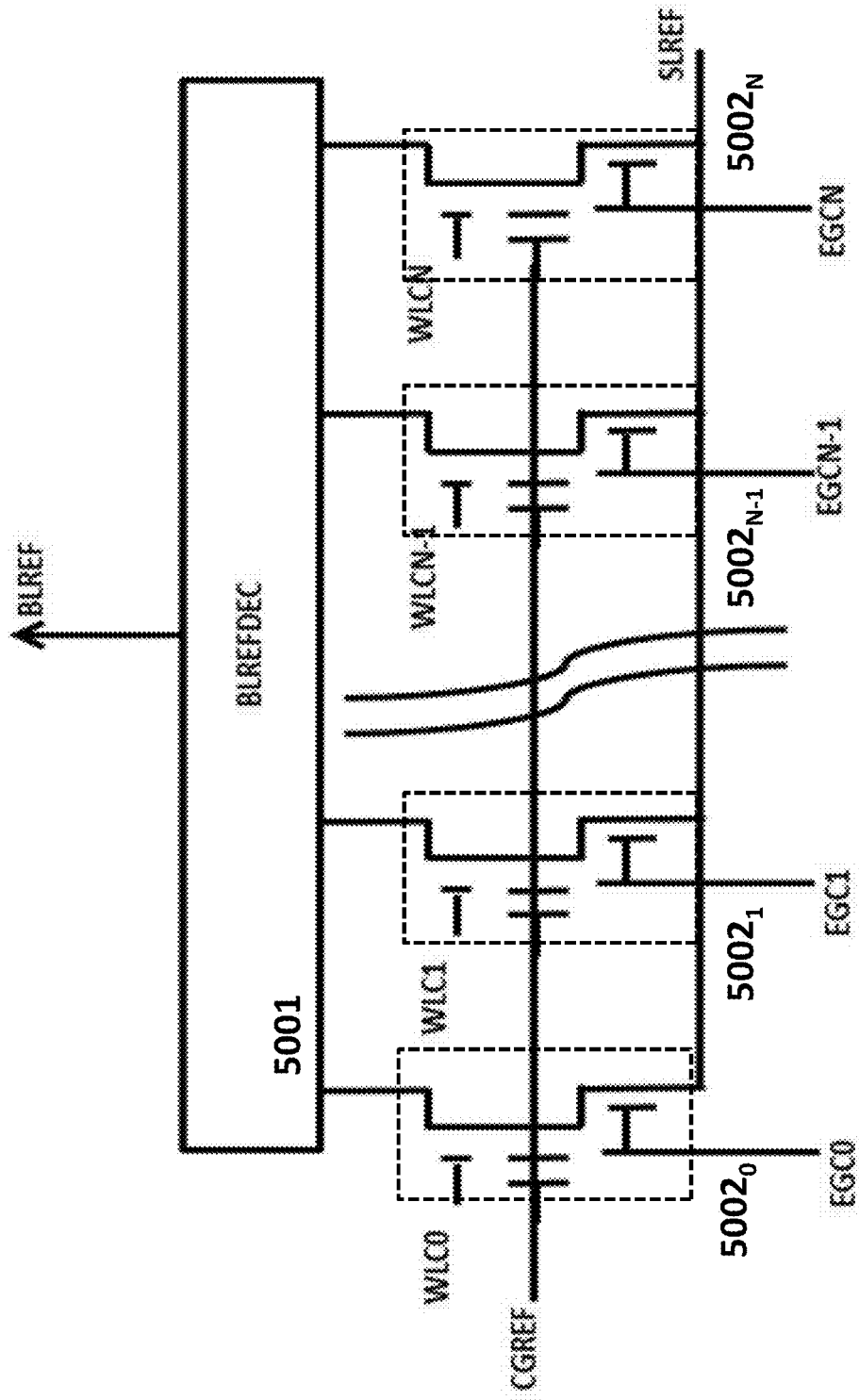
FIG. 50 depicts a read reference circuit.

FIG. 50 depicts reference array circuitry 5000, comprising bit line reference decoder 5001 and reference cells $5002_0$ to $5002_N$.

Figure 51:
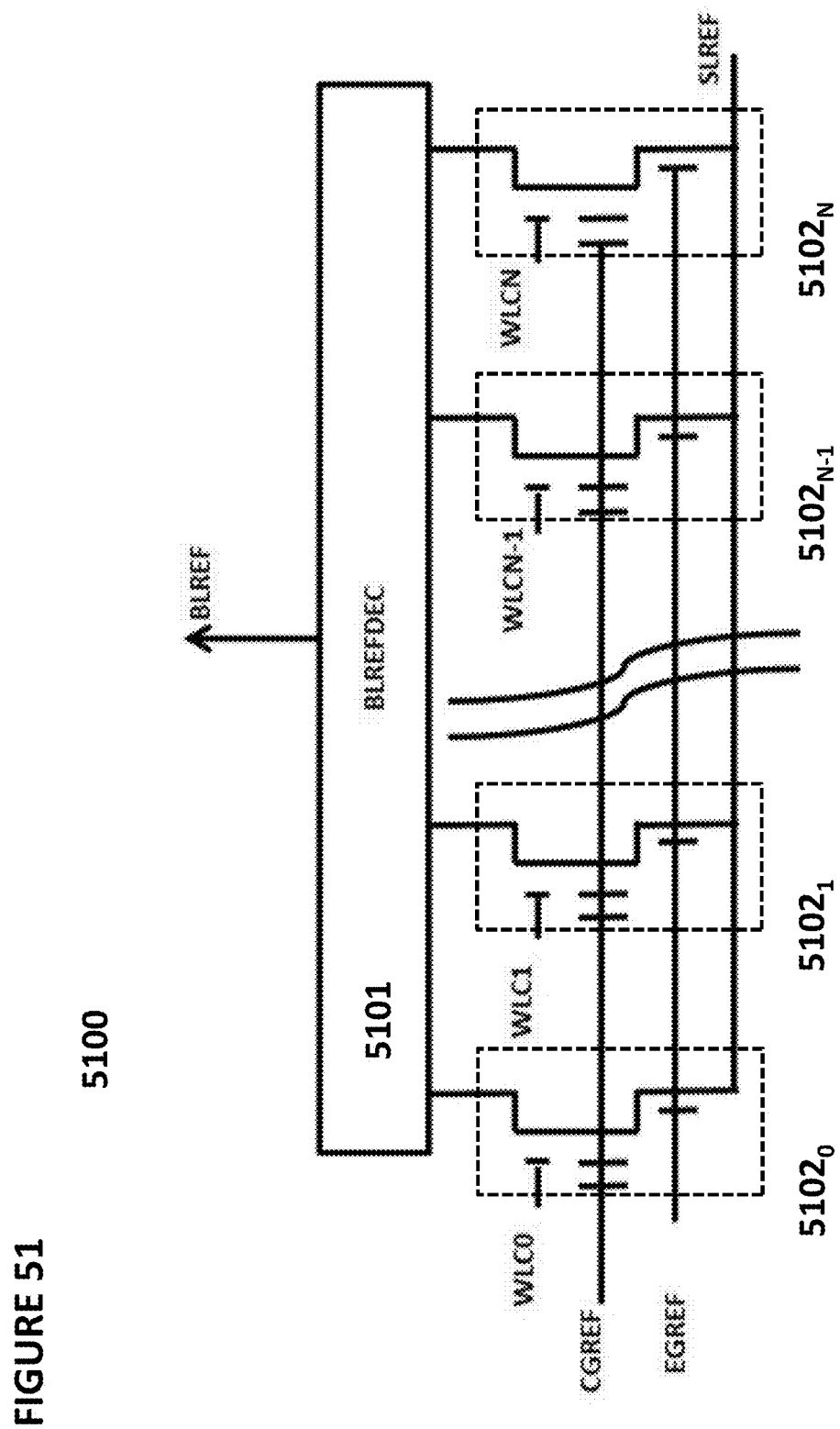
FIG. 51 depicts another read reference circuit.

FIG. 51 depicts reference array circuitry 5100, comprising bit line reference decoder 5101 and reference cells $5102_0$ to $5102_N$.

Precision Programming Circuits and Algorithms

Figure 52:
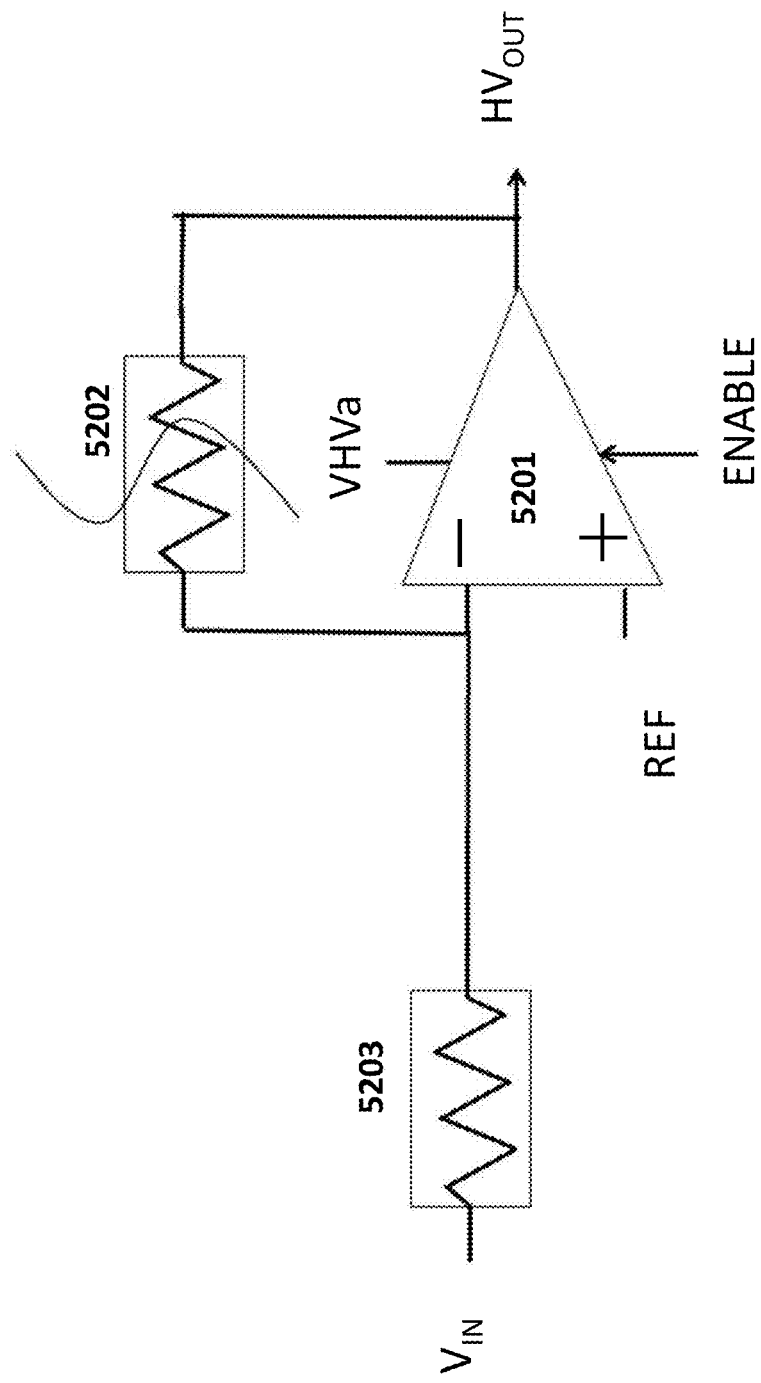
FIG. 52 depicts an adaptive high voltage supply.

FIG. 52 depicts adaptive high voltage supply 5200 to provide voltage for HV operational amplifier 4403, which comprises operation amplifier 5201, resistor 5203, and variable resistor 5202 (which can be a low voltage domain variable resistor). Adaptive high voltage supply 5200 receives input $V_{IN}$ and generates high voltage signal $HV_{OUT}$, where the gain can be adjusted by adjusting the resistance of variable resistor 5202 by a resistance trim circuit network (not shown). In one embodiment, the resistor 5203 is in a low voltage domain (e.g., 1V or 1.8V) and uses low voltage devices and operational amplifier 5201 and the variable resistor 5202 with the trim circuit network are in a high voltage domain (e.g., 12V) and use high voltage devices. $HV_{OUT}$ then can be used to program a non-volatile memory cell.

Figure 53:
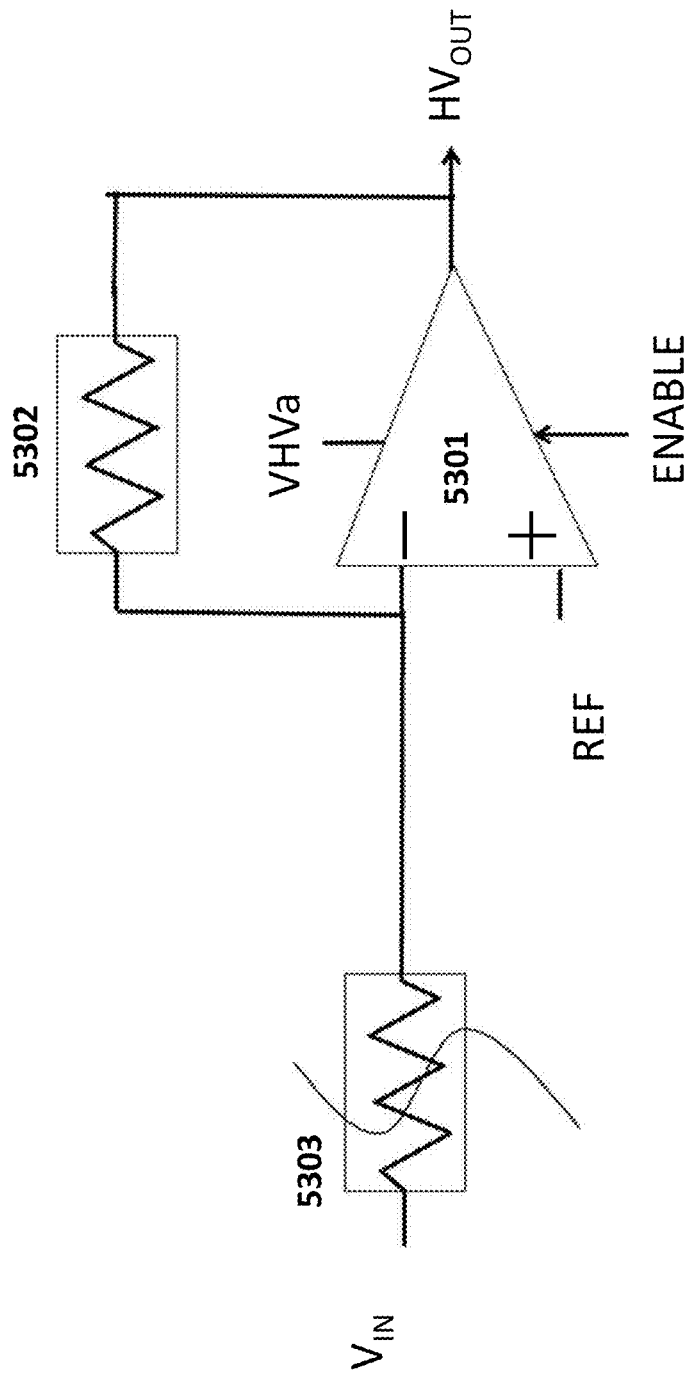
FIG. 53 depicts another adaptive high voltage supply.

FIG. 53 depicts adaptive high voltage supply 5300 to provide voltage for HV operational amplifier 3403, which comprises operation amplifier 5301, variable resistor 5303, and resistor 5302. Adaptive high voltage supply 5300 receives input $V_{IN}$ and generates high voltage signal $HV_{OUT}$, where the gain can be adjusted by adjusting the resistance of variable resistor 5303 by a resistance trim circuit network (not shown). In one embodiment, the variable resistor 5303 and the trim circuit network is in a low voltage domain (e.g., 1V or 1.8V) and uses low voltage devices and operational amplifier 5301 and resistor 5302 are in a high voltage domain (e.g., 12V) and use high voltage devices. $HV_{OUT}$ then can be used to program a non-volatile memory cell.

Figure 54:
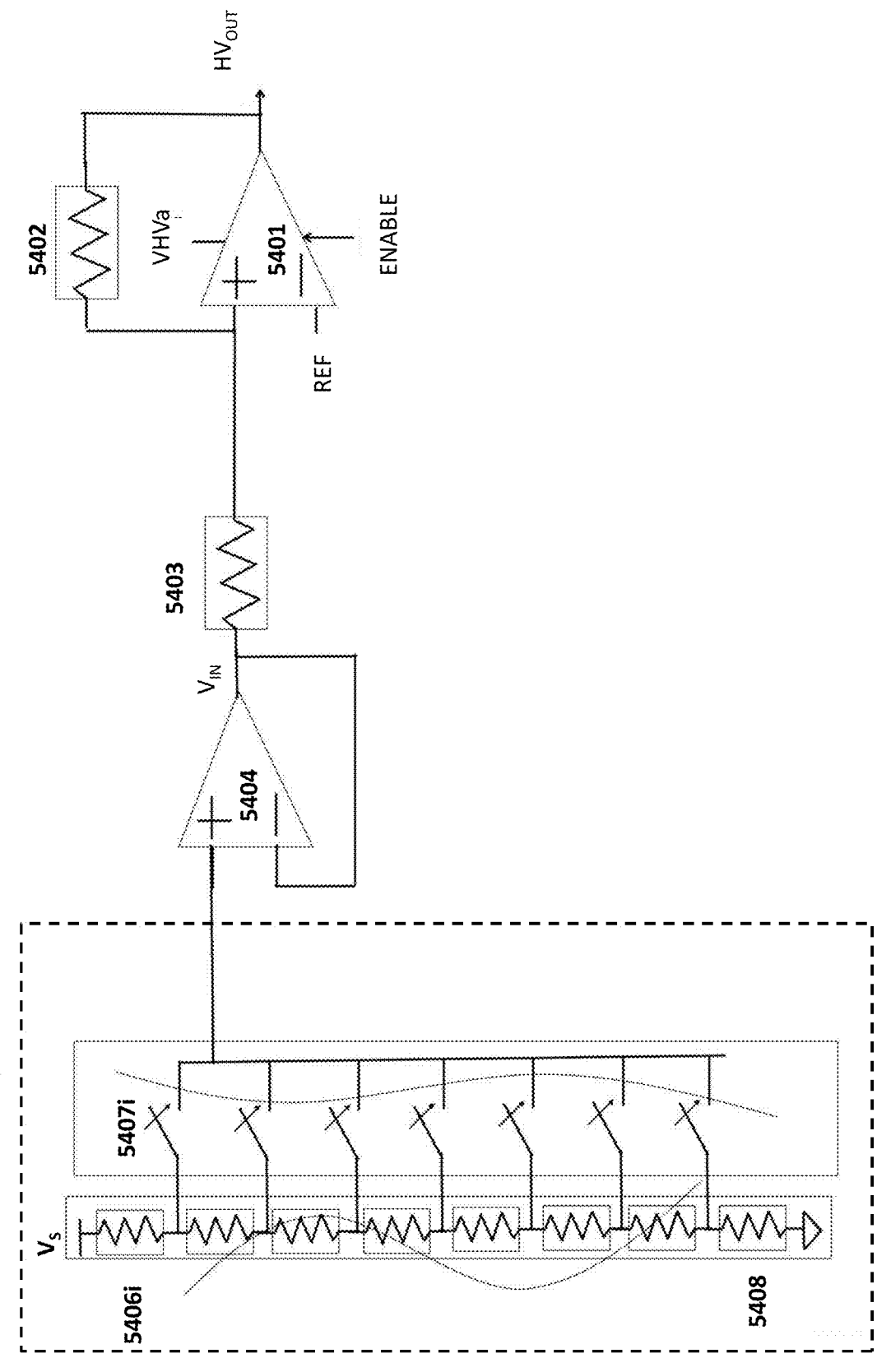
FIG. 54 depicts another adaptive high voltage supply.

FIG. 54 depicts adaptive high voltage supply 5400 to provide voltage for HV operational amplifier 4403, which comprises operational amplifier 5401, resistor 5402, resistor

5403, operational amplifier 5404, and adjustable voltage divider 5405. Adjustable voltage divider 5405 receives a voltage source Vs and comprises resistor 5408 and i sets of resistor 5406i and switch 5407i. The voltage output by adjustable voltage divider 5405, which also is the input voltage on the non-inverting terminal of operational amplifier 5404 and is the input voltage $V_{IN}$, will vary depending on which of the switches 5407i is closed. In response to input $V_{IN}$, high voltage signal $HV_{OUT}$ is generated. Here, the magnitude of $V_{IN}$ can be adjusted by adjustable voltage divider 5405. In one embodiment, the adjustable voltage divider 5405 and the operational amplifier 5404 are low voltage domain (e.g., 1V or 1.8V) and use low voltage devices and operational amplifier 5401 is high voltage domain (e.g., 12V) and uses high voltage devices. $HV_{OUT}$ then can be used to program a non-volatile memory cell.

Figure 55:
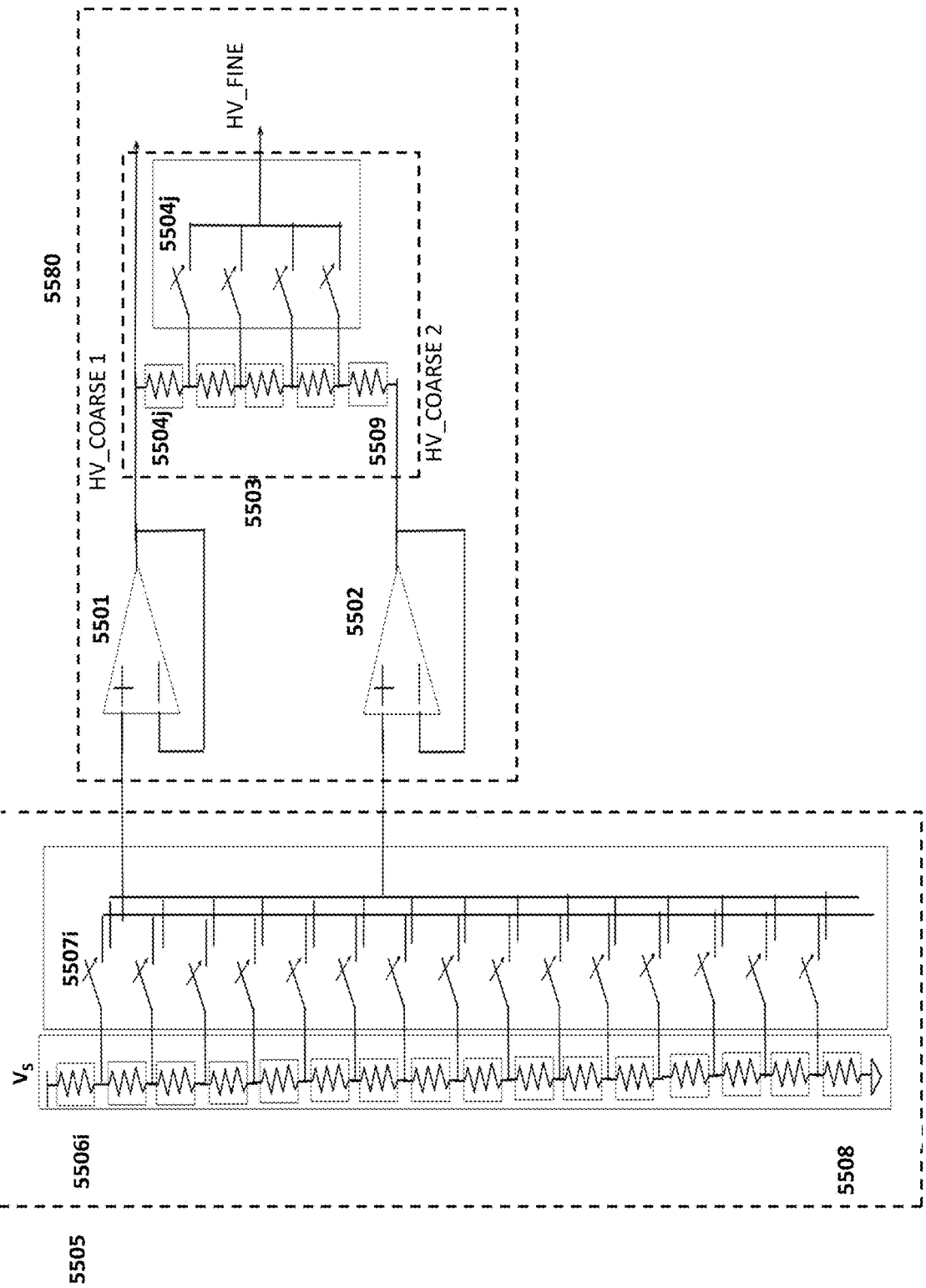
FIG. 55 depicts another adaptive high voltage supply.

FIG. 55 depicts adaptive high voltage supply 5500 to provide voltage for HV operational amplifier 4403, which comprises adjustable voltage divider 5505 and Fine Resistor HV network 5580. The Fine Resistor HV network 5580 comprises buffer 5501, buffer 5502, adjustable voltage divider 5503 comprising j sets of resistor 5504j and switch 5504j. The adjustable voltage divider 5505 receives a voltage source Vs and comprises resistor 5508 and i sets of resistor 5506i and switch network 5507i. The voltage output by adjustable voltage divider 5505 will vary depending on which of the switches of switch network 5507i is closed. Adjustable voltage divider 5503 receives high voltage HV_COARSE 1 and HV_COARSE 2. High voltage HV_COARSE 1 is further the first output of adaptive high voltage supply 5500. The voltage output by adjustable voltage divider 5503, which is HV_FINE, will vary depending on HV_COARSE and which of the switches of switch network 5504j is closed. Here, the magnitude of HV_COARSE1/2 can be adjusted by changing the switches of switch network 5507i that is closed in adjustable voltage divider 5505. The magnitude of_HV FINE can be adjusted by changing the switches of switch network 5504j that is closed in adjustable voltage divider 5503. As a numerical example, the adjustable voltage divider 5505 can provide 200 mV per step (i.e., voltage increment, voltage across one resister 5506), the voltage across HV_COARSE 1 and HV_COARSE 2 is 600 mV, the adjustable voltage divider 5503 can provide 5 mV per step (i.e., voltage increment, voltage across one resister 5504j). These high voltages can be used to program a non-volatile memory cell.

Figure 56:
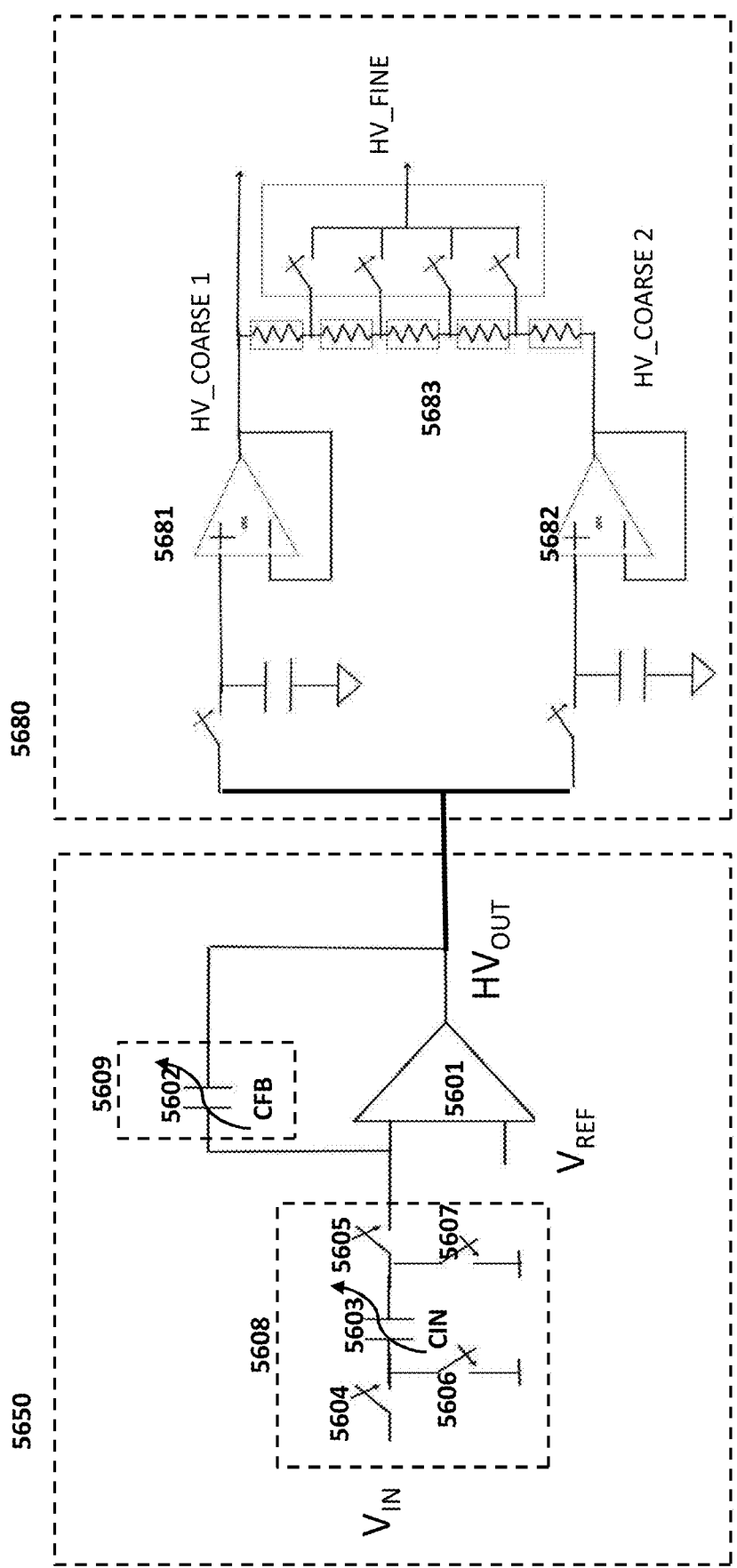
FIG. 56 depicts another adaptive high voltage supply.

FIG. 56 depicts adaptive high voltage supply 5600 to provide voltage for HV operational amplifier 4403, which comprises coarse SC (switch cap) network 5650 and fine resistor HV network 5680. The coarse SC network 5650 comprises operational amplifier 5601, SC network 5609, and SC network 5608. SC network 5609 comprises adjustable capacitor 5602 of capacitance CFB. SC network 5608 comprises adjustable capacitor 5603 of capacitance CIN and switches 5604, 5605, 5606, and 5607. Here, $HV_{OUT}=V_{IN}*(CIN/CFB)$. The fine resistor HV network 5680 is similar to the network 5580 in FIG. 55. The coarse SC network 5650 provide a coarse adjustable level, e.g. 200 mV steps, and the fine resistor HV network 5680 provide fine level, e.g., 5 mV steps. $HV_{OUT}$ can be used to program a non-volatile memory cell.

Adaptive HV supply for the HV operational amplifier 5403 as shown in FIG. 52, 43, 52-56 is used to optimize the power as a function of the output voltage. VHVOPA=VOUT+dV, for example VHVOPA=6V with VOUT=4V and dV=2V. Basically, the HVOPA 4403 does not need to be supplied with maximum HV voltage, e.g., 12V at all times.

Figure 57:
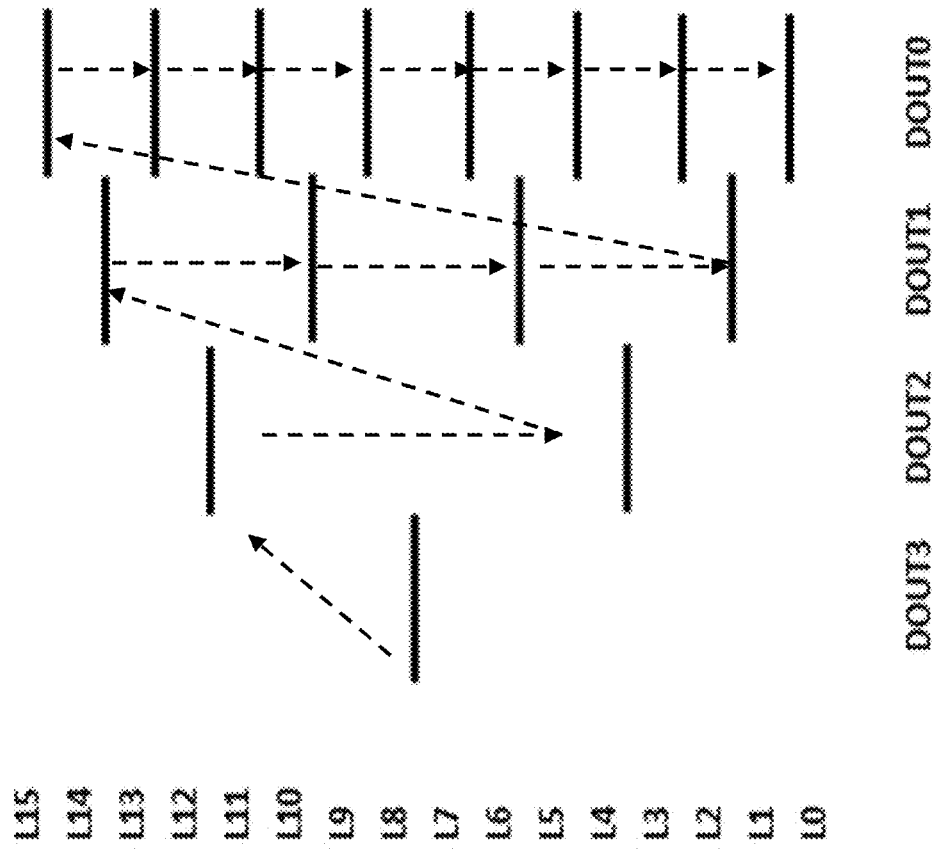
FIG. 57 depicts a single reference verify algorithm.

FIG. 57 depicts a modified SAR (Successive Approximation) sequential verify algorithm 5700 using only one single level reference which simplifies the hardware implementation. The figure shows a 4 bit verify algorithm used to convert the cell output into 4 output digital bits to be compared against 4 input digital bits. The most significant bit, DOUT3, is converted first by applying a middle reference value on the reference line and compare the cell output vs. the reference level. Next significant bit, DOUT2, is converted next by applying a middle reference value on the top half (namely from L8 to L15) and comparing the cell output vs. the middle reference level and then applying the middle reference value on the bottom half (namely from L7 to L0) and comparing the cell output vs. the middle reference level. The next digital bits are converted similarly. This approach would require 15 conversion pulses (steps) for 4-bit output. The cell output is either a current or a voltage converted from stored weight in the memory cell.

Figure 58:
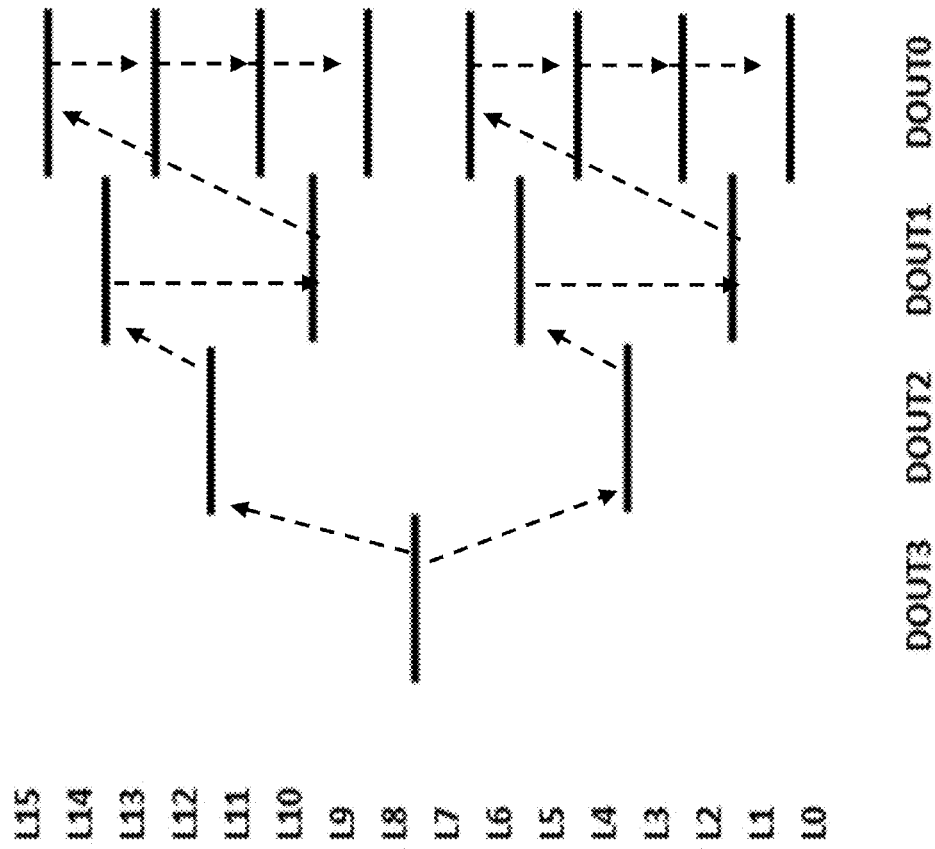
FIG. 58 depicts a dual reference verify algorithm.

FIG. 58 depicts modified SAR sequential verify algorithm 5800 using two reference lines with reduced number of conversion pulses by half. The most significant bit is done as above using a single reference line. Next sequential conversion steps uses two reference lines. For each reference line, the conversion step is similarly as above. This approach would require 8 steps for 4-bit output.

The verify algorithms above can be used to convert neuron current (output current from VMM arrays) into digital bits.

Figure 59:
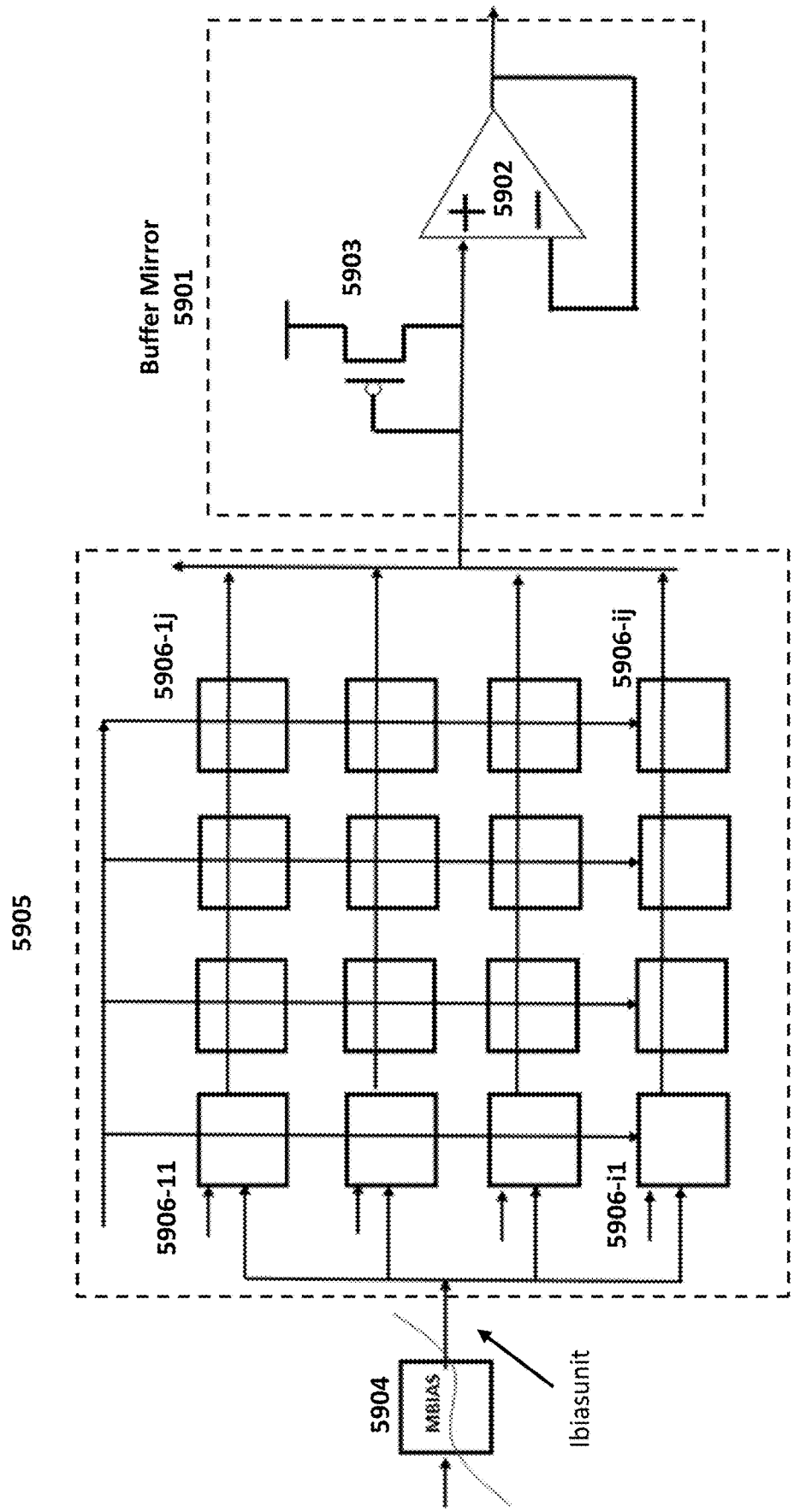
FIG. 59 depicts an adjustable reference voltage source.

FIG. 59 depicts adjustable 2D thermometer code reference current source 5900 for use during verify operations following a program operation of a non-volatile memory cell. 2D thermometer code reference current source 5900 comprises buffer mirror 5901 (which comprises operation amplifier 5902 and PMOS transistor 5903), adjustable bias source 5904, and 2D array 5905 comprising an array of i rows and j columns of devices 5906, where a particular device 5906 is noted by the label 5906-(row)(column). Here, various combinations of devices 5906 can be activated, such that the amount of reference current output by buffer mirror 5901 can be adjusted. As shown, there are 16 current mirrors (devices 5906) in the 2D array 5905. The adjustable 2D thermometer code reference current source 5900 basically convert 4 digital inputs code into a reference current bias with value from 1 to 16 times Ibiasunit which is provided from the bias source 5904. These, for example, correspond to 16 levels for memory cells in the VMM array such as shown in FIG. 58.

For example, bias source 5904 can provide a current Ibiasunit of 1 nA, which is mirrored into devices 5906. Here, the first row consists of devices 5906-11 to 5906-1j and is enabled sequentially from left to right, one device 5906 at a time. Then the next row is enabled in a sequential manner from left to right to add to the first row, meaning 5 then 6 then 7 then 8 devices 5906 are enabled. Hence, by sequentially enabling devices 5906, the transistor mismatch situation associated with conventional binary decoding can be avoided. The sum of the enabled devices 5906 is then mirrored by the buffer mirror 5901 and output as an adjustable current, which may be used for adjustable current reference source 3901 in in FIG. 39. The bias source 5904 can provide a trimmable range of unit bias such as 50 pA/100 pA/200 pA/../100 nA. The shown adjustable 4×4 2D thermometer code reference current source 5900 could be any other dimension such as 32×32 or 8×32.

Figure 60:
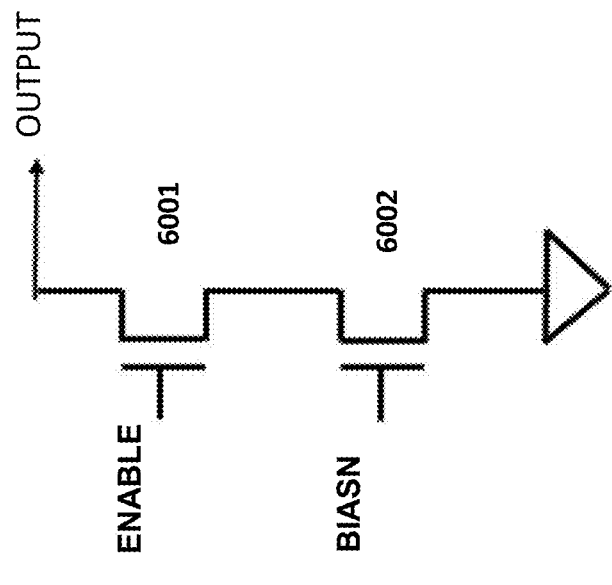
FIG. 60 depicts a sub-circuit used in the adjustable reference voltage source of FIG. 59.

FIG. 60 depicts reference sub-circuit 6000, which is can be used for device 5906 in FIG. 59. Reference sub-circuit 6000 comprises NMOS transistors 6001 and 6002, configured as shown. The transistor 6002 is a current mirror bias transistor and transistor 6001 is an enabling transistor (to enable the bias transistor 6002 to be connected to output node OUTPUT).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An adjustable programming circuit for generating one of a plurality of different voltages to program a non-volatile memory cell to store one of a plurality of different voltages on a floating gate of the non-volatile memory cell for a neural network, comprising:
    an operational amplifier comprising a first input terminal, a second input terminal, and an output terminal, the first input terminal receiving a reference voltage;
    a first resistor coupled to the second input terminal of the operational amplifier;
    a second resistor coupled to the second input terminal of the operational amplifier and the output terminal of the operational amplifier;
    wherein one of the first resistor and the second resistor is a variable resistor;
    wherein the output terminal outputs a programming voltage that varies in response to a setting of the variable resistor to generate one of a plurality of different voltages.

2. The adjustable programming circuit of claim 1, wherein the first resistor is the variable resistor.

3. The adjustable programming circuit of claim 1, wherein the second resistor is the variable resistor.

4. The adjustable programming circuit of claim 1, wherein the first resistor is the variable resistor operating in a low voltage domain.

5. The adjustable programming circuit of claim 1, wherein the second resistor is the variable resistor operating in a high voltage domain.

6. The adjustable programming circuit of claim 1, wherein a high voltage supply for the operational amplifier is adaptable basing on the operational amplifier output voltage.

7. The adjustable programming circuit of claim 1, wherein the non-volatile memory cell is a stacked-gate memory cell.

8. The adjustable programming circuit of claim 1, wherein the non-volatile memory cell is a split-gate memory cell.

9. A method comprising:
    generating, by an adjustable programming circuit, one of a plurality of different voltages, the adjustable programming circuit comprising: (i) an operational amplifier comprising a first input terminal, a second input terminal, and an output terminal, the first input terminal receiving a reference voltage, (ii) a first resistor coupled to the second input terminal of the operational amplifier, and (iii) a second resistor coupled to the second input terminal of the operational amplifier and the output terminal of the operational amplifier, wherein one of the first resistor and the second resistor is a variable resistor, wherein the output terminal outputs a programming voltage that varies in response to a setting of the variable resistor to generate the one of a plurality of different voltages; and
    programming a non-volatile memory cell using the one of a plurality of different voltages to store one of a plurality of different voltages on a floating gate of the non-volatile memory cell for a neural network.

10. The method of claim 9, wherein the first resistor is the variable resistor.

11. The method of claim 9, wherein the second resistor is the variable resistor.

12. The method of claim 9, wherein the first resistor is the variable resistor operating in a low voltage domain.

13. The method of claim 9, wherein the second resistor is the variable resistor operating in a high voltage domain.

14. The method of claim 9, wherein a high voltage supply for the operational amplifier is adaptable basing on the operational amplifier output voltage.

15. The method of claim 9, wherein the non-volatile memory cell is a stacked-gate memory cell.

16. The method of claim 9, wherein the non-volatile memory cell is a split-gate memory cell.

* * * * *